(12) United States Patent
Takeuchi

(10) Patent No.: US 11,387,264 B2
(45) Date of Patent: Jul. 12, 2022

(54) SOLID-STATE IMAGING DEVICE AND MANUFACTURING METHOD

(71) Applicant: SONY SEMICONDUCTOR SOLUTIONS CORPORATION, Kanagawa (JP)

(72) Inventor: Koichi Takeuchi, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 16/349,341

(22) PCT Filed: Nov. 7, 2017

(86) PCT No.: PCT/JP2017/040043
§ 371 (c)(1),
(2) Date: May 13, 2019

(87) PCT Pub. No.: WO2018/092632
PCT Pub. Date: May 24, 2018

(65) Prior Publication Data
US 2019/0280026 A1  Sep. 12, 2019

(30) Foreign Application Priority Data

Nov. 21, 2016  (JP) .............................. JP2016-225960

(51) Int. Cl.
*H01L 27/146* (2006.01)
*H01L 27/142* (2014.01)
(Continued)

(52) U.S. Cl.
CPC ........ *H01L 27/14603* (2013.01); *G02B 1/115* (2013.01); *G03F 7/20* (2013.01);
(Continued)

(58) Field of Classification Search
CPC ........ H01L 27/14603; H01L 27/14629; G02B 1/115; G02B 1/118
See application file for complete search history.

(56) References Cited

U.S. PATENT DOCUMENTS

| | | | |
|---|---|---|---|
| 2005/0040440 A1* | 2/2005 | Murakami | .......... H01L 27/1485 257/225 |
| 2009/0140438 A1 | 6/2009 | Yamazaki et al. | |

(Continued)

FOREIGN PATENT DOCUMENTS

| | | |
|---|---|---|
| JP | 2005-072097 | 3/2005 |
| JP | 2008-311562 | 12/2008 |

(Continued)

OTHER PUBLICATIONS

Raut et. al.,"Anti-reflective coatings: A critical, in-depth review", Energy Environ. Sci., vol. 4, pp. 3779-3804 (Year: 2011).*

(Continued)

*Primary Examiner* — Bilkis Jahan
*Assistant Examiner* — Victor V Barzykin
(74) *Attorney, Agent, or Firm* — Sheridan Ross P.C.

(57) ABSTRACT

A substrate includes a photoelectric converting unit in a pixel unit and a reflection ratio adjusting layer provided on the substrate in an incident direction of incident light with respect to the substrate for adjusting reflection of the incident light on the substrate. The reflection ratio adjusting layer includes a first layer formed on the substrate and a second layer formed on the first layer, the first layer has an uneven structure provided on the substrate, and a recess portion on the uneven structure is filled with a material having a lower refractive index than that of the substrate forming the second layer, and a thickness of the first layer is optimized for a wavelength of light to be received. The present technology may be applied to an imaging device.

20 Claims, 39 Drawing Sheets

(51) Int. Cl.
  *H04N 5/341* (2011.01)
  *H04N 5/369* (2011.01)
  *G02B 1/115* (2015.01)
  *H01L 21/027* (2006.01)
  *G03F 7/20* (2006.01)

(52) U.S. Cl.
  CPC .......... *H01L 21/027* (2013.01); *H01L 27/142* (2013.01); *H01L 27/146* (2013.01); *H01L 27/14629* (2013.01); *H04N 5/341* (2013.01); *H04N 5/369* (2013.01)

(56) References Cited

U.S. PATENT DOCUMENTS

| | | | |
|---|---|---|---|
| 2012/0127454 | A1 | 5/2012 | Nakamura et al. |
| 2013/0183828 | A1 | 7/2013 | Nakamura et al. |
| 2016/0112614 | A1* | 4/2016 | Masuda ............. H01L 31/0203 348/374 |
| 2017/0045644 | A1 | 2/2017 | Kageyama et al. |

FOREIGN PATENT DOCUMENTS

| | | |
|---|---|---|
| JP | 2009-088261 | 4/2009 |
| JP | 2009-218357 | 9/2009 |
| JP | 2012-108369 | 6/2012 |
| JP | 2013-033864 | 2/2013 |
| JP | 2013-068882 | 4/2013 |
| JP | 2013-198661 | 10/2013 |
| JP | 2015-029054 | 2/2015 |
| JP | 2015-092631 | 5/2015 |
| WO | WO 2015/170629 | 11/2015 |
| WO | WO 2016/194654 | 12/2016 |

OTHER PUBLICATIONS

International Search Report prepared by the Japan Patent Office dated Dec. 12, 2017, for International Application No. PCT/JP2017/040043.

\* cited by examiner

FIG. 8
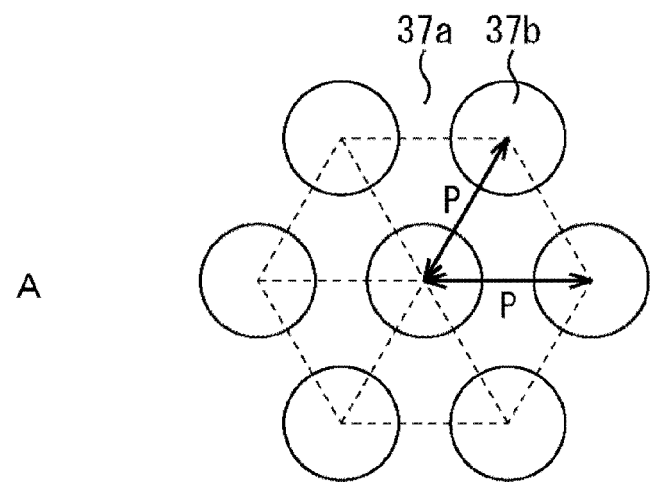
A
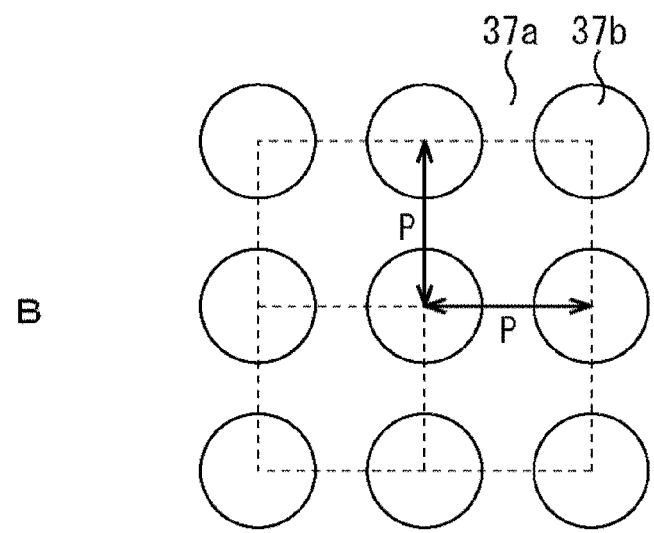
B

SOLID-STATE IMAGING DEVICE AND MANUFACTURING METHOD

CROSS REFERENCE TO RELATED APPLICATIONS

This application is a national stage application under 35 U.S.C. 371 and claims the benefit of PCT Application No. PCT/JP2017/040043 having an international filing date of 7 Nov. 2017, which designated the United States, which PCT application claimed the benefit of Japanese Patent Application No. 2016-225960 filed 21 Nov. 2016, the entire disclosures of each of which are incorporated herein by reference.

TECHNICAL FIELD

The present technology relates to a solid-state imaging device and a manufacturing method, and especially relates to a solid-state imaging device and a manufacturing method capable of suppressing reflection of incident light in a wide wavelength band.

BACKGROUND ART

Solid-state imaging devices are required to be made small and to have multiple pixels, so that reduction of pixels is being promoted. However, as a pixel size decreases, sensitivity is deteriorated, so that it is required to compensate sensitivity deterioration due to reduction in aperture ratio, and improve the sensitivity. In such solid-state imaging device, since the incident light is reflected on a surface of a Si substrate, intensity of light reaching a light-receiving unit is lost and the sensitivity is deteriorated, and flare and ghost are caused by incident light from an unintended optical path.

Therefore, proposed is a technology of effectively suppressing reflection of incident light for all the wavelength regions (all visible light) of the light incident on a light-receiving unit by forming an antireflective layer having an uneven structure (also referred to as a moth-eye structure) corresponding to a wavelength region of the light incident on the light-receiving unit (for example, refer to Patent Document 1).

CITATION LIST

Patent Document

Patent Document 1: Japanese Patent Application Laid-Open No. 2009-218357

SUMMARY OF THE INVENTION

Problems to be Solved by the Invention

By the way, in a case of using the moth-eye structure adopted in Patent Document 1 described above, a deep uneven structure at a narrow-pitch is required, but it is technically difficult to realize the same with a thickness of less than about 100 nm, for example, by processing by lithography or dry etching.

Furthermore, in a case of using the moth-eye structure, if the thickness of at least about 100 nm cannot be secured, the reflection ratio cannot be sufficiently reduced.

The present technology is achieved in view of such a situation, and an object thereof is to suppress the reflection of the incident light in a wide wavelength band.

Solutions to Problems

A solid-state imaging device according to an aspect of the present technology is provided with a substrate including a photoelectric converting unit in a pixel unit, and a reflection ratio adjusting layer provided on the substrate in an incident direction of incident light with respect to the substrate for adjusting reflection of the incident light on the substrate, in which the reflection ratio adjusting layer includes a first layer formed on the substrate and a second layer formed on the first layer, the first layer has an uneven structure provided on the substrate, and a recess portion on the uneven structure is filled with a material having a lower refractive index than a refractive index of the substrate forming the second layer, and a thickness of the first layer is made a thickness optimized for a wavelength of light to be received.

A manufacturing method according to an aspect of the present technology is a manufacturing method of manufacturing a solid-state imaging device provided with a substrate including a photoelectric converting unit in a pixel unit, and a reflection ratio adjusting layer provided on the substrate in an incident direction of incident light with respect to the substrate for adjusting reflection of the incident light on the substrate, the method including forming the reflection ratio adjusting layer including a first layer formed on the substrate and a second layer formed on the first layer, filling a recess portion on an uneven structure provided on the substrate included in the first layer with a material having a lower refractive index than a refractive index of the substrate forming the second layer, and making a thickness of the first layer a thickness optimized for a wavelength of light to be received.

In the solid-state imaging device according to an aspect of the present technology, a substrate including a photoelectric converting unit in a pixel unit, and a reflection ratio adjusting layer provided on the substrate in an incident direction of incident light with respect to the substrate for adjusting reflection of the incident light on the substrate are provided. Furthermore, the reflection ratio adjusting layer includes a first layer formed on the substrate and a second layer formed on the first layer, the first layer has an uneven structure provided on the substrate, and a recess portion on the uneven structure is filled with a material having a lower refractive index than that of the substrate forming the second layer, and a thickness of the first layer is made a thickness optimized for a wavelength of light to be received.

In the manufacturing method according to an aspect of the present technology, the solid-state imaging device is manufactured.

Effects of the Invention

According to one aspect of the present technology, reflection of incident light in a wide wavelength band may be suppressed.

Note that, the effects herein described are not necessarily limited and may be any of the effects described in the present disclosure.

BRIEF DESCRIPTION OF DRAWINGS

FIG. 8 is a view for illustrating arrangement of projected portions.

MODE FOR CARRYING OUT THE INVENTION

A mode for carrying out the present technology (hereinafter, referred to as an embodiment) is hereinafter described.

<Configuration Example of Embodiment of Solid-State Imaging Device to which Present Technology is Applied>

Figure 1:
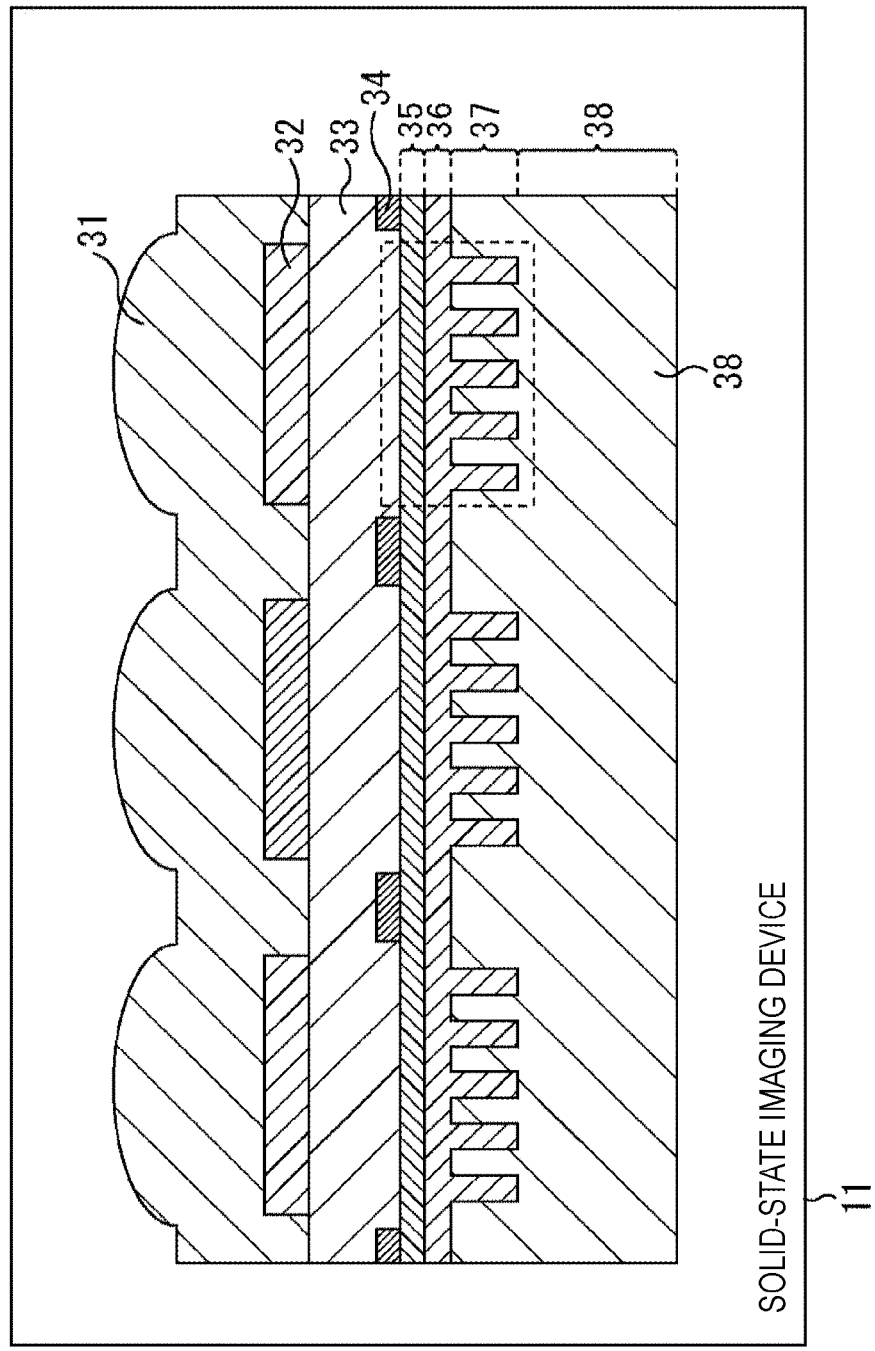
FIG. 1 is a view illustrating a configuration of one embodiment of a solid-state imaging device to which the present technology is applied.

FIG. 1 is a cross-sectional side view illustrating a configuration example of one embodiment of a solid-state imaging device to which the present technology is applied.

A solid-state imaging device 11 in FIG. 1 is provided with a lens 31, a color filter 32, a planarizing film 33, a light-shielding film 34, an oxide film (SiO2) 35, an intermediate second layer 36, an intermediate first layer 37, and a Si substrate 38 in this order from an upper portion of the drawing.

The solid-state imaging device 11 in FIG. 1 receives light incident from above in the drawing and generates a pixel signal corresponding to an amount of the received light.

In further detail, the lens 31 condenses the incident light into a photoelectric conversion element not illustrated provided in a pixel unit in the Si substrate 38. Note that, in the drawing, a projected portion upward in the drawing of the lens 31 corresponds to each pixel, and in FIG. 1, an example in which three pixels are arranged in a horizontal direction is illustrated.

The color filter 32 is a filter which transmits only light of a specific wavelength out of the incident light; for example, this extracts light of a wavelength corresponding to any one of red, green, and blue (RGB) and transmits the same to a configuration on a subsequent stage. The planarizing film 33 connects the color filter 32 and the oxide film 35 so as to be closely contact with each other.

The light-shielding film 34 including a metallic film such as tungsten (W), for example, shields the incident light to adjacent pixels, thereby preventing crosstalk of the incident light between the pixels. The oxide film 35 electrically insulates the adjacent pixels and prevents the crosstalk of the pixel signals between the adjacent pixels.

The intermediate first layer 37 and the intermediate second layer 36 form an intermediate layer including a two-layer pseudo high refractive layer and serve as a reflection ratio adjusting layer for suppressing reflection on the Si substrate 38.

Figure 2:
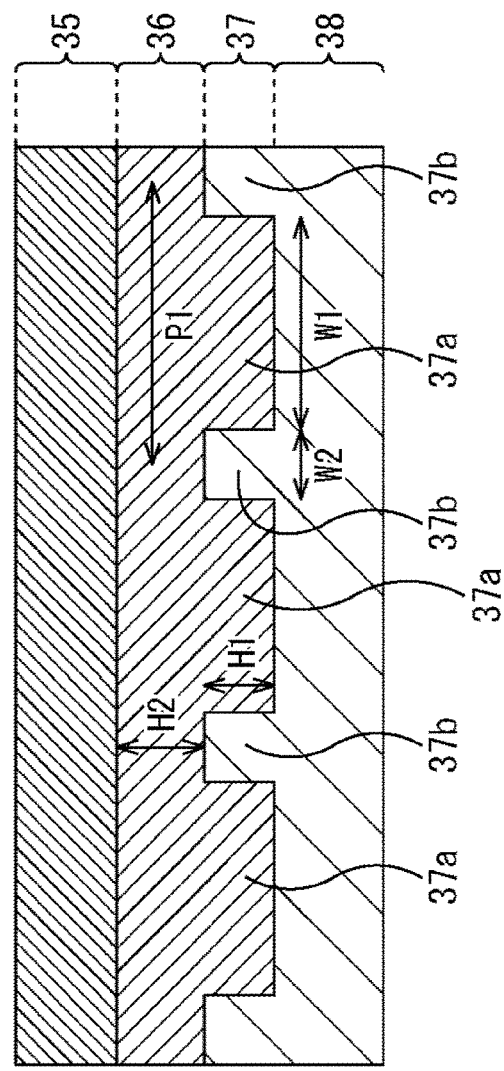
FIG. 2 is a view for illustrating an uneven structure.

In further detail, the reflection ratio adjusting layer being a structure for suppressing the reflection of the incident light indicated by a range enclosed by a dotted line in FIG. 1 has a configuration as illustrated in FIG. 2.

FIG. 2 is a view illustrating a configuration of the reflection ratio adjusting layer being the structure for suppressing the reflection of the incident light enclosed by the dotted line in the solid-state imaging device 11 in FIG. 1. In FIG. 2, the oxide film 35, the intermediate second layer 36, the intermediate first layer 37, and the Si substrate 38 are provided in this order from above. Among them, the intermediate second layer 36 and the intermediate first layer 37 serve as the reflection ratio adjusting layer.

Figure 3:
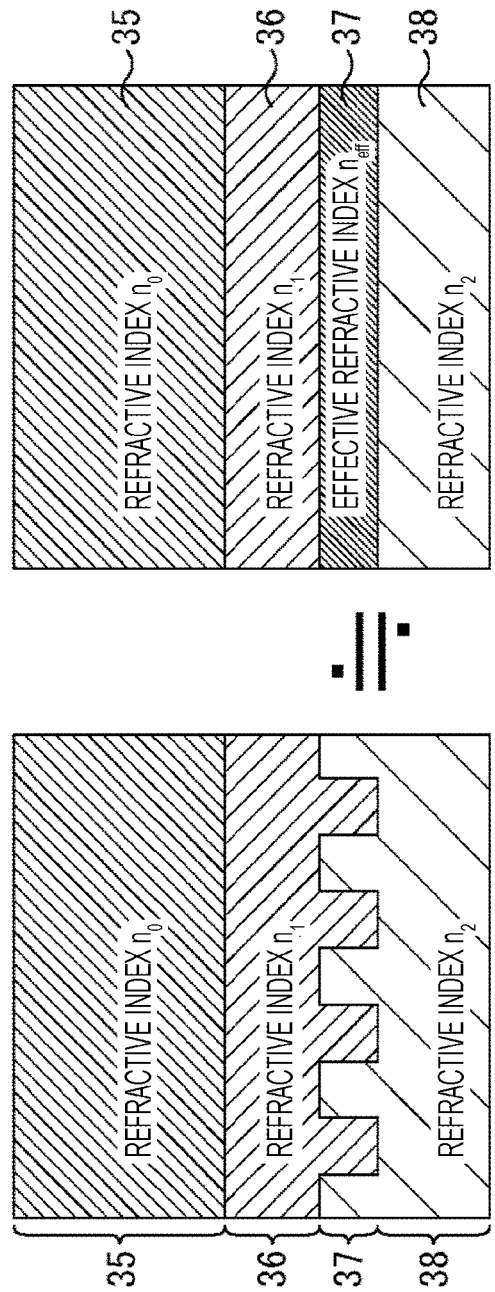
FIG. 3 is a view for illustrating a relationship between refractive indices of layers.

As illustrated in a left view in FIG. 3, the solid-state imaging device 11 is obtained by stacking the oxide film 35 having a refractive index n0, the intermediate second layer 36 having a refractive index n1, and the Si substrate 38 having a refractive index n2. Furthermore, a fine uneven structure is formed in the intermediate first layer 37, and a recess portion thereof is filled with a material forming the intermediate second layer 36. Such intermediate first layer 37 and intermediate second layer 36 form the reflection ratio adjusting layer.

Such a configuration is similar to a configuration in which the intermediate first layer 37 having an effective refractive index neff is formed between the Si substrate 38 having the refractive index n2 and the intermediate second layer 36 having the refractive index n1 as illustrated in a right view in FIG. 3. Hereinafter, the description is appropriately continued on the assumption that the solid-state imaging device 11 has the effective refractive index neff as illustrated in the right view in FIG. 3.

This effective refractive index neff is an effective refractive index of the reflection ratio adjusting layer having the fine uneven structure, and is a value between the refractive index n1 of the material (intermediate second layer 36) embedded in the uneven structure and the refractive index n2 of the Si substrate 38 forming the photodiode.

The intermediate second layer 36 includes, for example, a material having the refractive index n1 of 1.9 to 2.3 such as Al2O3, SiN, HfO2, Ta2O5, Nb2O5, and TiO2.

Furthermore, for example, the intermediate first layer 37 has a configuration obtained by arranging the material forming the intermediate second layer 36 and the material Si forming the Si substrate 38 in a mixed manner. In further detail, as illustrated in FIG. 4, the configuration is such that the uneven structure is formed on the Si substrate 38 and a recess portion 37a thereof is filled with the material forming the intermediate second layer 36.

Figure 4:
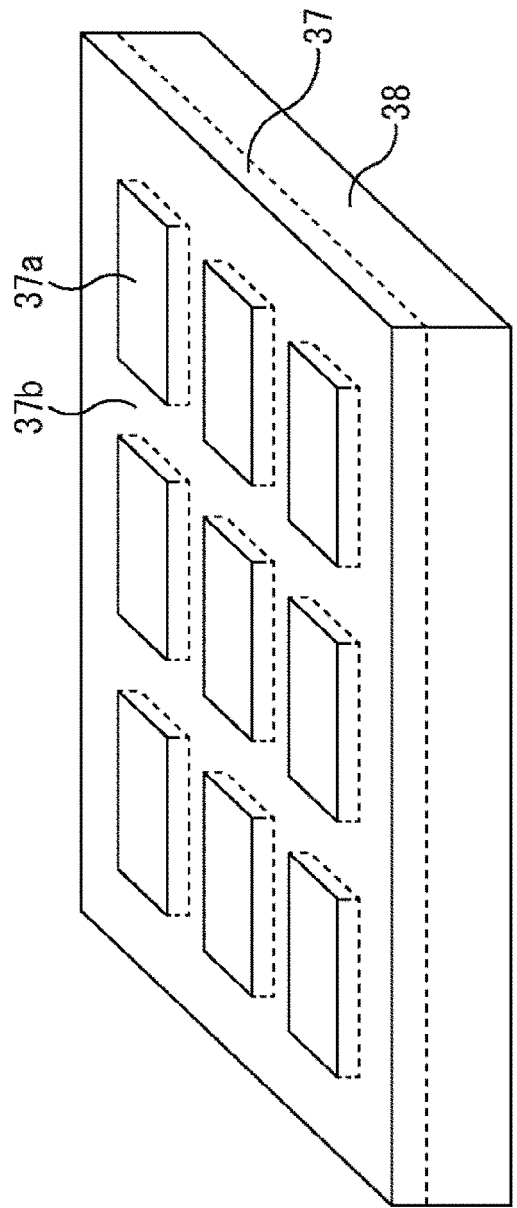
FIG. 4 is a view for illustrating the uneven structure.

Note that, in FIG. 4, the recess portion 37a is filled with the material forming the intermediate second layer 36, so that a structure is such that this is formed into a prismatic shape and is provided in the recess portion 37a in the uneven structure on the Si substrate 38. Here, the structure formed in the recess portion 37a is not limited to the prismatic one and this may have other shapes; this may be a cylindrical structure as described later, for example.

Furthermore, the intermediate first layer 37 is formed such that the effective refractive index neff of the intermediate first layer 37 becomes a predetermined value as a whole by a configuration in which the material forming the Si substrate 38 and the material forming the intermediate second layer 36 are arranged in a mixed manner with a volume ratio therebetween being a predetermined value within a range of a height H1 of the recess portion 37a (FIG. 2) from 40 to 70 nm, for example.

The material forming the Si substrate 38 and the material forming the intermediate second layer 36 are arranged in a mixed manner with the volume ratio therebetween being a predetermined value such that the effective refractive index neff is set to a value satisfying refractive index n0<refractive index n1<effective refractive index neff<refractive index n2.

For example, in a case where a volume V1 of the recess portion 37a forming the intermediate first layer 37 and a volume V2 of a range including the same material as that of the Si substrate 38 (projected portion with respect to the recess portion 37a) satisfy V1:V2=3:2, when the refractive index n2 of the material Si of the Si substrate 38 is 4.1 and the material forming the intermediate second layer 36 is Ta2O5 having the refractive index n1 of 2.2, the intermediate first layer 37 having an averaged effective refractive index neff of about 2.7 is deposited by arrangement in a mixed manner according to the volume ratio. Specifically, the effective refractive index neff is obtained from equation (4) described later. In this case, f is V1/(V1+V2) 0.6.

However, in a case where the refractive index n0 of the oxide film 35 of SiO2 is 1.46 and the refractive index n2 of the Si substrate 38 is 4.1, a substance having another refractive index may be the intermediate first layer 37 and the intermediate second layer 36 as long as refractive index n0<refractive index n1<effective refractive index neff<refractive index n2 is satisfied. Note that, as for the Si substrate 38, this is similar for a substrate of InGaAs having a refractive index of about 4.0.

In FIG. 2, although the heights H1 of the recess portions 37a are illustrated as the same height, in the solid-state imaging device 11 to which the present technology is applied, they are different depending on the color of the color filter 32 (wavelength of the light received by the photoelectric conversion element).

That is, the height H1 of the recess portion 37a is set to a height suitable for condensing the light transmitted through the color filter 32 by the photoelectric conversion element (photodiode) without reflecting or diffracting the same.

Note that the height H1 of the recess portion 37a corresponds to a thickness of the intermediate first layer with reference to FIG. 2. In other words, the solid-state imaging device 11 to which the present technology is applied has a structure in which this is set to the thickness of the intermediate first layer 37 optimized for the color of the color filter 32 (wavelength of the light received by the photoelectric conversion element), and the thicknesses are different for the respective pixels.

That is, the thickness of the intermediate first layer 37 is set to the thickness suitable for condensing the light transmitted through the color filter 32 by the photoelectric conversion element (photodiode) without reflecting or diffracting the same.

A reason that the heights H1 of the recess portions 37a are set to be different depending on the color of the color filter 32, specific heights thereof, and the like are described below. In the following description, since the thickness of the intermediate first layer 37=the height H of the recess portion 37a, this is continuously described as the height H of the recess portion 37a, but this may be replaced with the thickness of the intermediate first layer 37.

<Condition Under which No Diffraction Light is Generated>

Figure 5:
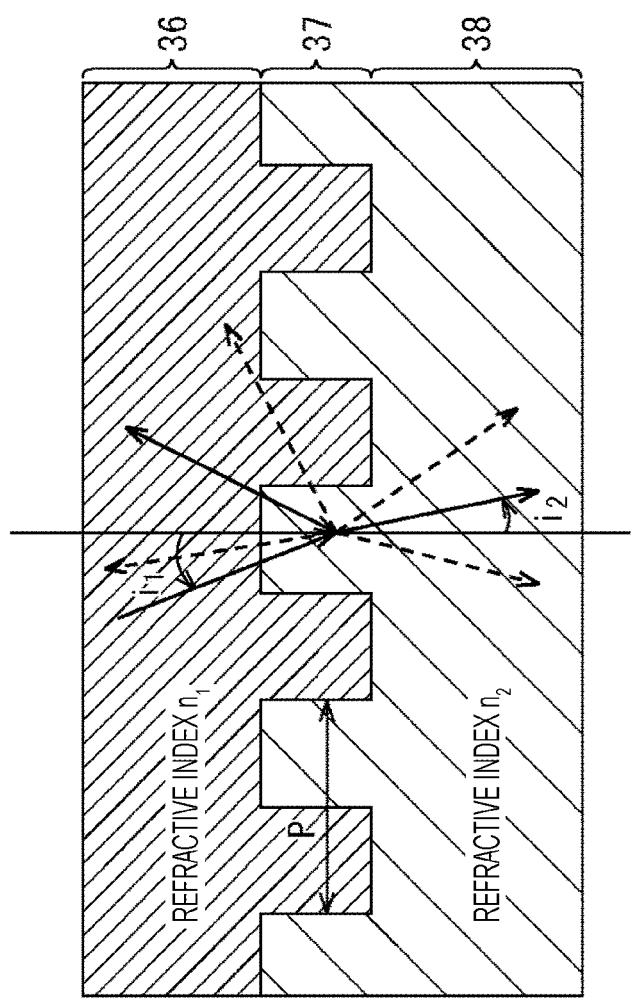
FIG. 5 is a view for illustrating diffraction and reflection of incident light.

The intermediate first layer 37 and the intermediate second layer 36 are formed to have the fine uneven structure and serve as the reflection ratio adjusting layer; a condition under which the diffraction light is not generated by this reflection ratio adjusting layer (uneven structure) is described with reference to FIG. 5. A case where light having a wavelength λ0 in vacuum is incident at an incident angle i1 on the uneven structure with a pitch P as illustrated in FIG. 5 is considered.

The pitch P is a value obtained by adding a width of one recess portion and one projected portion of the uneven structure, and a value obtained by adding a width W1 (FIG. 2) of the recess portion 37a of the intermediate first layer 37 and a width W2 (FIG. 2) of the projected portion 37b of the intermediate first layer 37, for example.

The refractive index above the uneven structure is set to n1 and that below the same is set to n2. For example, in FIG. 2, the intermediate second layer 36 with the refractive index n1 is present above and the Si substrate 38 with the refractive index n2 is present below. A condition of the pitch P at which the diffraction light is not generated on a reflection side of the uneven structure, that is, on the side of the intermediate second layer 36 is given by following equation (1).

[Equation 1]

$$P < \frac{\lambda_0}{n_1(1+\sin i_1)} \leq \frac{\lambda_0}{2n_1} \quad (1)$$

Furthermore, a condition of the pitch P at which the diffraction light is not generated on a transmission side of the uneven structure, that is, on the side of the Si substrate 38 is given by following equation (2). In equation (2), i2 represents the light incident on the Si substrate 38 at the incident angle i1,

[Equation 2]

$$P < \frac{\lambda_0}{n_2(1+\sin i_2)} = \frac{\lambda_0}{n_2 + n_1 \sin i_1} \leq \frac{\lambda_0}{n_1 + n_2} \quad (2)$$

Figure 6:
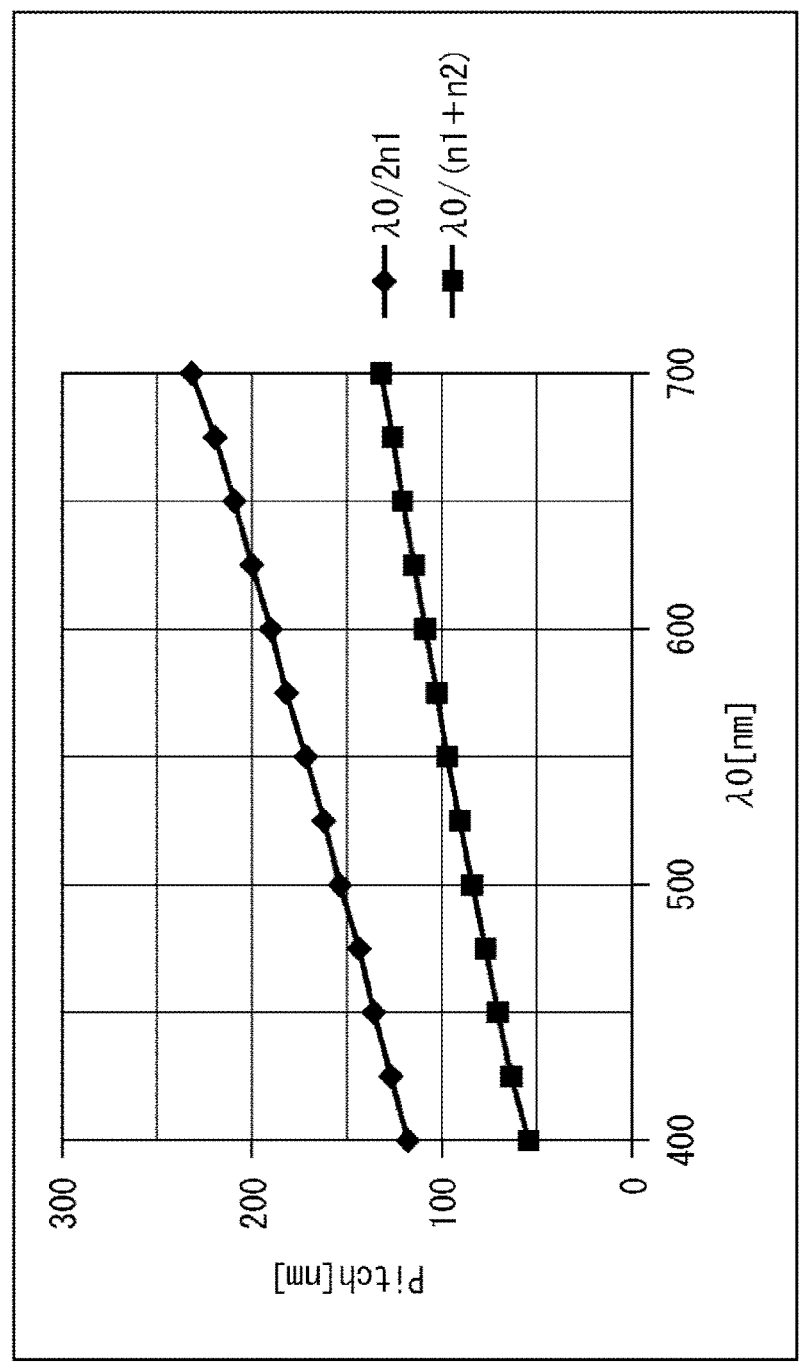
FIG. 6 is a view for illustrating a relationship between a wavelength and a pit P.

A graph when simulating the pitch P satisfying such condition by using ALSO3 as the material above (the material of the intermediate second layer 36 of the refractive index n1) and Si as the material below (the material of the Si substrate 38 with the refractive index n2) is illustrated in FIG. 6.

In the graph illustrated in FIG. 6, the wavelength of the incident light is plotted along the abscissa and the pitch P is plotted along the ordinate. A wavelength region in vacuum is often used by the solid-state imaging device which senses visible light, so that a case of 400 to 700 nm is illustrated in FIG. 6. Furthermore, in FIG. 6, lozenges represent values calculated by equation (1) and a straight line connecting the values is a straight line 1. Furthermore, in FIG. 6, squares represent values calculated by equation (2) and a value connecting the straight lines is a straight line 2.

The pitch P satisfying equations (1) and (2) described above is in an area below the straight line 1 and below the straight line 2 in FIG. 6. For example, for the wavelength of 400 nm in vacuum, no diffraction light is generated at the pitch P smaller than 55 nm.

In the solid-state imaging device 11, since a component of the light incident on the photodiode in an oblique direction is not large, it is considered that an effect is sufficiently obtained even if the incident angle is 30 degrees or smaller, and it is considered that the effect is obtained only with 0 degree incidence. This is described with reference to FIG. 7.

Figure 7:
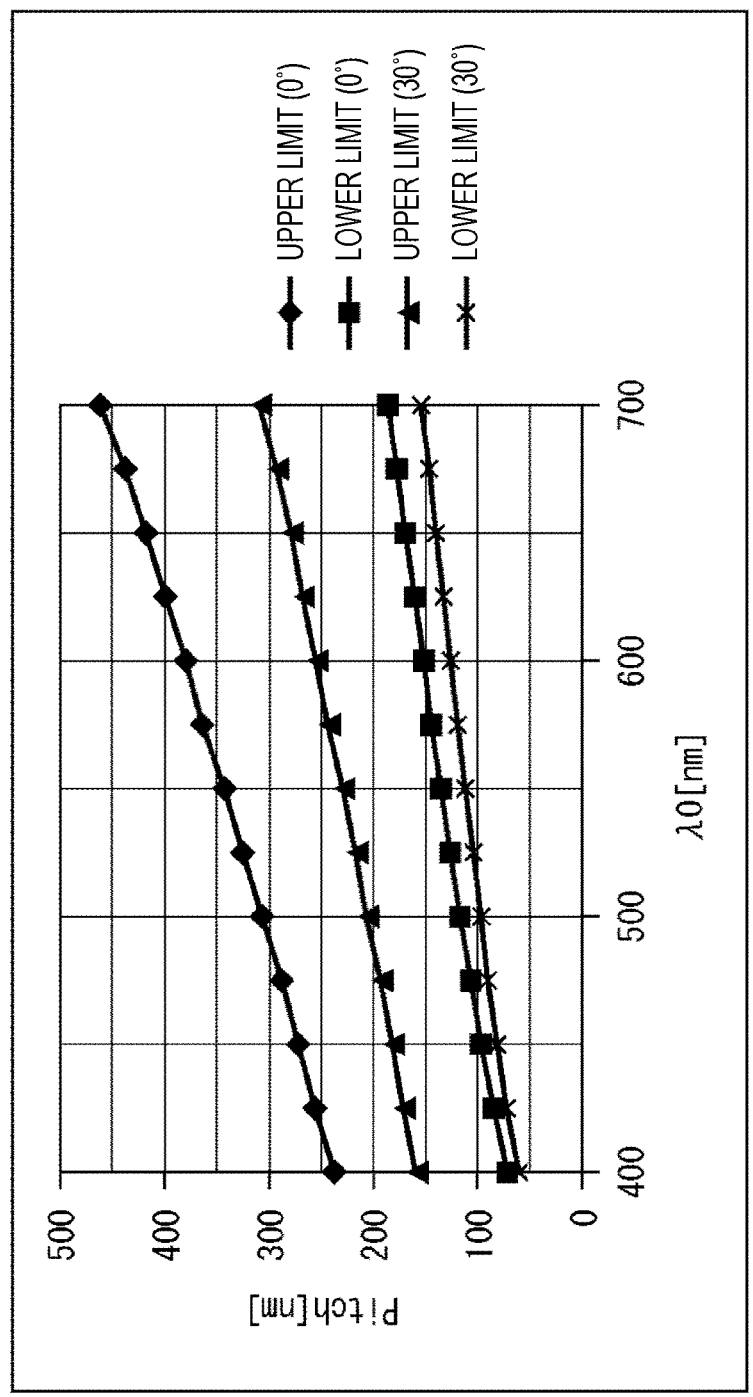
FIG. 7 is a view for illustrating a relationship between the wavelength and the pit P.

FIG. 7 is a graph illustrating a result of simulating the pitch P at which no diffraction light is generated as in the graph illustrated in FIG. 6, in which the wavelength of the incident light is plotted along the abscissa and a width of the pitch P is plotted along the ordinate with the material above being ALSO3 and the material below being Si.

In FIG. 7, lozenges represent an upper limit when the incident angle is 0 degree, and squares represent a lower limit when the incident angle is 0 degree. Furthermore, in FIG. 7, triangles represent an upper limit when the incident angle is 30 degree, and cross marks represent a lower limit when the incident angle is 30 degree.

It may be understood from FIG. 7 that it is necessary to form the uneven structure with the pitch of 70 nm or smaller in order to prevent the diffraction light from being generated on an emission side also for perpendicular incidence.

With a moth-eye structure film an upper surface of which is air, it is sufficient that the pitch P is 200 to 300 nm, and such pitch P may be easily manufactured. However, it is difficult to form an uneven pattern with the pitch P of 70 nm or smaller on the photodiode by the conventional technology from a viewpoint of size and material to be processed.

<Regarding Formation of Uneven Pattern at Pitch P>

By applying the present technology, it is possible to form the uneven pattern having the pitch P of 70 nm or smaller, preferably 55 nm or smaller. Hereinafter, a method of forming such pitch P is described.

FIG. 8 is a view illustrating an example of a shape of the uneven pattern. FIG. 8 is a view illustrating the uneven pattern when the solid-state imaging device 11 is seen from an upper surface (lens 31 side). A circle illustrated in FIG. 8 indicates the projected portion 37b formed in the intermediate first layer 37, and a portion between the projected portions 37b indicates the recess portion 37a. Here, the description is continued on the assumption that the projected portion 37b formed in the intermediate first layer 37 is circular (cylindrical).

In order to spread the uneven pattern at a small pitch P, an upper surface layout as illustrated in A of FIG. 8 or B of FIG. 8 is used in many cases. A of FIG. 8 illustrates an example in which the projected portions 37b being cylinders are arranged in a hexagonal lattice. Furthermore, B of FIG. 8 illustrates an example in which the projected portions 37b being cylinders are arranged in a square lattice. An interval between the projected portions 37b being cylinders is set as the pitch P.

Incidentally, a semiconductor process is often used to manufacture the solid-state imaging device 11. For pattern formation, a lithography technology, especially an optical lithography technology is often used. A reduction projection exposure device is used to form a fine pattern. With a numerical aperture of a reduction projection lens thereof set to NA and a maximum value of an expected angle of illumination set to θ, when light diffracted by a mask pattern enters the projection lens. light and dark of the pattern appear.

A pitch Pmin at which the light diffracted by the pattern of the mask enters the projection lens is given by following equation (3). In equation (3), λ represents an exposure wavelength. A refractive index of a medium under the projection lens is set to n and the expected angle of the projection lens as seen from a focal point is set to φ.

[Equation 3]

$$P_{min} = \frac{\lambda}{NA(1+\sigma)} \quad (3)$$

$$(NA = n\sin\phi, \sigma = \sin\theta)$$

Consider forming the pitch Pmin satisfying such a condition. In an ArF excimer laser exposure device having the exposure wavelength of 193 nm which is often used for fine pattern formation, when the numerical aperture NA of the lens is set to 0.93 and σ is set to 0.94, for example, a diffraction limit pitch is 107 nm.

For resolution of resist with a two-dimensional array pattern as illustrated in FIG. 8, it is expected that √2 times or more thereof is required. Therefore, a resolution limit pitch Pmin at that time is 151 nm.

In a case of the hexagonal lattice illustrated in A of FIG. 8 with the pitch P of 70 nm, it is difficult to form by one exposure and one etching, and it is considered to be necessary to repeat the exposure and the etching at least three times. In addition, considering manufacturing stability, it is considered to be necessary to repeat the same nine times.

Furthermore, in a case of the hexagonal lattice illustrated in A of FIG. 8 with the pitch P of 55 nm or smaller, it is necessary to repeat the exposure and etching at least nine times, and considering the manufacturing stability, it is necessary to further repeat the same a plurality of times. In such manufacture, a cost might be high.

Similarly, in a case of the square lattice illustrated in B of FIG. 8 with the pitch P of 70 nm, it is difficult to form by one exposure and one etching using the ArF excimer laser exposure device, and it is considered to be necessary to repeat the exposure and etching at least four times. In addition, considering the manufacturing stability, it is considered to be necessary to further repeat the same a plurality of times.

Furthermore, in a case of the square lattice illustrated in B of FIG. 8 with the pitch P of 55 nm or smaller, it is necessary to repeat the exposure and etching at least four times, and considering the manufacturing stability, it is necessary to repeat the same eight times. In such manufacture, manufacturing steps might be complicated and the cost might be increased.

In other words, in a case of forming the uneven pattern with the pitch P of 70 nm or smaller by the hexagonal lattice illustrated in A of FIG. 8 or the square lattice illustrated in B of FIG. 8 by the ArF excimer laser exposure device having the exposure wavelength of 193 nm which is widely used for fine pattern formation, there is a possibility that the number of times of repeating the exposure and etching increases and the manufacturing cost increases.

A case where an immersion ArF excimer laser exposure device capable of forming a finer pattern than the ArF excimer laser exposure device is used is considered though the cost is generally higher than that of the above-described ArF excimer laser exposure device.

As with the ArF excimer laser exposure device described above, the exposure wavelength of the immersion ArF excimer laser exposure device is 193 nm. When NA is 1.35 and σ is 0.94, the diffraction limit pitch is 74 nm. For the resolution of the resist with the two-dimensional array pattern as illustrated in FIG. 8, it is expected that √2 times or more thereof is required. Then, the resolution limit pitch is 104 nm.

In a case of the hexagonal lattice illustrated in A of FIG. 8 with the pitch P of 70 nm, it is difficult to form by one exposure and one etching even with the immersion ArF excimer laser exposure device. Furthermore, considering the manufacturing stability, it is considered to be necessary to repeat exposure and etching three times.

In a case of the hexagonal lattice illustrated in A of FIG. 8 with the pitch P of 55 nm or smaller, it is necessary to repeat the exposure and etching at least three times. Furthermore, considering the manufacturing stability, it is considered to be necessary to further repeat the exposure and etching a plurality of times. In such manufacture, manufacturing steps might be complicated and the cost might be increased.

In a case of the square lattice illustrated in B of FIG. 8 with the pitch P of 70 nm, it is difficult to form by one exposure and one etching even with the immersion ArF excimer laser exposure device. Furthermore, considering the manufacturing stability, it is considered to be necessary to repeat the exposure and etching twice, more preferably, four times.

In a case of the square lattice illustrated in B of FIG. 8 with the pitch P of 55 nm or smaller, it is necessary to repeat the exposure and etching at least twice. Furthermore, considering the manufacturing stability, it is considered to be necessary to repeat the exposure and etching four times. In such manufacture, manufacturing steps might be complicated and the cost might be increased.

Moreover, there is an EUV exposure device as means for forming the fine pattern. The EUV exposure device with the exposure wavelength of 13.5 nm, NA of 0.35, and σ of 0.8 may form a pitch of 30 nm or smaller. The EUV exposure device may form a pattern with a pitch of 55 nm or smaller by one exposure. However, since the exposure device is very expensive, the cost is increased as with the above-described device.

Moreover, there is an electron beam drawing device as means for forming the fine pattern. As with the EUV exposure device, the electron beam drawing device may form a pattern with a pitch P of 55 nm or smaller by one exposure. However, since a throughput is low, more devices are required for mass production, and the cost might finally increase.

Moreover, there is a method of utilizing self assembly as means for forming the fine pattern. In other words, when forming the uneven structure, the optical lithography may be used as described above; however, for example, it is also possible to configure such that the volume of Si which is the material of the Si substrate 38 and the volume of the recess portion 37a have the above-described volume ratio by using a self assembly, and form the recess portion 37a by etching.

For example, in a case of using the self assembly, polymers such as block copolymers and metal nanoparticles may form periodic patterns through interaction.

For example, using block copolymer PS-b-PMMA including polystyrene (PS) and polymethyl methacrylate (PMMA), it is possible to form a hole array pattern with the pitch P of 30 nm to 70 nm. The pitch P is determined by a molecular weight of PS-b-PMMA. After a neutral film for adjusting surface energy is formed on a wafer substrate by spin-coating and baking, PS-b-PMMA is spin-coated, and phase separation baking is applied to promote the self assembly.

By such a step, a hole array is formed by dry etching or wet etching PMMA out of periodically arrayed PS-b-PMMA. A grain boundary is generated in the process of phase separation, but the hole array may be formed without exposure. This is an advantage that the cost may be lowered.

Moreover, as another means for forming the fine pattern, there is a nano imprinting method. The nano imprinting method is a method of pressing a template having resin solution and a pattern on a wafer to print. The resin solution is solidified by UV irradiation or heating. The printing is repeatedly performed on the entire wafer surface or divided areas.

In terms of requiring the template having the fine pattern and a nano imprinting device, there is a possibility that the cost becomes higher than that in the self assembly described above. However, unlike the self assembly, there is an advantage that the size may be changed for each pattern.

The nano imprinting method is also a candidate for pattern formation. Note that, although an imprinting method is partially used for forming moth-eye for display, the nano imprinting method capable of forming a finer pattern is suitable for this purpose.

Unlike forming a circuit, high positional accuracy and dimensional accuracy are not required for forming a periodic pattern for an antireflective structure. From this viewpoint also, the self assembly and the nano imprinting method are suitable as means for forming the fine pattern.

In this manner, there are the ArF excimer laser exposure device, the immersion ArF excimer laser exposure device, the EUV exposure device, and the electron beam drawing device as means for forming the fine pattern, but there is a possibility that the step becomes complicated and the cost becomes high. Therefore, it is possible to form the fine uneven pattern satisfying the condition of the pitch P described above by using the ArF excimer laser exposure device, the immersion ArF excimer laser exposure device, the EUV exposure device, the electron beam drawing device and the like such as in a case where the cost may be high.

Furthermore, in a case where it is possible to prevent a complicated step and a high cost and the fine uneven pattern satisfying the above-described condition of the pitch P is formed, it is possible to form by using the self assembly and the nano imprinting method.

Hereinafter, a case of forming the fine uneven pattern is further described.

<Regarding Effective Refractive Index with which Diffraction Light is not Generated>

Next, the effective refractive index (effective refractive index neff of the intermediate first layer 37 described with reference to FIG. 3) of the uneven pattern with which the diffraction light is not generated is described.

As described with reference to FIG. 3, an uneven area of the intermediate first layer 37 may be optically handled as a planar surface film of an intermediate effective refractive index neff between the refractive index n1 of a medium 1 above and the refractive index n2 of a medium 2 below (refractive index n1 of the intermediate second layer 36 and refractive index n2 of the Si substrate 38). Specifically, the effective refractive index neff is given by following Lorentz-Lorenz equation (4). In this regard, space occupancy of the medium 1 is set to f.

[Equation 4]

$$\frac{n_{eff}^2 - 1}{n_{eff}^2 + 2} = f \frac{n_1^2 - 1}{n_1^2 + 2} + (1-f) \frac{n_2^2 - 1}{n_2^2 + 2} \quad (4)$$

Next, an antireflective condition is described. Since components nearly perpendicular are dominant in the light incident on the photodiode of the solid-state imaging device 11, the description is herein continued taking a case of perpendicular incidence as an example.

Figure 9:
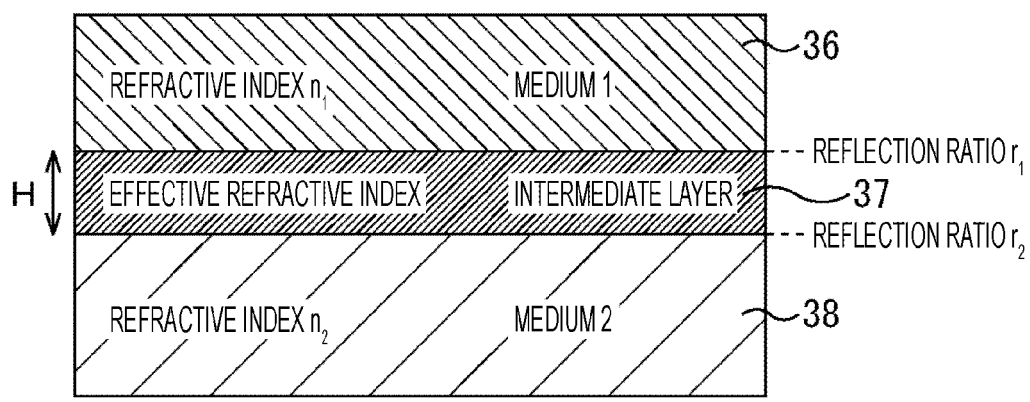
FIG. 9 is a view for illustrating a reflection ratio between layers.

As illustrated in FIG. 9, an amplitude reflection ratio at an interface between the medium 1 and the intermediate layer is set to r1, an amplitude reflection ratio at an interface between the medium 2 and the intermediate layer is set to r2, and the height (thickness) of the intermediate layer is set to H. The medium 1 in FIG. 9 corresponds to the intermediate second layer 36 having the refractive index n1 in FIG. 3, for example. Furthermore, the medium 2 in FIG. 9 corresponds to the Si substrate 38 having the refractive index n2 in FIG. 3, for example. Furthermore, the intermediate layer in FIG. 9 corresponds to the intermediate first layer 37 having the effective refractive index neff in FIG. 3, for example.

In FIG. 9, the light interferes in a multiple manner in the intermediate layer, and an intensity reflection ratio R on an upper surface of the intermediate layer is given by following equation (5).

[Equation 5]

$$R = \frac{r_1^2 + r_2^2 + 2r_1 r_2 \cos\phi}{1 + (r_1 r_2)^2 + 2r_1 r_2 \cos\phi} \quad (5)$$

$$r_1 = \frac{n_{eff} - n_1}{n_{eff} + n_1}, r_2 = \frac{n_2 - n_{eff}}{n_2 + n_{eff}}, \phi = \frac{4\pi n_{eff} H}{\lambda_0}$$

A condition under which the intensity reflection ratio on the upper surface of the intermediate layer is minimized is as follows. Following equation (6) expresses a condition of the effective refractive index neff with which the intensity reflection ratio on the upper surface of the intermediate layer is minimized, and following equation (7) expresses a condition of the height H1 (FIG. 2) of the projected portion 37b with which the intensity reflection ratio on the upper surface of the intermediate layer is minimized. In this regard, the refractive index is a function of the wavelength.

[Equation 6]

$$n_{eff} = \sqrt{n_1 n_2} \quad (6)$$

[Equation 7]

$$H = \frac{\lambda_0}{4 n_{eff}} = \frac{\lambda_0}{4\sqrt{n_1 n_2}} \quad (7)$$

Figure 10:
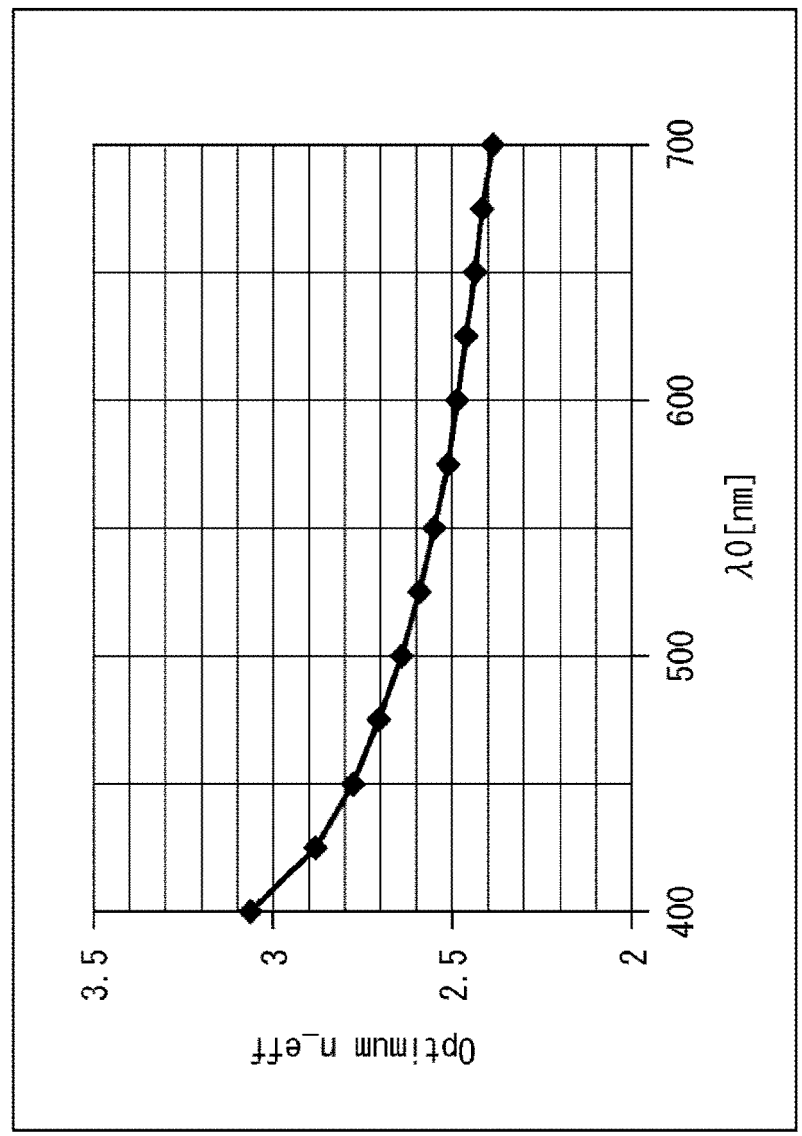
FIG. 10 is a view for illustrating a relationship between the wavelength and an effective refractive index.
Figure 11:
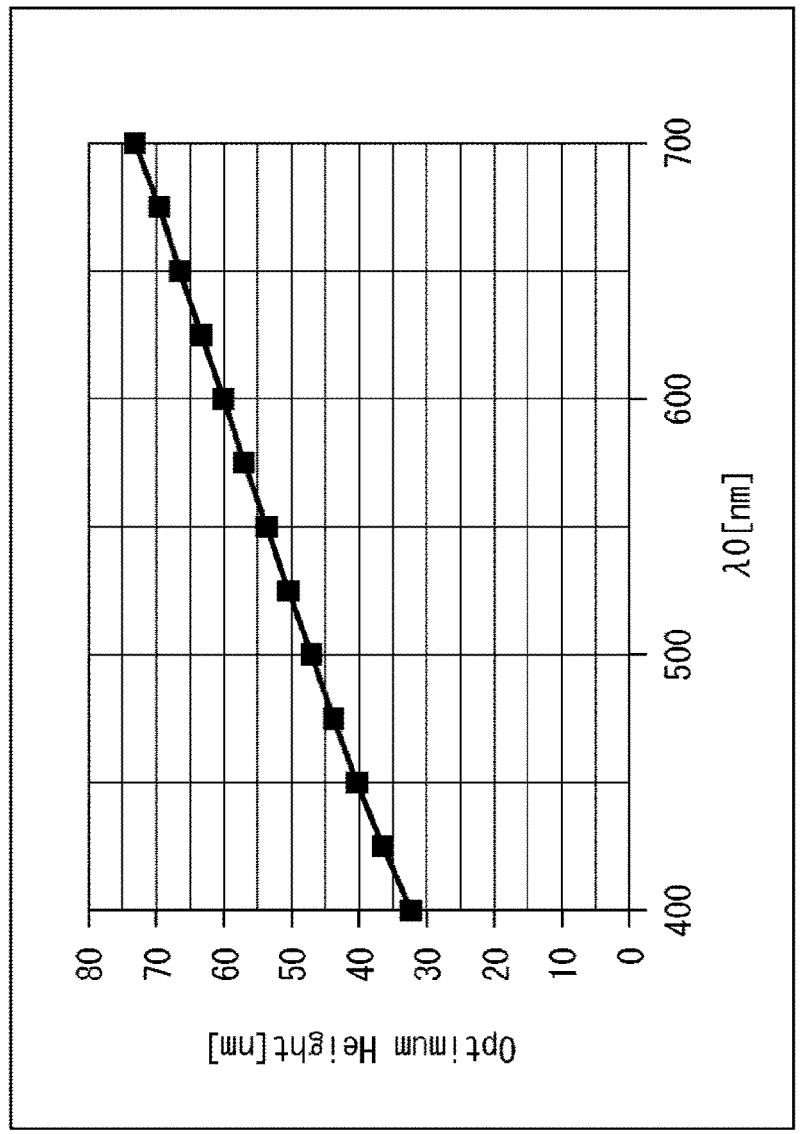
FIG. 11 is a view for illustrating a relationship between the wavelength and a height of a projected portion.

For example, in a case where the medium 1 is Al2O3 and the medium 2 is Si, the effective refractive index neff and the height H of the antireflective condition of the intermediate layer are as illustrated in FIGS. 10 and 11. FIG. 10 is a graph in which a calculation result based on equation (6) is plotted when the wavelength of the light is along the abscissa and the effective refractive index neff is along the ordinate. Furthermore, FIG. 11 is a graph in which a calculation result based on equation (7) is plotted when the wavelength of the light along the abscissa and the height H of the projected portion 37b is along the ordinate.

It may be understood from FIG. 10 that the uneven structure may realize a relatively high effective refractive index neff from 2.4 to 3.1. Furthermore, it may be understood from FIGS. 10 and 11 that the effective refractive index neff and the height H of the intermediate layer are dependent on the wavelength, and the effective refractive index neff and the height H of the intermediate layer are ideally optimized for each wavelength.

From equation (7), it may be understood that it is sufficient that the height H is an integral multiple of λ0/4 neff. Furthermore, it may be understood that the height H depends on the wavelength λ0. With this arrangement, it is conceivable that the height. H is set to λ0/4 neff which is a first optimal solution with small difference. Furthermore, in a case where H is set to λ0/4 neff, grooves of unevenness become shallow, so that processing is considered to be easier.

Figure 12:
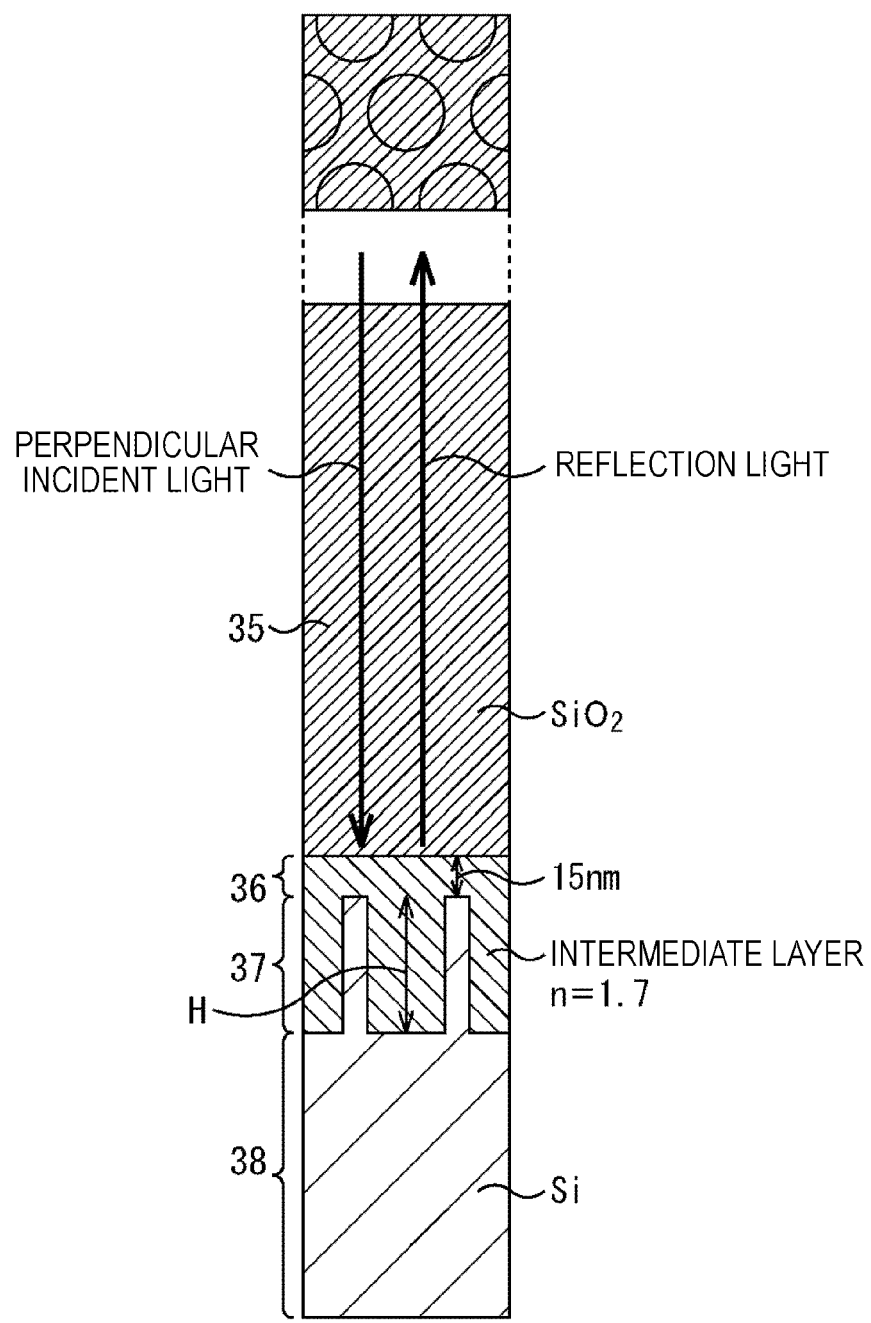
FIG. 12 is a view for illustrating a relationship between the wavelength and the height of the projected portion.
Figure 13:
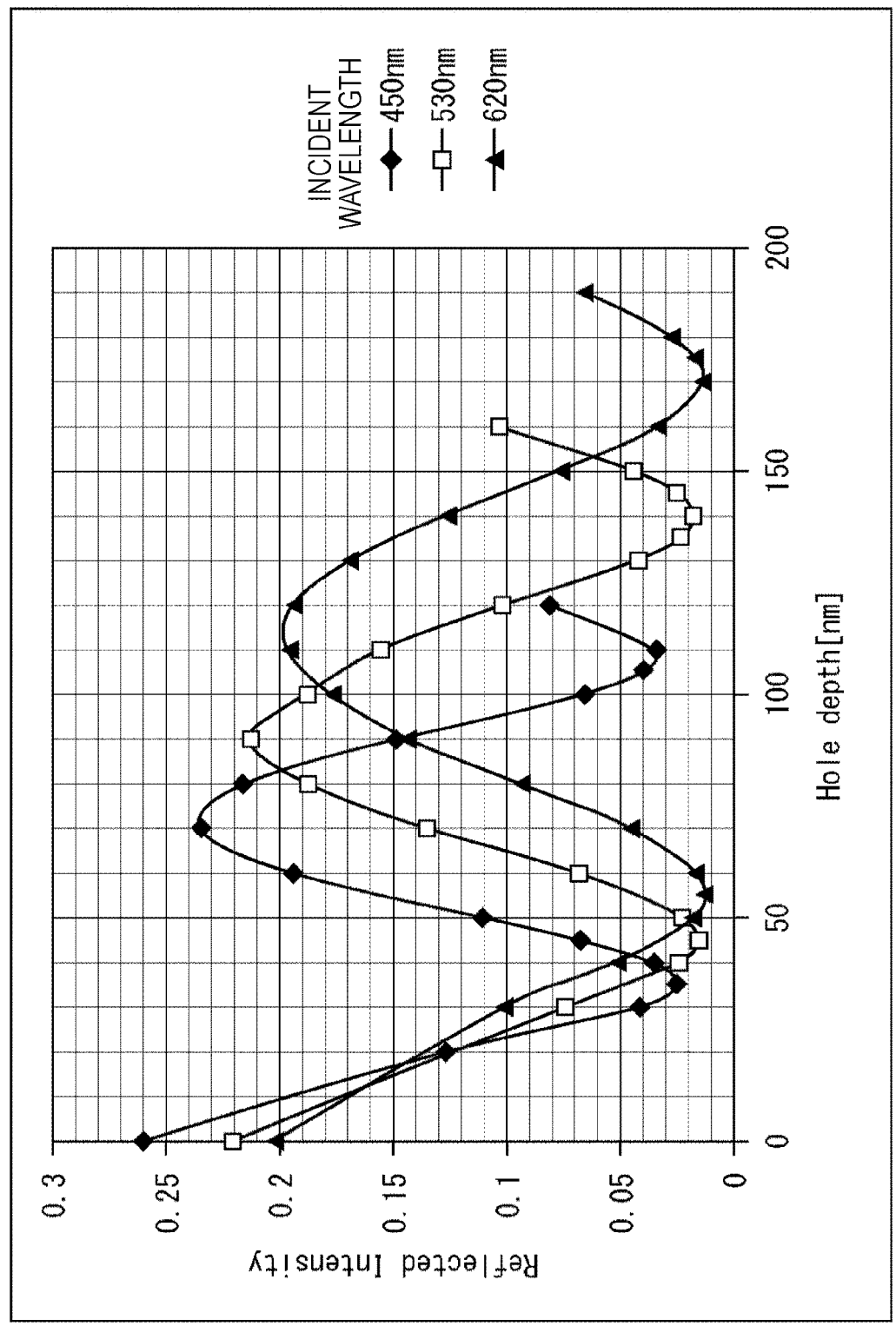
FIG. 13 is a view for illustrating a relationship between the height of the projected portion and light reflection intensity.

For example, a result of simulating the intensity of the reflection light on the upper surface of the intermediate layer by a FDTD method being one type of electromagnetic field calculation while changing a depth of the cylinder in a case where the hexagonal lattice Si cylindrical holes (with pitch of 40 nm and diameter of 30 nm) are formed on the Si substrate 38, the intermediate film (intermediate first layer 37) having the refractive index of 1.7 is stacked thereon, and the SiO2 film (oxide film 35) is further formed thereon as illustrated in FIG. 12 is illustrated in FIG. 13.

In a graph illustrated in FIG. 13, the height H of the projected portion 37b (the depth of the recess portion 37a, the thickness of the intermediate first layer 37) is plotted along the abscissa, and the reflection intensity is plotted along the ordinate. Furthermore, in FIG. 13, a line connecting lozenges represents a result of the simulation when the wavelength of the incident light is 450 nm, a line connecting squares represents a result of the simulation when the wavelength of the incident light is 530 nm, and a line connecting triangles represents a result of the simulation when the wavelength of the incident light is 620 nm. Note that each wavelength is a wavelength in vacuum.

It may be understood from the graph in FIG. 13 that the reflection intensity oscillates with respect to the depth of the cylindrical hole (the height H of the projected portion 37b). It may also be understood from the graph in FIG. 13 that a period of the oscillation is proportional to the wavelength.

With this arrangement, it may be understood that the depth of the cylindrical hole at which the reflection intensity is minimum depends on the wavelength. Furthermore, it may also be understood that setting the depth (height H) of the cylindrical hole in the vicinity of a first point at which the reflection ratio decreases is desirable from the viewpoint of reducing the reflection ratio over a wide wavelength region.

Here, the relationship among the effective refractive index neff, the refractive index n1, and the refractive index n2 is considered again. The relationship among the effective refractive index neff, the refractive index n1, and the refractive index n2 may be represented by equation (4) described above. From this equation (4), when the effective refractive index neff of the antireflective condition is determined, optimum space occupancy f realizing the effective refractive index neff may also be calculated as follows.

[Equation 8]

$$f = \frac{A_2 - A_{eff}}{A_2 - A_1} \quad (8)$$

In equation (8), Aeff, A1, and A2 satisfy following equation (9), respectively.

[Equation 9]

$$A_{eff} = \frac{n_{eff}^2 - 1}{n_{eff}^2 + 2} = \frac{n_1 n_2 - 1}{n_1 n_2 + 2}, A_1 = \frac{n_1^2 - 1}{n_1^2 + 2}, A_2 = \frac{n_2^2 - 1}{n_2^2 + 2} \quad (9)$$

The optimum space occupancy f also depends on the wavelength as the effective refractive index neff of the antireflective condition depends on the wavelength. Therefore, when this is reflected in equation (8), this may be expressed as following equation (10).

[Equation 10]

$$f(\lambda) = \frac{A_2(\lambda) - A_{eff}(\lambda)}{A_2(\lambda) - A_1(\lambda)} \equiv F(\lambda) \quad (10)$$

Figure 14:
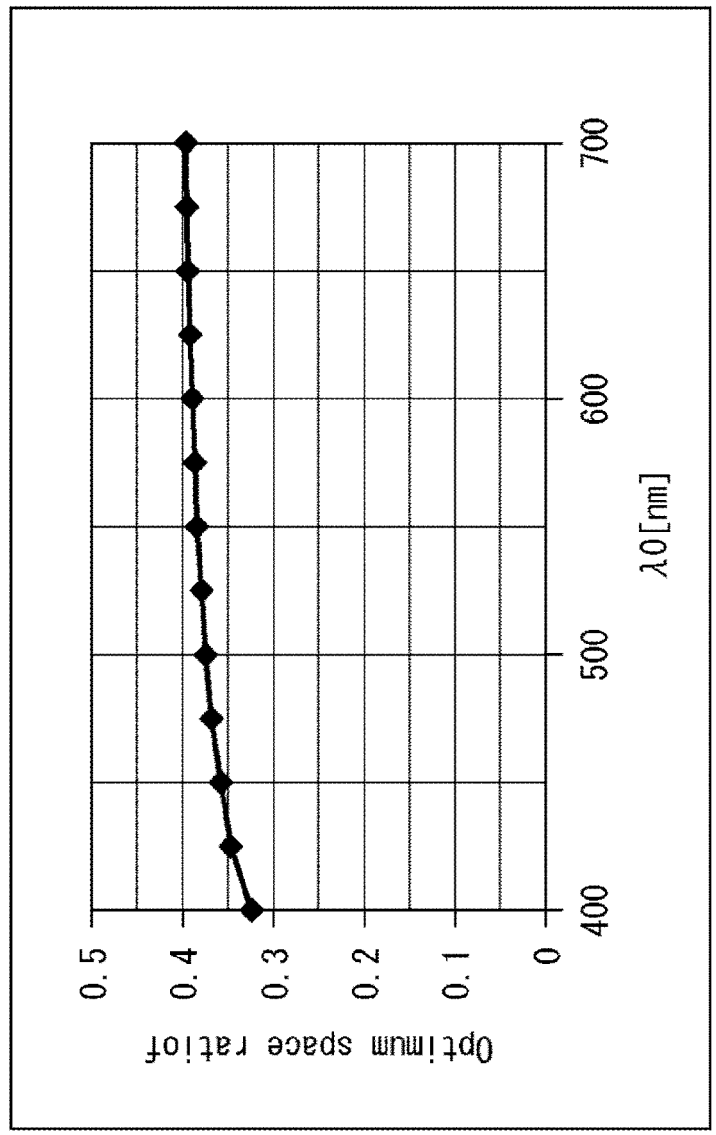
FIG. 14 is a view for illustrating a relationship between the wavelength and space occupancy.

For example, in a case where the medium 1 is Al2O3 and the medium 2 is Si, the dependency of the optimum space occupancy f on the wavelength λ is as illustrated in FIG. 14. In a graph illustrated in FIG. 14, the wavelength λ0 is plotted along the abscissa and the space occupancy f is plotted along the ordinate.

From the graph in FIG. 14, it may be understood that in a case where the wavelength λ0 is 400 to 700 nm, the optimum space occupancy f transits between about 0.3 to 0.4.

Figure 15:
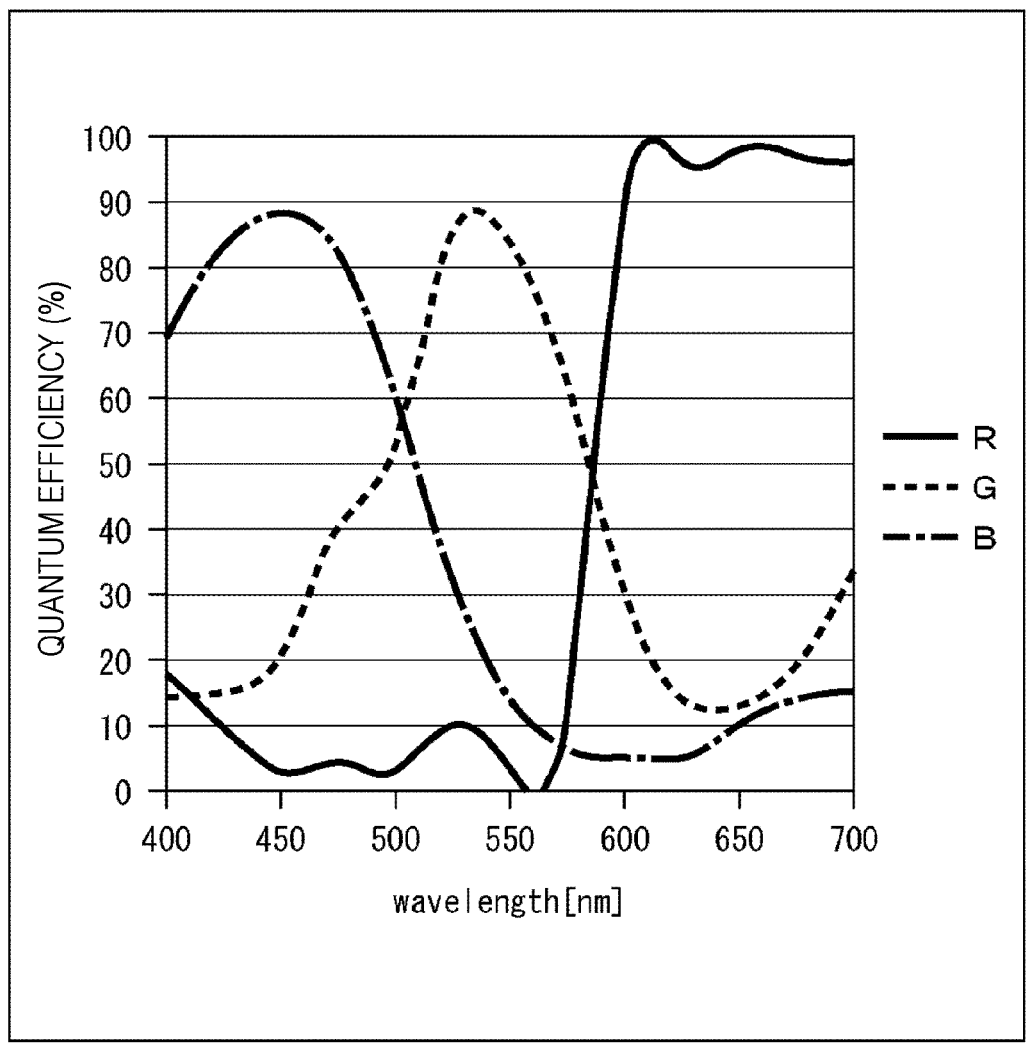
FIG. 15 is a view for illustrating a spectral characteristic.

Incidentally, in a case of a pixel array (pixel array unit) which discriminates colors in a planar direction, it is desirable to optimize the antireflective condition for each color. Each pixel has, for example, a spectral characteristic as illustrated in FIG. 15, and the wavelength continuously exists in each pixel. In FIG. 15, the wavelength is plotted along the abscissa, quantum efficiency is plotted along the abscissa, a solid line represents red (R), a broken line represents green (G), and a dashed-dotted line represents blue (B).

As described above, it may be understood from a graph in FIG. 15 that red, green, and blue have different spectral characteristics. Therefore, optimum values of the thickness of the intermediate first layer 37 (the height of the projected portion 37b), the space occupancy, the pitch and the like are different for each color, and it is considered to be preferably configured with the optimum values for each color (each pixel). A method of further suppressing the reflection ratio is described.

<Regarding Determination of Space Occupancy f>

First, a method of determining the space occupancy f of the medium 1 (intermediate second layer 36) directly related to the effective refractive index of the intermediate layer (the effective refractive index neff of the intermediate first layer 37) is described. Since the intermediate first layer 37 is obtained by filling the recess portion 37a of the Si substrate 38 with the same material as that of the intermediate second layer 36, the space occupancy f of the intermediate second layer 36 relates to the effective refractive index neff of the intermediate first layer 37.

As determining methods A-1 to A-4, a case of making the effective refractive index neff common to all pixels is described, and as determining methods B-1 to B-3, a case of adjusting the effective refractive index neff for each pixel is described.

The determining methods A-1 to A-4 are conditions applied in a case of making the effective refractive index neff common to all the pixels, for example, in a case where it is difficult to adjust the size (the pitch P, the diameter of the cylindrical hole and the like) of the uneven pattern for each pixel by using the self assembly. In the following description, description is continued on the assumption that the wavelength region (the wavelength region of light received and processed by the solid-state imaging device 11) which the solid-state imaging device 11 may discriminate is λmin to λmax.

(Determining Method A-1)

An average value is used, and a value obtained by following equation (11) is set to the space occupancy f of the medium 1 (intermediate second layer 36).

[Equation 11]

$$f = \frac{\int_{\lambda_{min}}^{\lambda_{max}} F(\lambda)d\lambda}{\lambda_{max} - \lambda_{min}} \quad (11)$$

In equation (11), F(λ) represents a value calculated by equation (10).

(Determining Method A-2)

An average value weighted by spectral sensitivity W(λ) is used, and a value obtained by following equation (12) is set to the space occupancy f of the medium 1 (intermediate second layer 36).

[Equation 12]

$$f = \frac{\int_{\lambda_{min}}^{\lambda_{max}} w(\lambda)F(\lambda)d\lambda}{\int_{\lambda_{min}}^{\lambda_{max}} w(\lambda)d\lambda} \quad (12)$$

(Determining Method A-3)

It is optimized for a critical wavelength λc in image quality, and a value obtained by following equation (13) is set to the space occupancy f of the medium 1 (intermediate second layer 36).

[Equation 13]

$$f = F(\lambda_C) \quad (13)$$

(Determining Method A-4)

An arbitrary value between the minimum value λmin and the maximum value λmax of the wavelength region is used, and a value obtained by following equation (14) is set to the space occupancy f of the medium 1 (intermediate second layer 36).

[Equation 14]

$$\text{Min}[F(\lambda)] \leq f \leq \text{Max}[F(\lambda)] \quad (14)$$

where
$\lambda_{min} \leq \lambda \leq \lambda_{max}$

The determining methods B-1 to B-3 are conditions applied in a case of adjusting the effective refractive index neff for each pixel, for example, in a case where the size (the pitch P, the diameter of the cylindrical hole and the like) of the uneven pattern is adjusted for each pixel by using the nano imprinting method. In the following description, a red (R) pixel, a green (G) pixel, and a blue (B) pixel are described as an example.

(Determining Method B-1)

For each of the R pixel, G pixel, and B pixel, an average value weighted by the spectral sensitivity W(λ) is used, and a value obtained by following equation (15) is set to the space occupancy f of the medium 1 (intermediate second layer 36).

[Equation 15]

$$f = \frac{\int_{\lambda_{min}}^{\lambda_{max}} w(\lambda)F(\lambda)d\lambda}{\int_{\lambda_{min}}^{\lambda_{max}} w(\lambda)d\lambda} \quad (15)$$

In equation (15), F(λ) represents a value calculated by equation (10). Furthermore, F(λ) is a value calculated from the effective refractive index neff of the intermediate first layer 37, the refractive index n1 of the intermediate second layer 37, and the refractive index n2 of the Si substrate 38, and a value indicating the space occupancy at a predetermined wavelength λ.

(Determining Method B-2)

For each of the R pixel, G pixel, and B pixel, it is optimized for the peak value λp of the spectral sensitivity W(λ), and a value obtained by following equation (16) is set to the space occupancy f of the medium 1 (intermediate second layer 36).

[Equation 16]

$$f = F(\lambda_p) \quad (16)$$

(Determining Method B-3)

For each of the R pixel, G pixel, and B pixel, a threshold of the spectral sensitivity W(λ) is specified, and a value obtained by following equation (17) is set to the space occupancy f of the medium 1 (intermediate second layer 36). In Equation (17), a smaller value of the thresholds is set to XL, and a larger value is set to λU.

[Equation 17]

$$F(\lambda_L) \leq f \leq F(\lambda_{11}) \quad (17)$$

The space occupancy f is set by any one of the determining methods A-1 to A-4 and B-1 to B-3. Here, an example of a pattern dimension of the space occupancy f is illustrated, and the space occupancy f of the medium 1 (intermediate second layer 36) is further described.

Figure 16:
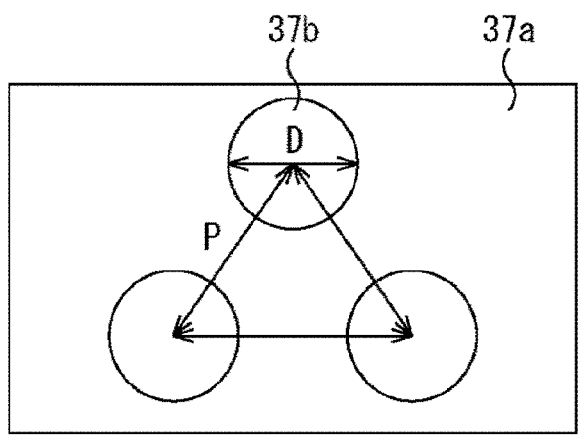
FIG. 16 is a view for illustrating arrangement of the projected portions.

FIG. 16 is a view of the uneven pattern as seen from above. In the example illustrated in FIG. 16, the projected portion 37b has a circular shape, and a diameter thereof is set to a diameter D. Furthermore, the adjacent projected portions 37b are arranged at an interval of the pitch P.

A relationship among the space occupancy f of the medium 1, the pitch P, and the diameter D may be expressed by following equation (18).

[Equation 18]

$$f = \frac{\pi}{2\sqrt{3}}\left(\frac{D}{P}\right)^2 \quad (18)$$

Using equation (18), it is possible to determine the pitch P and the diameter D at which the desired space occupancy f is realized. Note that, since the space occupancy f is important, the pattern need not be a perpendicular shape, for example, a cylinder.

Figure 17:
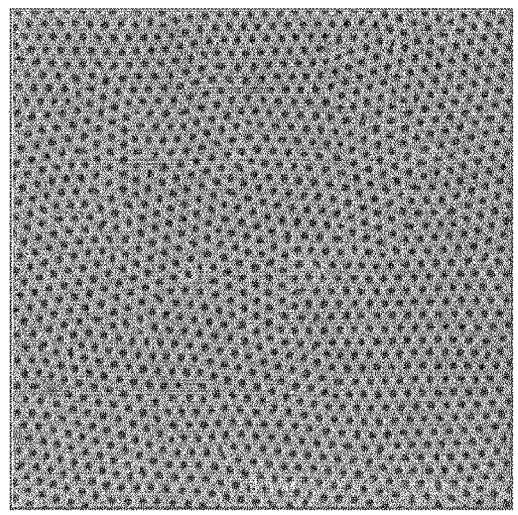
FIG. 17 is a view illustrating an example when a hole array is formed by self assembly.

Furthermore, the space occupancy f is a statistical value (average value) within one pixel. Therefore, even if there are variations in individual patterns and sizes, it suffices that the average value is close to a desired value. For example, as illustrated in FIG. 17, when the hole array is formed by the self assembly, even if there is a grain boundary, a defect, and dimensional variation within one pixel, it suffices that the average value of the space occupancy f is close to a desired value within one pixel.

When standard deviation of the diameter D of each hole is σD and the number of holes in one pixel is n, the average value of the diameter D in the pixel and the standard deviation σ<D> between the pixels are expressed by following equation (19).

[Equation 19]

$$\sigma_{\langle D \rangle} = \frac{\sigma_D}{\sqrt{n}} \quad (19)$$

For example, in a case of a pixel of 1 μm×1 μm and the pitch P of 40 nm, the number of holes n is about 720, and √n is about 27. The variation in pixel units is reduced to about 1/27 of individual variation.

<Regarding Determination of Height H>

Next, a method of determining the height H of the uneven pattern after setting the space occupancy f of the medium 1 of the uneven pattern is described.

Here, a case of determining the height H for each of the R pixel, G pixel, and B pixel is described as an example. The effective refractive index neff(λ) at the wavelength λ is given by equation (4) as described above. In equation (4), the refractive index n1 and the refractive index n2 are functions of λ.

Furthermore, the height H of the projected portion (the depth of the recess portion) of the uneven pattern at which the reflection on the upper surface of the intermediate layer is minimum is a condition under which the lights cancel each other out due to interference, and may be expressed by following equation (20). In Equation (20), λ is the wavelength in vacuum, and the effective refractive index neff(λ) is the function of the wavelength, so that the height H also is a function of the wavelength.

[Equation 20]

$$H(\lambda) = \frac{\lambda}{4n_{\text{eff}}(\lambda)} \quad (20)$$

The wavelength in the pixel has a width. For example, the wavelength of the light received by the B pixel has a width of 400 to 500 nm. Because of this width, the height H (the thickness of the intermediate first layer 37) is determined by any of the following determining methods.

(Determining Method C-1)

For each of the R pixel, G pixel, and B pixel, an average value weighted by the spectral sensitivity W(λ) is used, and a value obtained by following equation (21) is set to the height H of the projected portion 37b of the medium 2 (intermediate first layer 37).

[Equation 21]

$$H = \frac{\int_{\lambda_{min}}^{\lambda_{max}} \frac{w(\lambda)\lambda}{n_{\text{eff}}(\lambda)} d\lambda}{4 \int_{\lambda_{min}}^{\lambda_{max}} w(\lambda) d\lambda} \quad (21)$$

(Determining Method C-2)

For each of the R pixel, G pixel, and B pixel, it is optimized for the peak value λp of the spectral sensitivity W(λ), and a value obtained by following equation (22) is set to the height H of the projected portion 37b of the medium 2 (intermediate first layer 37).

[Equation 22]

$$H = \frac{\lambda_p}{4n_{\text{eff}}(\lambda_p)} \quad (22)$$

(Determining Method C-3)

For each of the R pixel, G pixel, and B pixel, a threshold of the spectral sensitivity W(λ) is specified, and a value obtained by following equation (23) is set to the height H of the projected portion 37b of the medium 2 (intermediate first layer 37).

[Equation 23]

$$H = \frac{\lambda_L}{4n_{\text{eff}}(\lambda_L)} \leq H \leq \frac{\lambda_U}{4n_{\text{eff}}(\lambda_U)} \quad (23)$$

The height H (the thickness of the intermediate first layer 37) of the projected portion 37b is set by any one of the determining methods C-1 to C-3.

As described above, the determining method of the space occupancy f may be determined by seven determining methods A-1 to A-4 and B-1 to B-3, and the determining method of the height H of the intermediate layer may be determined by three determining methods of C-1 to C-3. Therefore, in a case of combining the determining methods of the space occupancy f and the determining methods of the height H of the intermediate layer, there are 21 combinations.

From the 21 combinations, the space occupancy f and the height H may be determined by the optimum combination. For example, they may also be determined by calculating and simulating the combination of the space occupancy f and the height H with which the maximum reflection ratio or average reflection ratio in the wavelength region is the minimum value.

<Effect by Forming Uneven Pattern>

In this manner, for example, as illustrated in FIG. 2, in the solid-state imaging device 11 to which the present technology is applied, the Si substrate 38 with the refractive index n0, the intermediate second layer 36 with the refractive index n1, and the oxide film 35 with the refractive index n0 are stacked, and the intermediate first layer 37 and the intermediate second layer 36 include the layer serving as the reflection ratio adjusting layer because they are formed to have the fine uneven structure.

Figure 18:
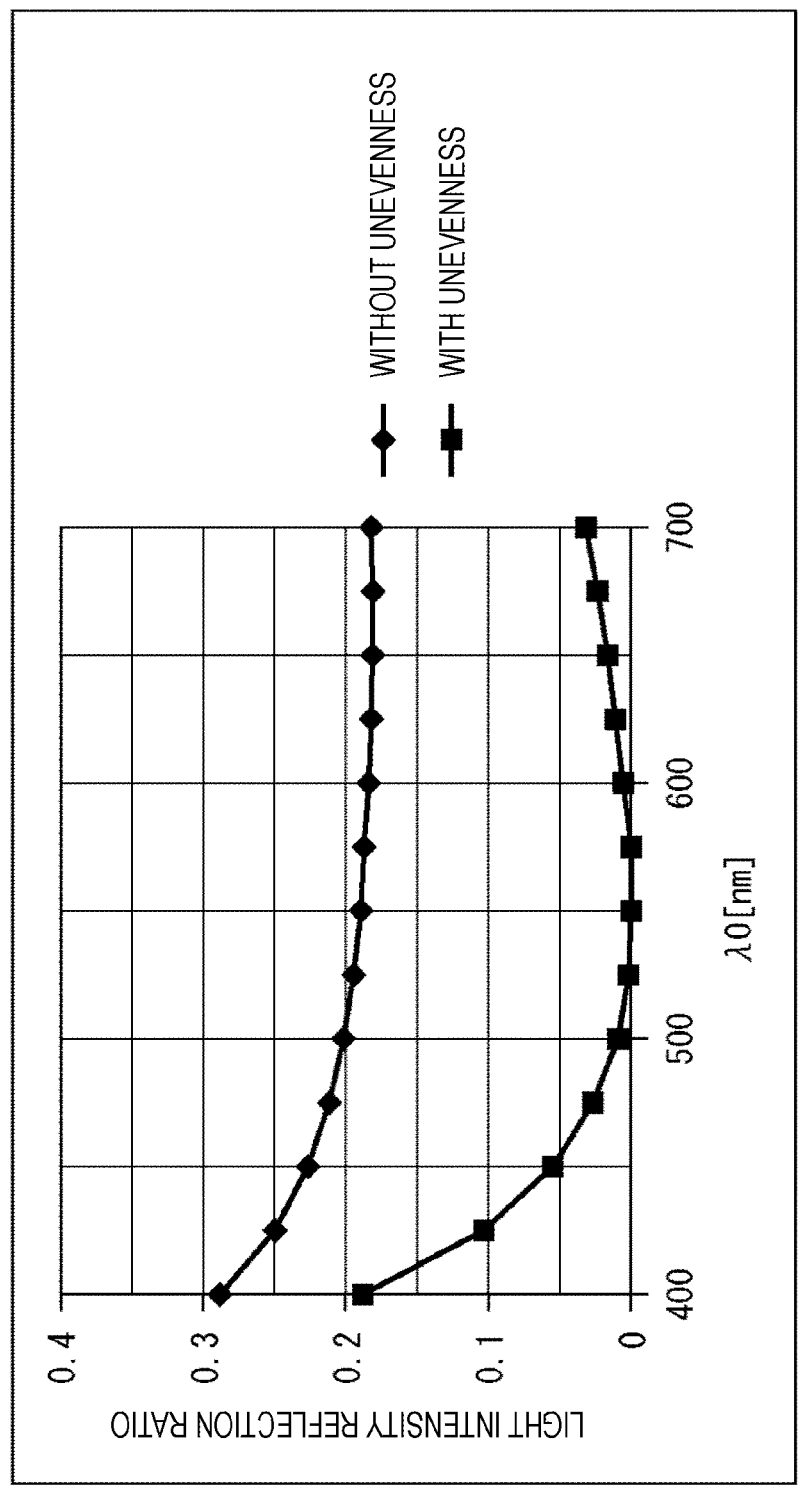
FIG. 18 is a view for illustrating a light intensity reflection ratio in cases with and without the uneven structure.

With reference to FIG. 18, it is described that the solid-state imaging device 11 having the uneven structure may reduce the reflection ratio as compared with a solid-state imaging device not having the uneven structure. In a graph illustrated in FIG. 18, the wavelength is plotted along the abscissa and the light intensity reflection ratio is plotted along the ordinate. Furthermore, in FIG. 18, a line connecting lozenges (a graph without unevenness) represents the light intensity reflection ratio in the solid-state imaging device not having the uneven structure, and a line connecting squares (a graph with unevenness) represents the light intensity reflection ratio in the solid-state imaging device 11 having the uneven structure.

Furthermore, the graph with unevenness illustrated in FIG. 18 illustrates a result of measurement with the solid-state imaging device 11 in which the uneven structure is optimized for the vacuum wavelength of 550 nm. Specifically, the light intensity reflection ratio measured by the solid-state imaging device 11 having the space occupancy f of 0.385 and the height H of 54 nm is illustrated. Furthermore, the light intensity reflection ratio in a case where the medium 1 is ALSO 3, the medium 2 is Si, and it is measured at the time of normal incidence is illustrated.

In the graph illustrated in FIG. 18, the lower the light intensity reflection ratio is, the more the reflection is reduced. From the graph in FIG. 18, it may be understood that the light intensity reflection ratio is lower and the reflection is suppressed in the graph with the unevenness than in the graph without the unevenness in all the wavelength regions. In other words, it may also be understood from the graph in FIG. 18 that the solid-state imaging device 11 having the uneven structure may suppress the reflection more than the solid-state imaging device having no uneven structure in the entire wavelength region.

Furthermore, referring to the graph with the unevenness of the solid-state imaging device 11 having the uneven structure, it may be understood that the light intensity reflection ratio is the lowest at the wavelength of 550 nm in the graph with the unevenness. It is understood that the reflection may be suppressed the most at the optimized wavelength according to the solid-state imaging device 11 in which the uneven structure is optimized for the vacuum wavelength of 550 nm as described above.

In this manner, by forming the uneven structure, that is, by forming the reflection ratio adjusting layer in the solid-state imaging device 11, the reflection may be reduced. Furthermore, by optimizing the uneven structure, the reflection at the optimized wavelength may be surely reduced.

A fact that the reflection may be further reduced by having the uneven structure and optimizing the height H and the space occupancy f thereof is described.

Figure 19:
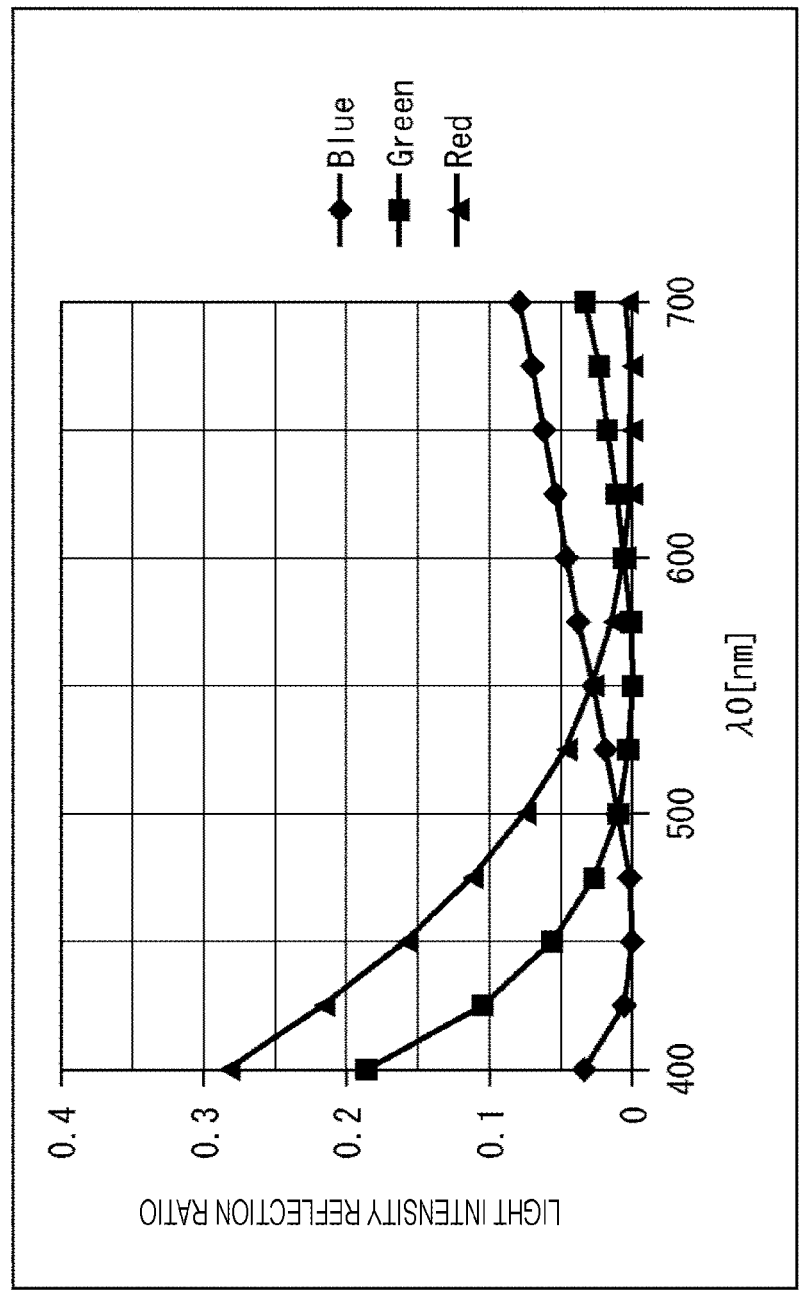
FIG. 19 is a view for illustrating a relationship between the wavelength and the light intensity reflection ratio.

A graph illustrated in FIG. 19 is a graph illustrating the reflection ratio when optimizing the space occupancy f for the vacuum wavelength of 550 nm and optimizing the height H for each of the R pixel, the G pixel, and the B pixel.

The graph illustrated in FIG. 19 is a graph in a case where it is set that the optimum height H=41.5 nm for $\lambda 0$=450 nm in the B pixel, the optimum height H=53.8 nm for $\lambda 0$=550 nm in the G pixel, and the optimum height H=66.0 nm for $\lambda 0$=650 nm in the R pixel.

In FIG. 19, a line connecting lozenges (referred to as a graph B) represents the light intensity reflection ratio in the B pixel, a line connecting squares (referred to as a graph G) represents the light intensity reflection ratio in the G pixel, and a line connecting triangles (referred to as a graph R) represents the light intensity reflection ratio in the R pixel.

With reference to the graph with the unevenness illustrated in FIG. 18 and the graph B illustrated in FIG. 19, it may be understood that, in a range of the effective wavelength region of the B pixel of 400 to 500 nm, the maximum reflection ratio decreases from 19% (FIG. 18) to 3.7% (FIG. 19).

Similarly, with reference to the graph with the unevenness illustrated in FIG. 18 and the graph G illustrated in FIG. 19, it may be understood that, in a range of the effective wavelength region of the G pixel of 500 to 600 nm, the maximum reflection ratio is substantially the same and is 1.0%. Since the graph with unevenness illustrated in FIG. 18 is a result of measurement with pixels having a structure optimized for the vacuum wavelength of 550 nm in the effective wavelength region of the G pixel of 500 to 600 nm, the reflection ratio is substantially the same.

Similarly, with reference to the graph with the unevenness illustrated in FIG. 18 and the graph R illustrated in FIG. 19, it may be understood that, in a range of the effective wavelength region of the R pixel of 600 to 700 nm, the maximum reflection ratio decreases from 3.4% (FIG. 18) to 0.6% (FIG. 19).

In this manner, it is confirmed that the reflection may be suppressed by optimizing the height H for each of the R pixel, the G pixel, and the B pixel.

Figure 20:
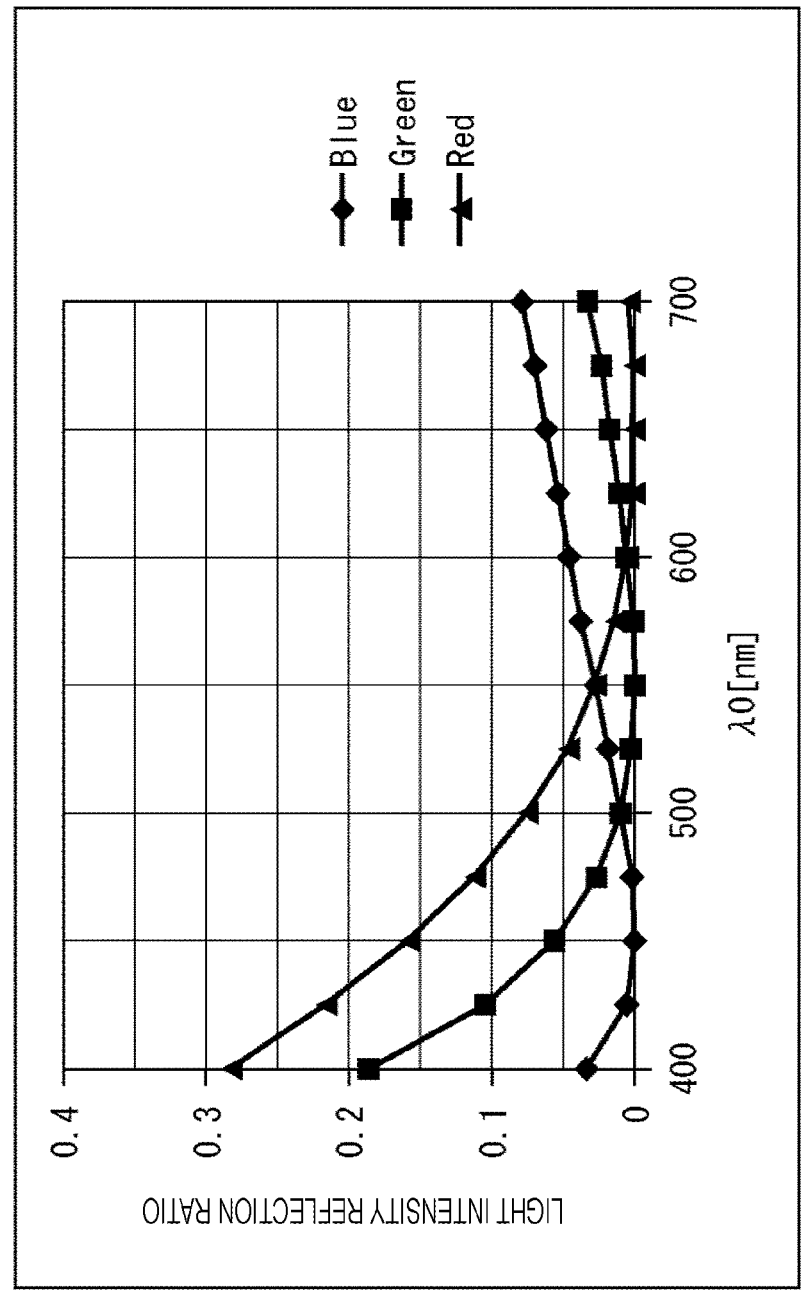
FIG. 20 is a view for illustrating a relationship between the wavelength and the light intensity reflection ratio.

The graph illustrated in FIG. 20 is a graph illustrating the reflection ratio when the space occupancy f and the height H are optimized for each of the R pixel, the G pixel, and the B pixel. The space occupancy f may be optimized by changing the hole size (the diameter D of the projected portion 37b).

The graph illustrated in FIG. 20 is a graph in a case where it is set that the optimum space occupancy f=0.360 and the optimum height H=40.5 nm for $\lambda 0$=450 nm in the B pixel, the optimum space occupancy f=0.384 and the optimum height H=53.8 nm for $\lambda 0$=550 nm in the G pixel, and the optimum space occupancy f=0.394 and the optimum height H=66.6 nm for $\lambda 0$=650 nm in the R pixel.

In FIG. 20, a line connecting lozenges (referred to as a graph B') represents the light intensity reflection ratio in the B pixel, a line connecting squares (referred to as a graph G') represents the light intensity reflection ratio in the G pixel, and a line connecting triangles (referred to as a graph R') represents the light intensity reflection ratio in the R pixel.

With reference to the graph with the unevenness illustrated in FIG. 18 and the graph B' illustrated in FIG. 20, it may be understood that, in a range of the effective wavelength region of the B pixel of 400 to 500 nm, the maximum reflection ratio decreases from 19% (FIG. 18) to 3.6% (FIG. 20).

Similarly, with reference to the graph with the unevenness illustrated in FIG. 18 and the graph G' illustrated in FIG. 20, it may be understood that, in a range of the effective wavelength region of the G pixel of 500 to 600 nm, the maximum reflection ratio is substantially the same and is 1.0%. Since the graph with unevenness illustrated in FIG. 18 is a result of measurement with pixels having a structure optimized for the vacuum wavelength of 550 nm in the effective wavelength region of the G pixel of 500 to 600 nm, the reflection ratio is substantially the same.

Similarly, with reference to the graph with the unevenness illustrated in FIG. 18 and the graph R' illustrated in FIG. 20, it may be understood that, in a range of the effective wavelength region of the R pixel of 600 to 700 nm, the maximum reflection ratio decreases from 3.4% (FIG. 18) to 0.6% (FIG. 20).

The graph in FIG. 19 is the result of optimizing the height H for each pixel, and the graph in FIG. 20 is the result of optimizing the height H and the space occupancy f for each pixel. The graph illustrated in FIG. 19 and the graph illustrated in FIG. 20 are substantially the same.

With this arrangement, it may be understood that the space occupancy f is not required to be optimized in each pixel because substantially the same result may be obtained in a case where the height H is optimized for each pixel and a case where the height H and the space occupancy f are optimized for each pixel.

That is, by optimizing the height H for each pixel, an effect on reflection prevention is obtained. Then, by optimizing the space occupancy f for each pixel also, it is possible to more certainly obtain the effect on reflection prevention. This is further described with reference to FIG. 21.

A following condition under which the lights cancel each other out by the interference is important for the height H at which the reflection is minimized on the upper surface of the intermediate layer. Therefore, it is considered to optimize the space occupancy f of each pixel so that the height H is common for each pixel and is close to equation (20) above.

Equation (20) expresses the height H at which the reflection is minimum on the upper surface of the intermediate layer as described above, and is an equation expressing the condition under which the lights cancel each other out due to the interference.

Figure 21:
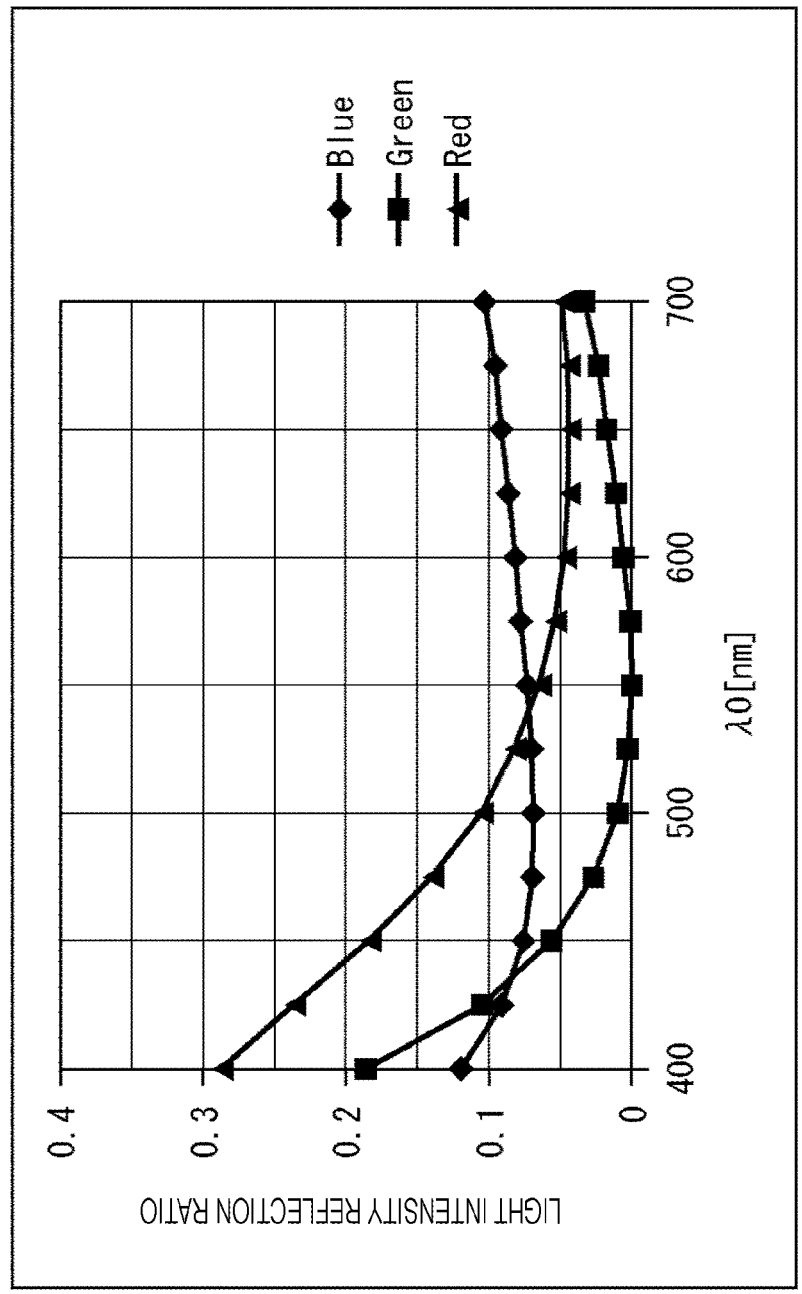
FIG. 21 is a view for illustrating a relationship between the wavelength and the light intensity reflection ratio.

A graph illustrated in FIG. 21 is a graph representing a result (reflection ratio) of the optimization of the space occupancy f so as to satisfy equation (20) while fixing the height H of the R pixel, the G pixel, and the B pixel at the height H optimized at $\lambda 0 = 550$ nm. Note that the effective refractive index neff included in equation (20) satisfies, for example, equation (4), and equation (4) includes the space occupancy f, so that it is required to set the space occupancy f so as to satisfy equation (4) in a case of setting the space occupancy f so as to satisfy equation (20).

The graph illustrated in FIG. 21 is a graph in a case where it is set that the optimum space occupancy f=0.680 for $\lambda 0 = 450$ nm in the B pixel, the optimum space occupancy f=0.380 for $\lambda 0 = 550$ nm in the G pixel, and the optimum space occupancy f=0.181 for $\lambda 0 = 650$ nm in the R pixel.

In FIG. 21, a line connecting lozenges (referred to as a graph B") represents the light intensity reflection ratio in the B pixel, a line connecting squares (referred to as a graph G") represents the light intensity reflection ratio in the G pixel, and a line connecting triangles (referred to as a graph R") represents the light intensity reflection ratio in the R pixel.

With reference to the graph with the unevenness illustrated in FIG. 18 and the graph B" illustrated in FIG. 21, it may be understood that, in a range of the effective wavelength region of the B pixel of 400 to 500 nm, the maximum reflection ratio is not sufficiently decreased.

Similarly, with reference to the graph with the unevenness illustrated in FIG. 18 and the graph G" illustrated in FIG. 21, it may be understood that, in a range of the effective wavelength region of the G pixel of 500 to 600 nm, the maximum reflection ratio is substantially the same and is 1.0%. Since the graph with unevenness illustrated in FIG. 18 is a result of measurement with pixels having a structure optimized for the vacuum wavelength of 550 nm in the effective wavelength region of the G pixel of 500 to 600 nm, the reflection ratio is substantially the same.

Similarly, with reference to the graph with the unevenness illustrated in FIG. 18 and the graph R" illustrated in FIG. 21, it may be understood that, in a range of the effective wavelength region of the R pixel of 600 to 700 nm, the maximum reflection ratio is not sufficiently decreased.

In other words, from the graph illustrated in FIG. 21, it may be understood that the antireflective effect is insufficient except for the G pixel despite the fact that the space occupancy f must be significantly changed for each of the R pixel, the G pixel, and the B pixel.

From above, it is understood that optimizing the height H of the uneven structure for each of the R pixel, G pixel, and B pixel is more effective from the viewpoint of reflection prevention. In the following description, optimization of the height H for each of the R pixel, G pixel, and B pixel is mainly described.

<Regarding First Manufacturing Method of Solid-State Imaging Device Having Uneven Structure>

Next, the manufacturing method of the solid-state imaging device 11 in which the Si substrate 38 with the refractive index n0, the intermediate second layer 36 with the refractive index n1, and the oxide film 35 with the refractive index n0 are stacked and the intermediate first layer 37 and the intermediate second layer 36 include the layer serving as the reflection ratio adjusting layer formed to have the fine uneven structure as illustrated in FIG. 2 is described.

Figure 22:
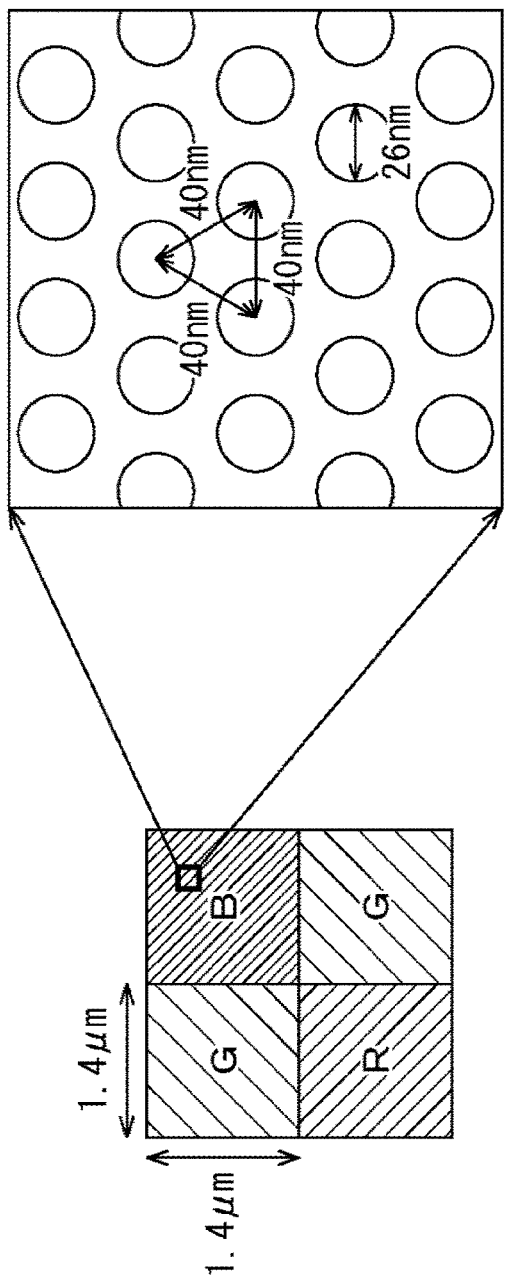
FIG. 22 is a view for illustrating a size of a pixel to be manufactured.

In the following description of the manufacture of the solid-state imaging device 11, a case of forming the pixel array unit of a Bayer array as illustrated in FIG. 22 is described as an example. In other words, a case of forming the pixel array unit in which the G pixels are arranged in upper left and lower right, the B pixel is arranged in upper right, and the R pixels is arranged in lower left when four pixels of two by two are set as one unit is described as an example.

Furthermore, a case where one pixel has a size of 1.4 µm by 1.4 µm is described as an example. Furthermore, a case where the pattern of the uneven structure has the pitch P of 40 nm and the diameter D of the hole size of 26 nm as illustrated in a right view in FIG. 22 is described as an example.

Note that the numerical values herein listed are only examples and are not limitative. In other words, the present technology may also be applied to pixels having a size other than the above-mentioned size. Furthermore, in the following description, similarly, the numerical values are only examples and are not limitative. Therefore, it is also possible to manufacture the solid-state imaging device 11 by applying the present technology and appropriately changing the numerical value.

Figure 23:
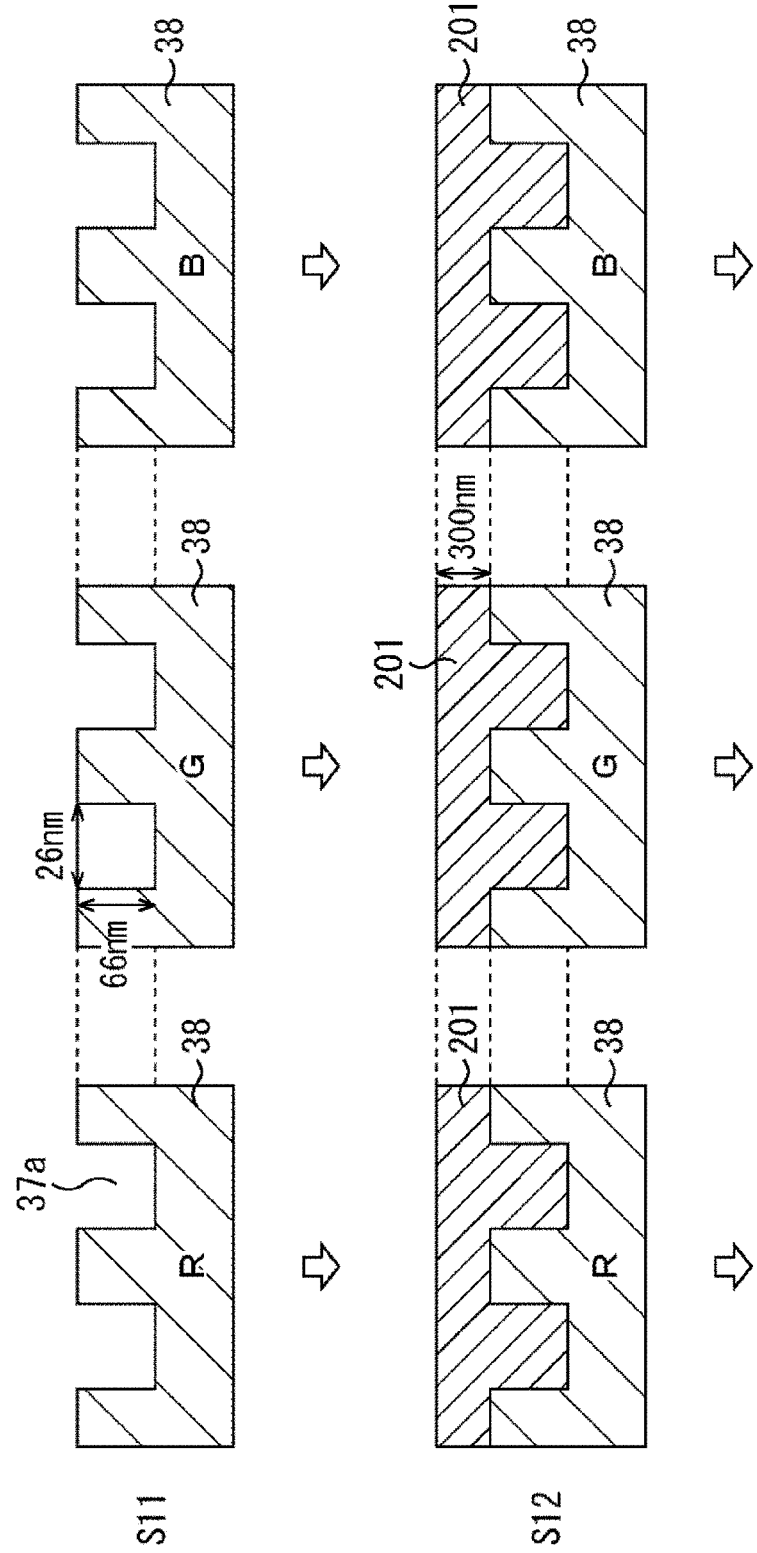
FIG. 23 is a view for illustrating a first manufacturing method.
Figure 24:
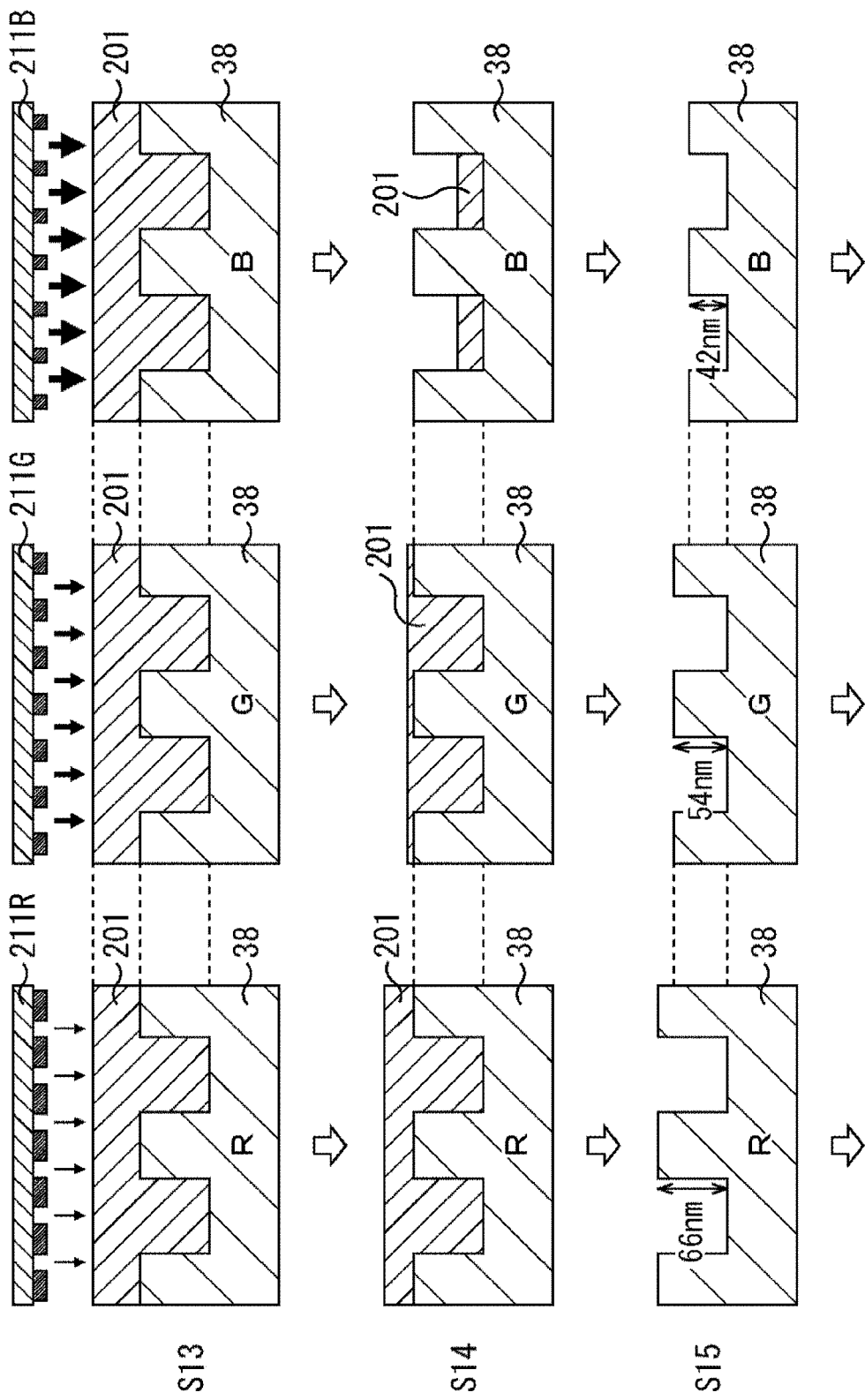
FIG. 24 is a view for illustrating a first manufacturing method.
Figure 25:
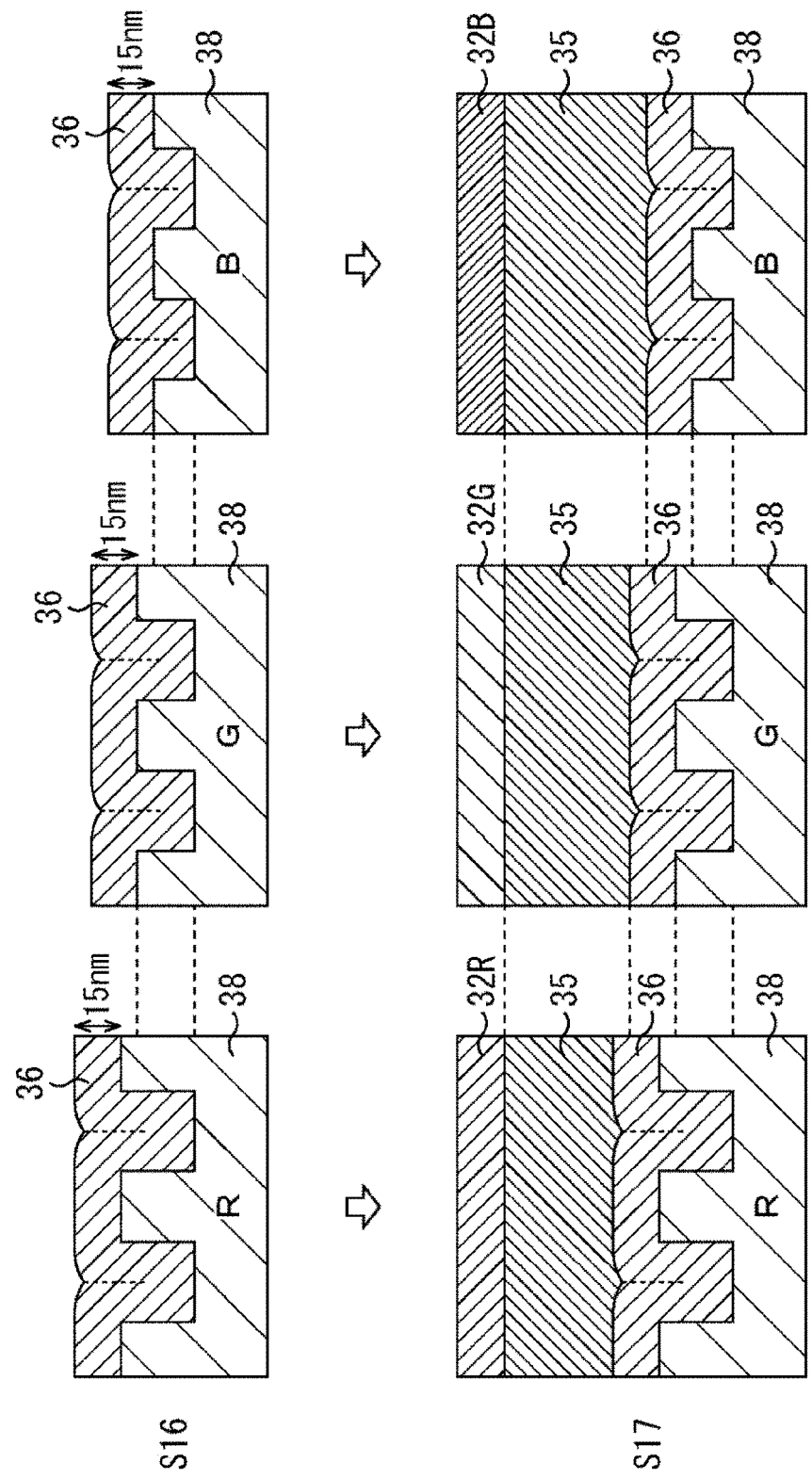
FIG. 25 is a view for illustrating a first manufacturing method.

With reference to FIGS. 23 to 25, a first manufacturing method of the solid-state imaging device 11 having the uneven structure is described. In the drawing, a left view illustrates the R pixel, a center view illustrates the G pixel, and a right view illustrates the B pixel.

At step S11 (FIG. 23), a substrate including a hole (recess portion) of a predetermined size is prepared. The substrate is a substrate which is already subjected to treatment described below.

First, when manufacturing a backside irradiation type imaging device, after a photodiode, a wiring layer and the like are formed, the substrate (Si substrate 38) reversed and joined to a support substrate. A surface of the substrate after the support substrate is joined is flat with Si. On the flat Si substrate 38, an SiO2 film is deposited to a thickness of 30 nm by chemical vapor deposition (CVD) or atomic layer deposition (ALD) technology.

Moreover, PS-r-PMMA (a ratio of the number of Monomers between PS and PMMA is 7:3, for example) being random copolymer is spin-coated thereon and baked to form a thickness of 8 nm. This adjusts to the surface energy suitable for the self assembly.

Moreover, PS-b-PMMA (a ratio of the number of monomers between PS and PMMA is 7:3, for example, and length of molecule is about 40 nm) being block copolymer is spin-coated thereon and baked to form a thickness of 25 nm. Thereafter, the substrate is baked in an N2 atmosphere at 250° C. for five minutes. As a result, not only solvent remaining on the PS-b-PMMA coated film is dried but also microphase separation may be promoted. As a result of the self assembly, a PMMA area becomes a periodic hole array.

Moreover, ultraviolet light (UV light) is applied to an upper portion of the PS-b-PMMA film in an N2 atmosphere. As a result, binding of PMMA is cut while PS is crosslinked. When the PS-b-PMMA film is developed with isopropyl alcohol (IPA), only PMMA dissolves, and the hexagonal lattice hole array at a pitch of 40 nm and with a diameter of 26 nm is formed on the entire surface of the substrate. Although the grain boundary is generated as described above, this is not problematic due to an averaging effect within the pixel.

Next, PS-r-PMMA and the SiO2 film are etched by a dry etching technology. Moreover, Si is etched by a dry etching technology. The SiO2 film is removed by wet etching or dry etching technology. As a result, the cylindrical hole serving as a source of the uneven structure is formed on the Si substrate 38.

By adjusting a condition of dry etching the SiO2 film and Si, it is possible to make the hole diameter (diameter) of the cylindrical hole in Si 26 nm. By forming in this manner, it is possible to form such that the space occupancy f of the cylindrical hole corresponds to 0.384. Also, the height (depth) of the cylindrical hole at this stage is 66 nm.

The Si substrate 38 subjected to the processes heretofore is prepared at step S11. As illustrated at step S11 in FIG. 23, in a cross section, a portion which becomes the recess portion 37a (which is not yet formed at a desired height H at this point of time) is formed on the Si substrate 38. Furthermore, the height H of the portion (cylinder) which becomes the recess portion 37a is 66 nm, and the diameter D of the hole is 26 nm.

At this stage at step S11, the sizes of the respective cylinders of the R pixel, G pixel, and B pixel are still the same. At a subsequent step, this is formed to have the height H optimized for each pixel.

Note that there may be a cylinder at a boundary of the R pixel, G pixel, or B pixel.

At step S12, positive type resist for i-line 201 is applied to an entire surface. The resist 201 is applied so that the hole being the cylinder is filled with the resist 201 and the height from the Si surface becomes 300 nm.

At step S13 (FIG. 24), an i-line exposure device is used to expose a gray tone mask 211 on the resist 201. The gray tone mask 211 is spread with a pattern of a fine pitch not larger than a diffraction limit. Furthermore, mask transmittance of the gray tone mask 211 is determined according to the aperture ratio.

An aperture ratio of a gray tone mask 211R on the R pixel area is set to be low so that the resist 201 on the upper portion of the Si substrate 38 thickly remains.

An aperture ratio of a gray tone mask 211G on the G pixel area is set to be medium so that the resist 201 on the upper portion of the Si substrate 38 thinly remains.

An aperture ratio of a gray tone mask 211B on the B pixel area is set to be high so that the resist 201 on the upper portion of the Si substrate 38 is removed and only the resist 201 on a bottom of the hole formed on the Si substrate 38 remains.

By changing the aperture ratio of the aperture of the gray tone mask 211 for each pixel in this manner, it is possible to adjust an amount (thickness) of the resist 201 remaining on the Si substrate 38.

When the resist 201 is developed after the exposure, as illustrated at step S14 (FIG. 24), the thickness of the resist 201 varies among the R pixel, the G pixel, and the B pixel.

At step S15, the entire surface of the Si substrate 38 is etched under a condition that both the Si substrate 38 and the resist 201 are etched. Since the thickness of the resist 201 varies among the R pixel, the G pixel, and the B pixel, when the etching is executed, etching on the Si substrate 38 starts from the B pixel.

As the etching of the upper portion of the Si substrate 38 of the B pixel progresses, the etching of the upper portion of the Si substrate 38 of the G pixel is also started. In other words, when the resist 201 on the upper portion of the Si substrate 38 of the G pixel is etched, Si on the upper portion of the Si substrate 38 of the G pixel is subsequently etched.

Moreover, while the B pixel and the G pixel are being etched in this manner, the R pixel is also etched. Since the R pixel is etched in a state where the resist 201 is thickly formed, the resist 201 is etched, but a portion of Si of the Si substrate 38 of the R pixel is not etched.

Furthermore, the bottom portion of the hole of each of the R pixel, the G pixel, and the B pixel is maintained in a state of being covered with the resist 201 even during etching, so that the bottom portion of the hole is remained without being etched until the end of etching.

By changing the thickness of the resist 201, it is possible to change an amount by which the Si substrate 38 of each of the R pixel, the G pixel, and the B pixel is etched. In this case, it is possible that the etching amount of the Si substrate 38 of the B pixel is large, the etching amount of the Si substrate 38 of the G pixel is medium, and the etching amount of the Si substrate 38 of the R pixel is small.

After such etching is performed, the remaining resist 201 is removed at step S15. The Si substrate 38 after the resist 201 is removed is as illustrated at step S15 in FIG. 24.

The height H (depth) of the hole formed in the Si substrate 38 corresponding to the R pixel is 66 nm. Furthermore, the height H (depth) of the hole formed in the Si substrate 38 corresponding to the G pixel is 54 nm. Furthermore, the height H (depth) of the hole formed in the Si substrate 38 corresponding to the B pixel is 42 nm.

The height H of the hole is a value set as described above. For example, this is the value set under any one of the conditions C-1 to C-3.

In this manner, a process condition is herein adjusted so that the height H of the R pixel is 66 nm, the height H of the G pixel is 54 nm, and the height H of the B pixel is 42 nm. At such step, the height of the hole of each pixel may be changed, and the condition at each step described above, for example, the size of the aperture of the gray tone mask 211, etching strength, time, and the like are adjusted such that the desired hole height is realized.

As step S16 (FIG. 25), Al2O3 is deposited on the Si substrate 38 by the ALD technology. Since the diameter D of the cylindrical hole is 26 nm, this is deposited until the hole is filled and the thickness on the Si substrate 38 becomes 15 nm. A state in which this is deposited in this manner is illustrated at step S16 in FIG. 25. The deposited Al2O3 forms the intermediate second layer 36 (FIG. 2).

Furthermore, at the steps so far, the fine uneven structure is formed on the Si substrate 38, and the intermediate first layer 37 and the intermediate second layer 36 are formed. Therefore, at the steps so far, since the intermediate first layer 37 and the intermediate second layer 36 are formed with the fine uneven structure, the layer serving as the reflection ratio adjusting layer is formed.

At step S17 (FIG. 25), the SiO2 film is deposited on the intermediate second layer 36 by the CVD technology, and the surface is planarized by the CMP technology. Then, the color filter 32 of the corresponding color is formed in each of the R pixel, the G pixel, and the B pixel. The SiO2 film deposited on the intermediate second layer 36 forms the oxide film 35.

As illustrated in FIG. 25, the height of the Si substrate 38 of the R pixel, the height of the Si substrate 38 of the G pixel, and the height of the Si substrate 38 of the B pixel are different from one another, so that the height of the intermediate second layer 36 deposited thereon so as to have the thickness of 15 nm is also different.

The oxide film 35 is deposited so as to absorb this height and planarize, and the color filter 32 is formed on the planarized oxide film 35.

Note that, as illustrated in FIG. 1, in a case of manufacturing the solid-state imaging device 11 having the light-shielding film 34, as a step between step S16 and step S17, the light-shielding film 34 is formed on the intermediate second layer 36. After the light-shielding film 34 is formed, the planarizing film 33 is formed in order to planarize, and thereafter the color filter 32 is formed.

In this manner, by manufacturing the solid-state imaging device 11 so that the height H of the hole of each of the R pixel, G pixel, and B pixel becomes the optimized height H, the manufactured solid-state imaging device 11 may be, for example, the solid-state imaging device 11 having the characteristic as illustrated in FIG. 19.

In other words, this may be made the solid-state imaging device 11 capable of significantly reducing the reflection light from the Si substrate 38 in all of the R pixel, the G pixel, and the B pixel. According to such solid-state imaging device 11, it is possible to prevent the stray light (ghost flare) from being reflected in the image taken by the solid-state imaging device 11 and to make the solid-state imaging device 11 capable of improving the image quality.

<Regarding Second Manufacturing Method of Solid-State Imaging Device Having Uneven Structure>

Figure 26:
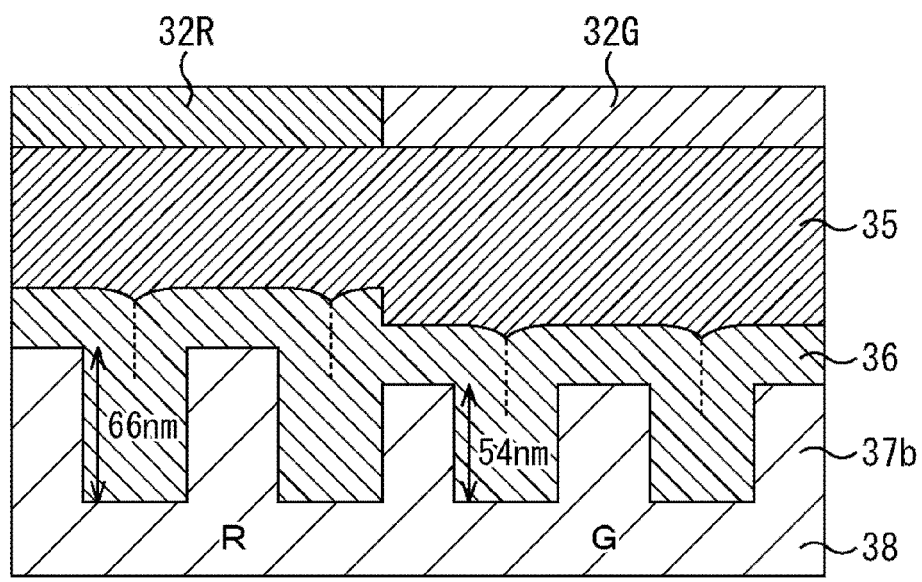
FIG. 26 is a view for illustrating a step present between pixels.

FIG. 26 illustrates the solid-state imaging device 11 manufactured by the first manufacturing method of the solid-state imaging device having the uneven structure described above. FIG. 26 illustrates the solid-state imaging device 11 of two adjacent pixels. Furthermore, in FIG. 26, the R pixel and G pixel are illustrated as the adjacent pixels.

The height of the hole of the R pixel (the height H of the projected portion 37b) is 66 nm, and the height of the hole of the G pixel (the height H of the projected portion 37b) is 54 nm. Here, in a case where a boundary between the R pixel and G pixel is focused on, the height of the Si substrate 38 drastically changes at the boundary (here, this changes from 66 nm to 54 nm).

That is, there is a step on the Si substrate 38 at the boundary between the R pixel and the G pixel. Furthermore, since there is the step on the Si substrate 38 also has the step, there also is a step on the intermediate second layer 36 deposited on the Si substrate 38.

Such step might cause irregular reflection of light at a corner of the step to cause stray light. Manufacture (referred to as a second manufacturing method) of the solid-state imaging device 11 in which the step on the Si substrate 38 at the boundary is reduced is described.

First, a structure of the solid-state imaging device 11 in which the step on the Si substrate 38 at the boundary is reduced is described with reference to FIG. 27. As in FIG. 26, FIG. 27 also illustrates the adjacent R pixel and G pixel (however, the color filter 32 and the like are not illustrated).

In FIG. 26, the pixel on the left side is the R pixel and the pixel on the right side is the G pixel. The height H of the projected portion 37b at the boundary between the R pixel and the G pixel is set to a height H3. The height of the projected portion 37b in a direction approaching from the boundary to the vicinity of the center of the R pixel (leftward direction in the drawing) changes to a height H2 and a height H1. Furthermore, the height of the projected portion 37b in a direction approaching from the boundary to the vicinity of the center of the G pixel (rightward direction in the drawing) changes to a height H4 and a height H5.

The heights E1 to H5 satisfy a following relationship.

Height $H1 >$ height $H2 >$ height $H3 >$ height $H4 >$ height $H5$

In a case where the height H1 on the R pixel side is set to 66 nm which is the optimum height in the R pixel and the height H5 on the G pixel side is set to 54 nm which is the optimum height in the G pixel, and in a case where the above-described relationship is satisfied, the height of the projected portion 37b gradually changes from 66 nm to 54 nm at the boundary between the pixels.

By configuring so that the height of the projected portion 37b gradually changes at the boundary between the pixels in this manner, it is possible to configure such that drastic change in height is prevented, and it becomes possible to prevent generation of the stray light due to the step at the boundary between the pixels.

In a case of manufacturing the solid-state imaging device 11 in which the height of the projected portion 37b gradually changes at the boundary between the pixels in this manner, it is possible to form the projected portion 37b such that the height of the projected portion 37b gradually changes by adjusting the aperture of the gray tone mask 211.

Figure 28:
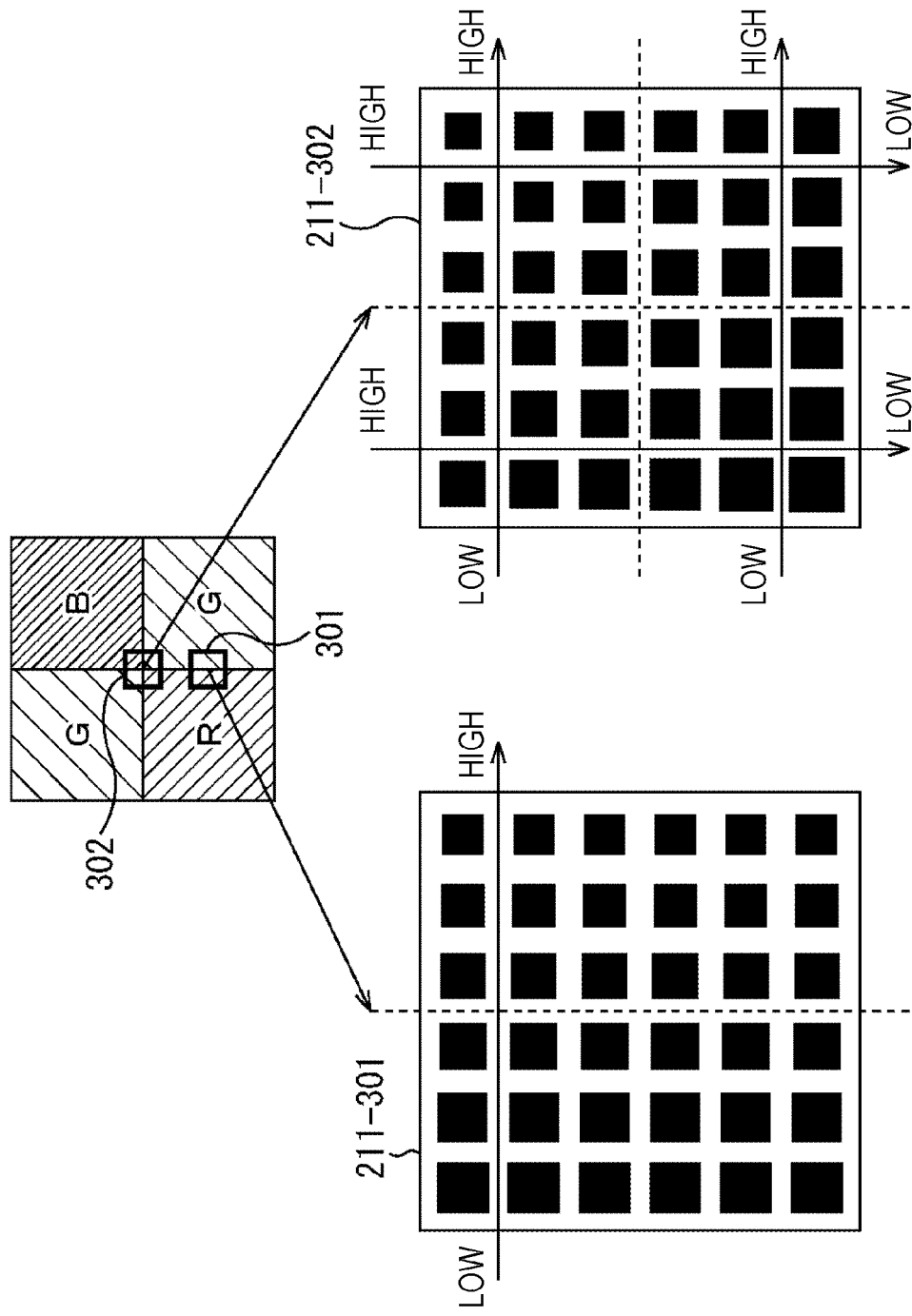
FIG. 28 is a view for illustrating an example of a gray tone mask.

For example, the gray tone mask 211 as illustrated in FIG. 28 is used. In an upper part in FIG. 28, a pixel group of one unit including four pixels of two by two is illustrated. An area straddling the boundary between the R pixel and the G pixel in this pixel group is set as an area 301. Furthermore, a central area of the pixel group is set as an area 302.

A gray tone mask 211-301 applied to the area 301 is illustrated in lower left in FIG. 28 and a gray tone mask 211-302 applied to the area 302 is illustrated in lower right in FIG. 28.

The gray tone mask 211 is a mask the mask transmittance of which may be determined in accordance with the aperture ratio, for example, as illustrated at step S13 in FIG. 24. For example, in a case where the aperture ratio is increased, the mask transmittance increases and the etching amount increases, and in a case where the aperture ratio is lowered, the mask transmittance decreases and the etching amount decreases.

Furthermore, as described with reference to steps S13 to S15 in FIG. 24, in a case where the aperture ratio of the gray tone mask 211 is increased, the height H of the projected portion 37b is lowered, and in a case where the aperture ratio of the gray tone mask 211 is decreased, the height H of the projected portion 37b is increased.

Therefore, for example, the aperture ratio of the gray tone mask 211 for forming the projected portion 37b of the height H1 (FIG. 27) (higher side projected portion 37b) may be made lower, and the aperture ratio of the gray tone mask 211 for forming the projected portion 37b of the height H5 (FIG. 27) (lower side projected portion 37b) may be made higher.

With reference to FIG. 28, the gray tone mask 211-301 is made the mask the aperture ratio of which gradually increases from a left side toward a right side (from the R pixel toward the G pixel).

The gray tone mask 211-302 is made the mask the aperture ratio of which gradually increases from the left side toward the right side (from the B pixel toward the G pixel)

on an upper side. Similarly, the gray tone mask 211-302 is made the mask the aperture ratio of which gradually increases from the left side toward the right side (from the R pixel toward the G pixel) on a lower side.

The gray tone mask 211-302 is made the mask the aperture ratio of which gradually decreases from the upper side toward the lower side (from the G pixel toward the R pixel) on the left side. Similarly, the gray tone mask 211-302 is made the mask the aperture ratio of which gradually decreases from the upper side toward the lower side (from the B pixel toward the G pixel) on the right side.

In this manner, in a separation area between the pixels, as illustrated in FIG. 28, the aperture ratio (pattern sizes of the aperture and the light-shielding portion) of the gray tone mask 211 is continuously changed. At the time of the continuous change, for example, a motion average of a light-shielding ratio is set as a size of a new light-shielding pattern around a target pattern.

Figure 27:
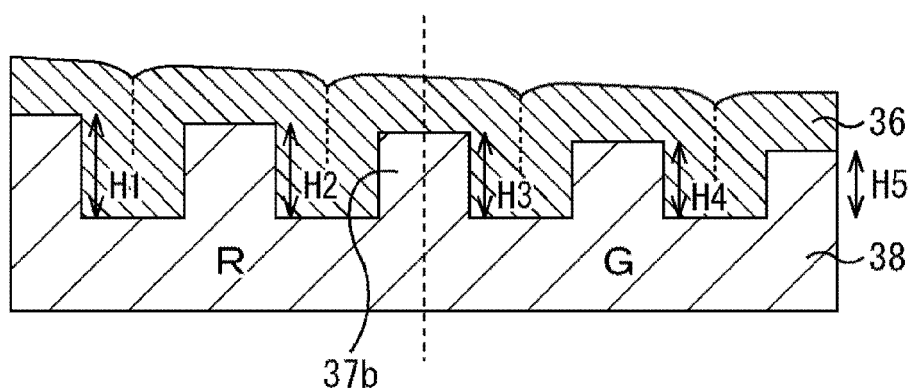
FIG. 27 is a view for illustrating a structure for reducing the step between the pixels.

The solid-state imaging device 11 may be obtained in which the height H of the cylindrical hole formed in the Si substrate 38 also changes continuously in an area in which the aperture of the gray tone mask 211 is continuously changed and the height is changed as illustrated in FIG. 27.

In this manner, it is possible to suppress formation of the step on the Si substrate 38 at the boundary between the pixels.

<Regarding Third Manufacturing Method of Solid-State Imaging Device Having Uneven Structure>

As described with reference to FIG. 26, in a case of manufacturing the solid-state imaging device 11 by applying the first manufacturing method, the solid-state imaging device 11 has a portion (step) in which the height of the Si substrate 38 drastically changes at the boundary between the pixels.

Such step might cause irregular reflection of light at a corner of the step to cause stray light. Manufacture (referred to as a third manufacturing method) of the solid-state imaging device 11 in which the step on the Si substrate 38 at the boundary is reduced is described.

First, a structure of the solid-state imaging device 11 in which the step on the Si substrate 38 at the boundary is reduced is described with reference to FIG. 29. As in FIG. 26, FIG. 29 also illustrates the adjacent R pixel and G pixel (however, the color filter 32 and the like are not illustrated).

Figure 29:
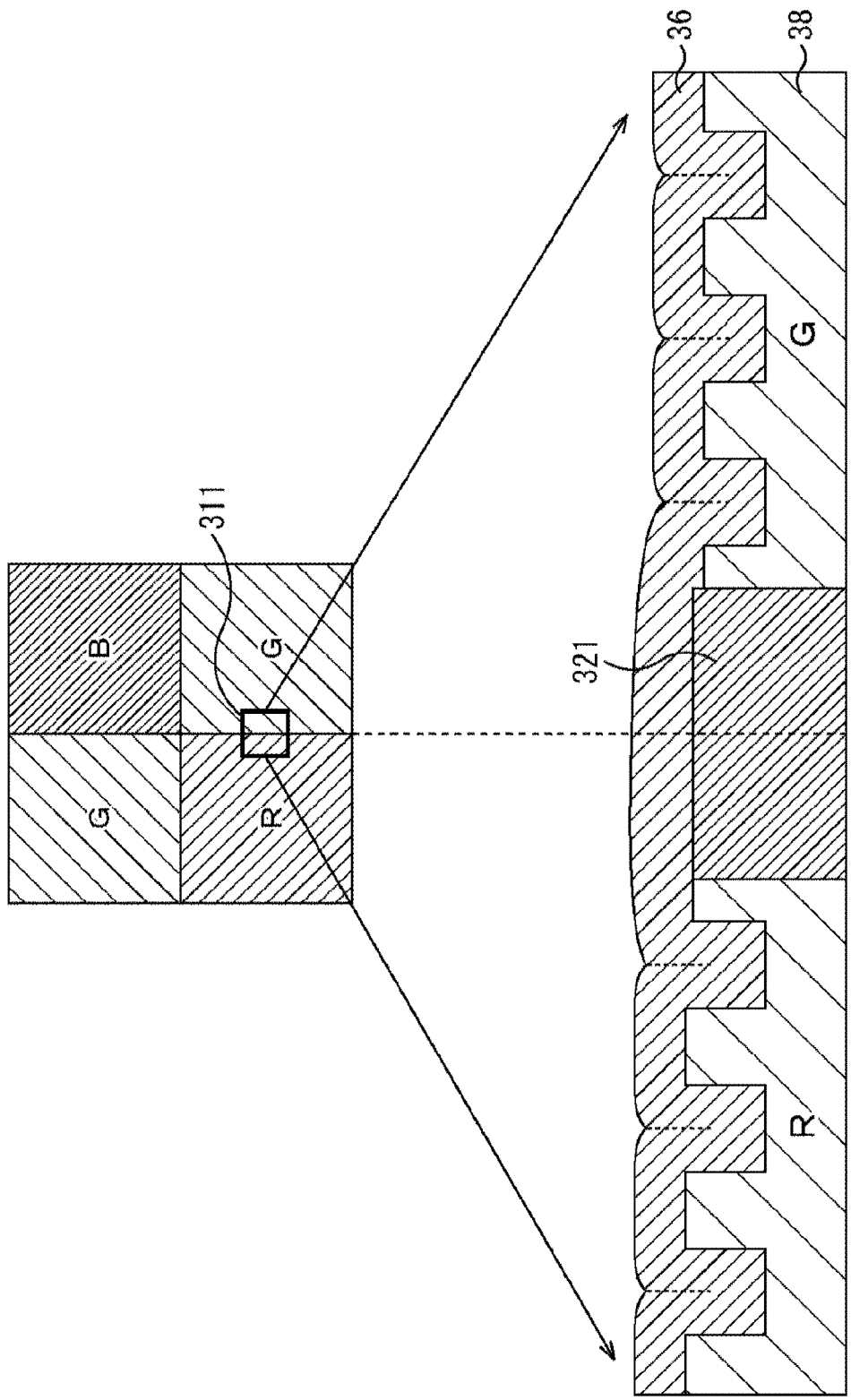
FIG. 29 is a view for illustrating a structure in which an inter-pixel light-shielding wall is provided.

In FIG. 29, the pixel on the left side is the R pixel and the pixel on the right side is the G pixel. In an upper part in FIG. 29, a pixel group of one unit including four pixels of two by two is illustrated. In the pixel group, an area which straddles a boundary between the R pixel and G pixel is defined as an area 311, and a structure of the pixels in this area 311 is illustrated in a lower view in FIG. 29.

As illustrated in the lower view in FIG. 29, a light-shielding wall 321 of, for example, SiO is formed at the boundary between the R pixel and the G pixel in the area 311. By forming the light-shielding wall 321, it is possible to prevent the height of the projected portion 37b from drastically changing at the boundary between the pixels. Therefore, it is possible to prevent the generation of the stray light caused by the step by eliminating the step.

Furthermore, by forming the light-shielding wall 321 between the pixels, it is possible to prevent color mixture due to oblique incident light. Therefore, the image quality may be improved.

Such light-shielding wall 321 is obtained such that, for example, after the circular hole (recess portion 37a) is formed in the Si substrate 38, the Si substrate 38 in the area 311 including the boundary between the pixels is etched, and the etched portion is filled with SiO.

Thereafter, SiO other than that between the pixels is removed. At such step, the light-shielding wall 321 is formed between the pixels. Then, by depositing Al2O3 forming the intermediate second layer 36 on the Si substrate 38 and the light-shielding wall 321, the solid-state imaging device 11 having the configuration illustrated in FIG. 29 is manufactured.

Note that, although SiO is herein described as an example as a material of the light-shielding wall 321, other material may also be used, and metal or the like may also be used, for example.

In this manner, it is possible to suppress formation of the step on the Si substrate 38 at the boundary between the pixels. Furthermore, since the formation of the step is suppressed, it is possible to reduce occurrence of adverse effects due to the step.

<Regarding Fourth Manufacturing Method of Solid-State Imaging Device Having Uneven Structure>

Another manufacturing method (fourth manufacturing method) of the solid-state imaging device 11 is described. In the following description of the fourth manufacturing method of the solid-state imaging device 11, a case of forming the pixel array unit of the Bayer array as illustrated in FIG. 22 is described as an example as in the first manufacturing method.

In other words, a case of forming the pixel array unit in which the G pixels are arranged in upper left and lower right, the B pixel is arranged in upper right, and the R pixels is arranged in lower left when four pixels of two by two are set as one unit is described as an example. Furthermore, a case where one pixel has a size of 1.4 µm by 1.4 µm is described as an example. Furthermore, a case where the pattern of the uneven structure has the pitch P of 40 nm and the diameter D of the hole size of 26 nm as illustrated in a right view in FIG. 22 is described as an example.

Note that the numerical values herein listed are only examples and are not limitative. In other words, the present technology may also be applied to pixels having a size other than the above-mentioned size. Furthermore, in the following description, similarly, the numerical values are only examples and are not limitative. Therefore, it is also possible to manufacture by changing the numerical values as appropriate.

Figure 30:
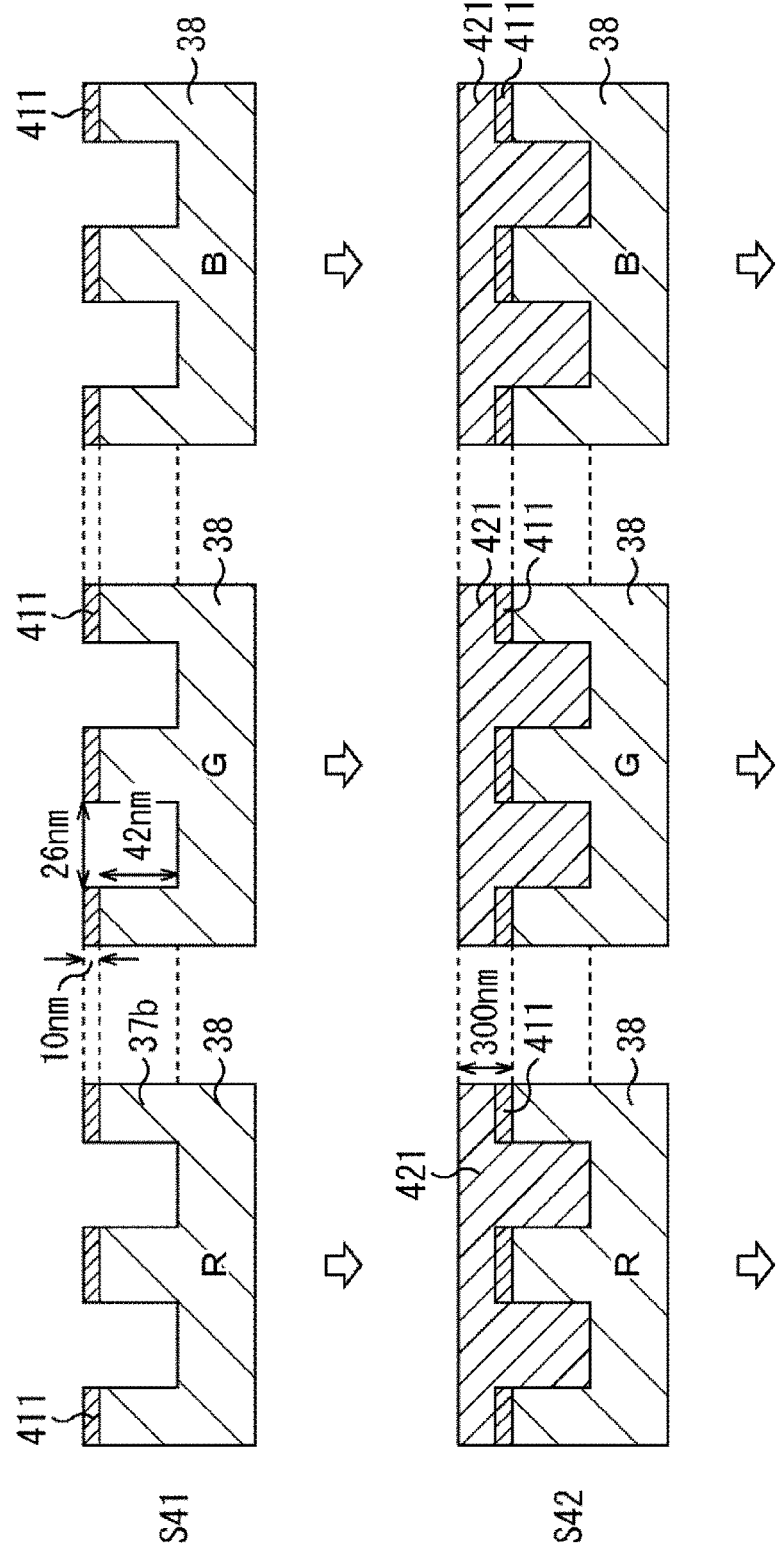
FIG. 30 is a view for illustrating a fourth manufacturing method.
Figure 31:
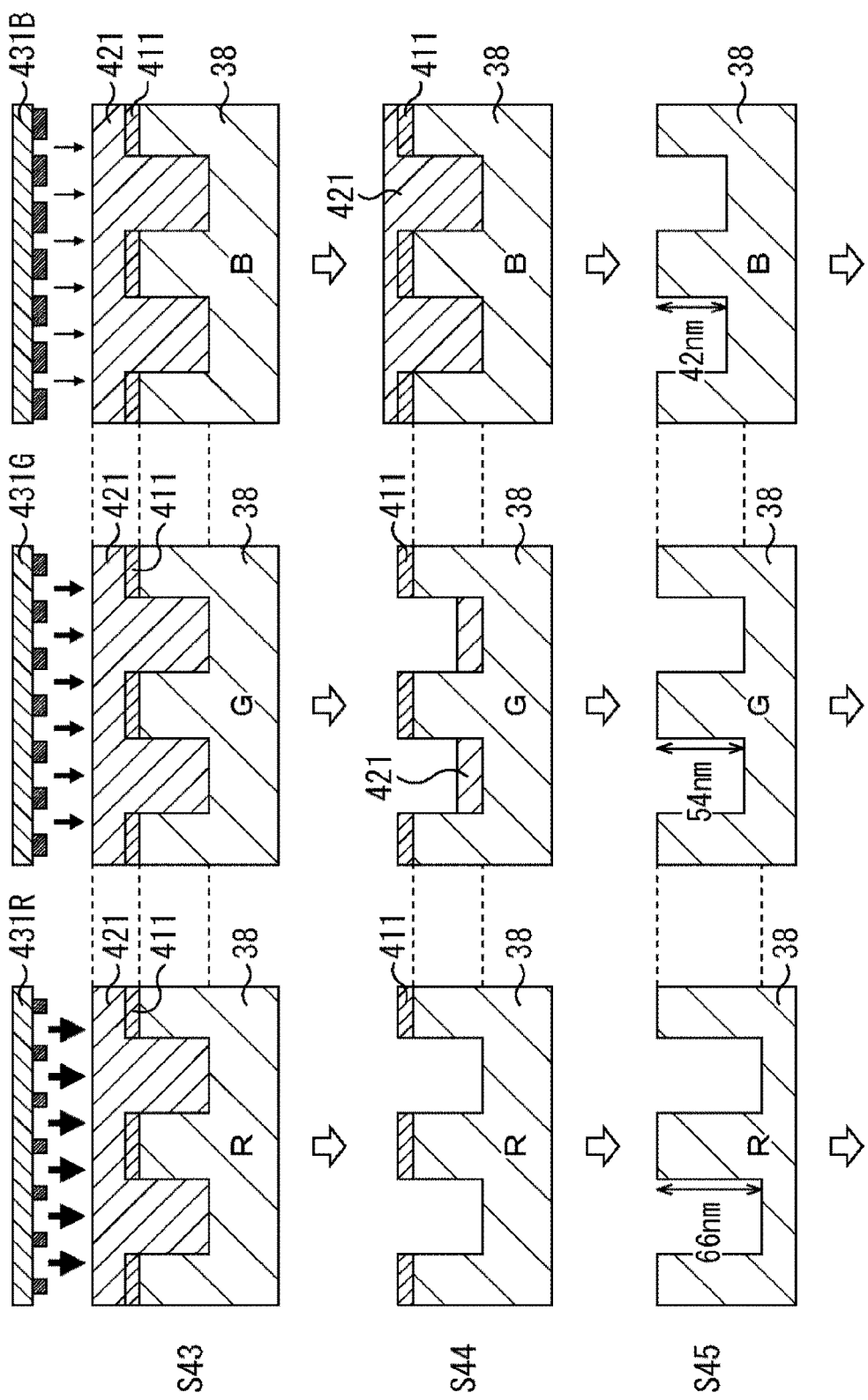
FIG. 31 is a view for illustrating the fourth manufacturing method.
Figure 32:
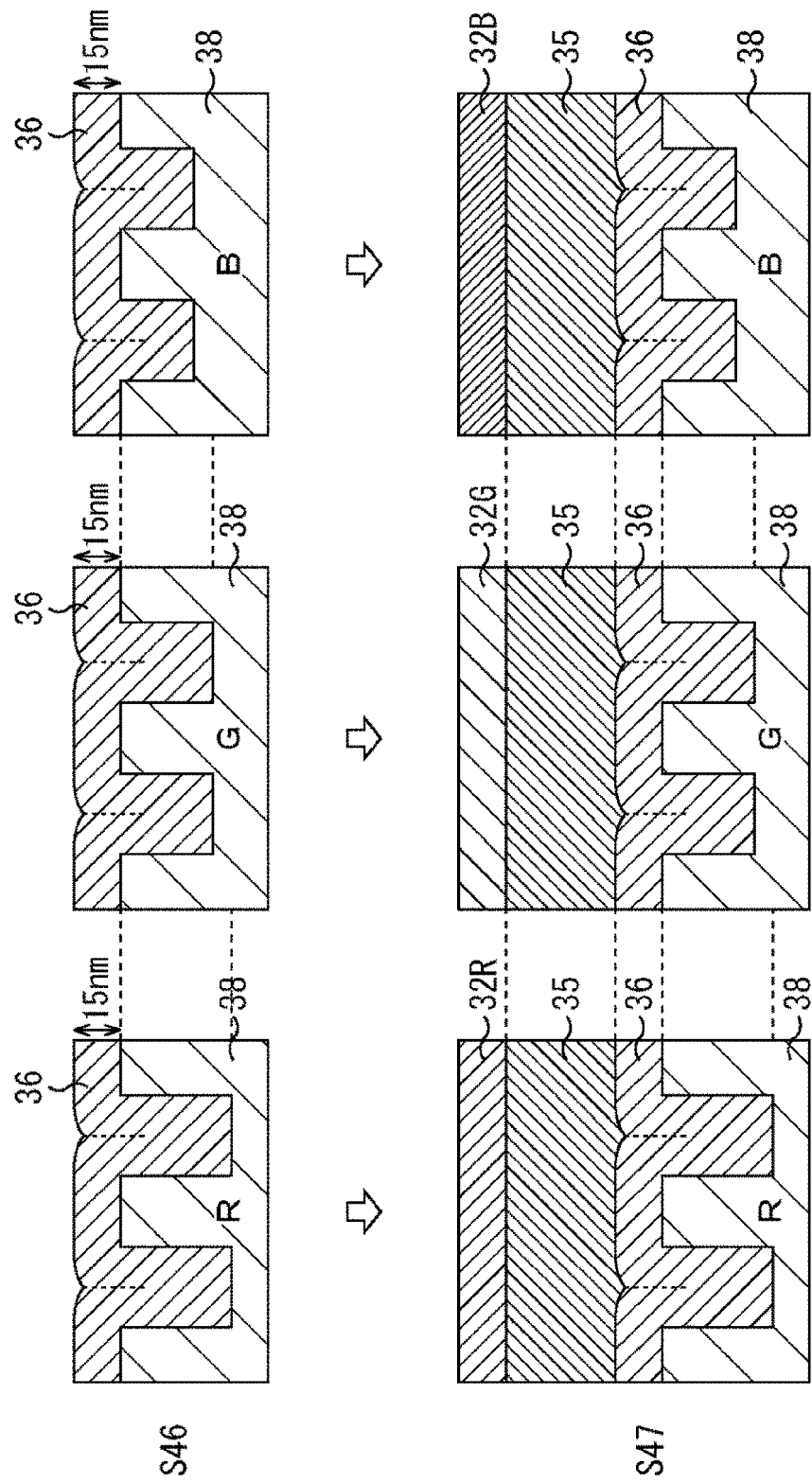
FIG. 32 is a view for illustrating the fourth manufacturing method.

With reference to FIGS. 30 to 32, the fourth manufacturing method of the solid-state imaging device having the uneven structure is described. In the drawing, a left view illustrates the R pixel, a center view illustrates the G pixel, and a right view illustrates the B pixel.

At step S41 (FIG. 30), a substrate including holes (recess portions) of a predetermined size is prepared. This substrate may be substantially the same substrate as that prepared at step S11 (FIG. 23) of the first manufacturing method except that a part of the SiO2 film remains on the Si substrate 38. Here, the manufacture of the substrate prepared at step S41 is described again.

First, when manufacturing a backside irradiation type imaging device, after a photodiode, a wiring layer and the like are formed, the substrate (Si substrate 38) is reversed and joined to a support substrate. A surface of the substrate after the support substrate is joined is flat with Si. On the flat Si substrate 38, an SiO2 film is deposited to a thickness of 30 nm by chemical vapor deposition (CVD) or atomic layer deposition (ALD) technology.

Moreover, PS-r-PMMA (a ratio of the number of monomers between PS and PMMA is 7:3, for example) being random copolymer is spin-coated thereon and baked to form a thickness of 8 nm. This adjusts to the surface energy suitable for the self assembly.

Moreover, PS-b-PMMA (a ratio of the number of monomers between PS and PMMA is 7:3, for example, and length of molecule is about 40 nm) being block copolymer is spin-coated thereon and baked to form a thickness of 25 nm. Thereafter, the substrate is baked in an N2 atmosphere at 250° C. for five minutes. As a result, not only solvent remaining on the PS-b-PMMA coated film is dried but also microphase separation may be promoted. As a result of the self assembly, a PMMA area becomes a periodic hole array.

Moreover, UV light is applied to an upper portion on the PS-b-PMMA film in an N2 atmosphere. As a result, binding of PMMA is cut while PS is crosslinked. When the PS-b-PMMA film is developed with isopropyl alcohol (IPA), only PMMA dissolves, and the hexagonal lattice hole array at a pitch of 40 nm and with a diameter of 26 nm is formed on the entire surface of the substrate. Although the grain boundary is generated as described above, this is not problematic due to an averaging effect within the pixel.

Next, PS-r-PMMA and the SiO2 film are etched by a dry etching technology. Moreover, Si is etched by a dry etching technology. At such a step, a cylindrical hole formed in the Si substrate 38. At that time, the SiO2 film is left by about 10 nm. In other words, as illustrated at step S41 in FIG. 30, a substrate on which an SiO2 film 411 with a thickness of 10 nm is formed in a portion of the projected portion 37b of the Si substrate 38 is manufactured.

By adjusting a condition of dry etching the SiO2 film and Si, it is possible to make the hole diameter (diameter) of the cylindrical hole in Si 26 nm. By forming in this manner, it is possible to form such that the space occupancy f of the cylindrical hole corresponds to 0.384. Also, the height (depth) of the cylindrical hole at this stage is set to 42 nm.

The Si substrate 38 subjected to the processes heretofore is prepared at step S41. As illustrated at step S41 in FIG. 30, in a cross section, a portion which becomes the recess portion 37a (which is not yet formed at a desired height H at this point of time) is formed in the Si substrate 38. Furthermore, the height H of the portion (cylinder) to be the recess portion 37a is 42 nm, and the diameter D of the hole is 26 nm.

At this stage at step S41, the sizes of the respective cylinders of the R pixel, G pixel, and B pixel are still the same. At a subsequent step, this is formed to have the height H optimized for each pixel.

Note that there may be a cylinder at a boundary of the R pixel, G pixel, or B pixel.

At step S42, positive type resist 421 for i-line is applied to the entire surface. The resist 421 is applied such that the cylinder hole is filled with the resist 421 and the height from the Si surface is 300 nm.

At step S43 (FIG. 31), the i-line exposure device is used to expose a gray tone mask 431 on the resist 421. The gray tone mask 431 is spread with a pattern of a fine pitch not larger than a diffraction limit. Furthermore, mask transmittance of the gray tone mask 431 is determined according to the aperture ratio.

An aperture ratio of a gray tone mask 431R on the R pixel area is set to be high so that the resist 421 is completely dissolved.

An aperture ratio of a gray tone mask 431G on the G pixel area is set to be medium so that resist 431G on the upper portion of the Si substrate 38 is removed and only the resist 431G on a bottom of the hole formed in the Si substrate 38 remains.

An aperture ratio of a gray tone mask 431B on the B pixel area is set to be low so that the resist 421 thickly remains also on the upper portion of the Si substrate 38.

By changing the aperture ratio of the aperture of the gray tone mask 431 for each pixel in this manner, it is possible to adjust an amount of the resist 421 remaining on the Si substrate 38. At this step, the Si substrate 38 is not etched, and only the resist 421 is etched.

When the resist 421 is developed after the exposure, as illustrated at step S44 (FIG. 31), the thickness of the resist 421 varies for each of the R pixel, the G pixel, and the B pixel.

At step S45, the entire surface of the substrate is etched under a condition that both the Si substrate 38 and the resist 421 are etched and the SiO2 film 411 is not etched. Since the thickness of the resist 421 varies among the R pixel, the G pixel, and the B pixel, when the etching is executed, the bottom portion of the cylindrical hole of the Si substrate 38 of the R pixel is first etched.

As the etching of the bottom portion of the cylindrical hole of the Si substrate 38 of the R pixel progresses, the etching of the cylindrical hole of the Si substrate 38 of the G pixel also progresses. In other words, while the Si substrate 38 of the bottom portion of the cylindrical hole of the Si substrate 38 of the R pixel is etched, the resist 421 of the bottom portion of the cylindrical hole of the Si substrate 38 of the G pixel is etched. Then, when the etching of the resist 421 in the bottom portion of the cylindrical hole of the Si substrate 38 of the G pixel is finished, the Si substrate 38 in the bottom portion of the cylindrical hole of the Si substrate 38 of the G pixel is also subsequently etched.

Moreover, while the R pixel and the G pixel are being etched in this manner, the B pixel is also etched. Since the etching of the B pixel is performed in a state where the resist 421 is thickly formed, the resist 421 etched and the resist 421 is removed, but the Si substrate 38 of the B pixel is not etched.

By changing the thickness of the resist 421, it is possible to change an amount by which the Si substrate 38 of each of the R pixel, the G pixel, and the B pixel is etched. In this case, it is possible that the etching amount of the Si substrate 38 of the R pixel is large, the etching amount of the Si substrate 38 of the G pixel is medium, and the etching amount of the Si substrate 38 of the B pixel is small (to be zero).

After such etching is performed, the remaining resist 421 and the SiO2 film 411 are removed at step S45. The Si substrate 38 after the resist 421 and the SiO2 film 411 are removed is as illustrated at step S45 in FIG. 31.

The height H (depth) of the hole formed in the Si substrate 38 corresponding to the R pixel is 66 nm. Furthermore, the height H (depth) of the hole formed in the Si substrate 38 corresponding to the G pixel is 54 nm. Furthermore, the height H (depth) of the hole formed in the Si substrate 38 corresponding to the B pixel is 42 nm.

The height H of the hole is a value set as described above. For example, this is the value set under any one of the conditions C-1 to C-3.

In this manner, a process condition is herein adjusted so that the height H of the R pixel is 66 nm, the height H of the G pixel is 54 nm, and the height H of the B pixel is 42 nm. At such step, the height of the hole of each pixel may be changed, and the condition at each step described above, for example, the size of the aperture of the gray tone mask 431, etching strength, time, and the like are adjusted such that the desired hole height is realized.

In a case where the cylindrical hole (uneven structure) is formed in the Si substrate 38 in this manner, as illustrated at step S45 in FIG. 31, the upper surface of the Si substrate 38 of the R pixel, the upper surface of the Si substrate 38 of the G pixel, and the upper surface of the Si substrate 38 of the B pixel are at the same height and there is no step between the pixels.

Unlike the solid-state imaging device 11 manufactured by the first manufacturing method, since there is no step at the boundary between the pixels, it is possible to suppress the generation of the stray light which might be generated due to the step.

As step S46 (FIG. 32), Al2O3 is deposited on the Si substrate 38 by the ALD technology. Since the diameter D of the cylindrical hole is 26 nm, Al2O3 is deposited until the hole is filled and the thickness on the Si substrate 38 becomes 15 nm. A state in which this is deposited in this manner is illustrated at step S46 in FIG. 32. The deposited Al2O3 forms the intermediate second layer 36 (FIG. 2).

At processes so far, the fine uneven structure is formed on the Si substrate 38, and the intermediate first layer 37 and the intermediate second layer 36 are formed. Therefore, at such processes, since the intermediate first layer 37 and the intermediate second layer 36 are formed with the fine uneven structure, the layer serving as the reflection ratio adjusting layer may be formed.

At step S47 (FIG. 32), the SiO2 film is deposited on the intermediate second layer 36 by the CVD technology, and the surface is planarized by the CMP technology. Then, the color filter 32 of the corresponding color is formed in each of the R pixel, the G pixel, and the B pixel. The SiO2 film deposited on the intermediate second layer 36 forms the oxide film 35.

Note that, as illustrated in FIG. 1, in a case of manufacturing the solid-state imaging device 11 including the light-shielding film 34, as a step between step S46 and step S47, the light-shielding film 34 is formed on the intermediate second layer 36. After the light-shielding film 34 is formed, the planarizing film 33 is formed in order to planarize, and thereafter the color filter 32 is formed.

In this manner, by manufacturing the solid-state imaging device 11 so that the height H of the hole of each of the R pixel, G pixel, and B pixel becomes the optimized height H, the manufactured solid-state imaging device 11 may be, for example, the solid-state imaging device 11 having the characteristic as illustrated in FIG. 19.

In other words, this may be made the solid-state imaging device 11 capable of significantly reducing the reflection light from the Si substrate 38 in all of the R pixel, the G pixel, and the B pixel. According to such solid-state imaging device 11, it is possible to prevent the stray light (ghost flare) from being reflected in the image taken by the solid-state imaging device 11 and to make the solid-state imaging device 11 capable of improving the image quality.

<Regarding Fifth Manufacturing Method of Solid-State Imaging Device Having Uneven Structure>

Another manufacturing method (fifth manufacturing method) of the solid-state imaging device 11 is described. In the following description of the fifth manufacturing method of the solid-state imaging device 11, a case of forming the pixel array unit of the Bayer array as illustrated in FIG. 22 is described as an example as in the first manufacturing method.

Figure 33:
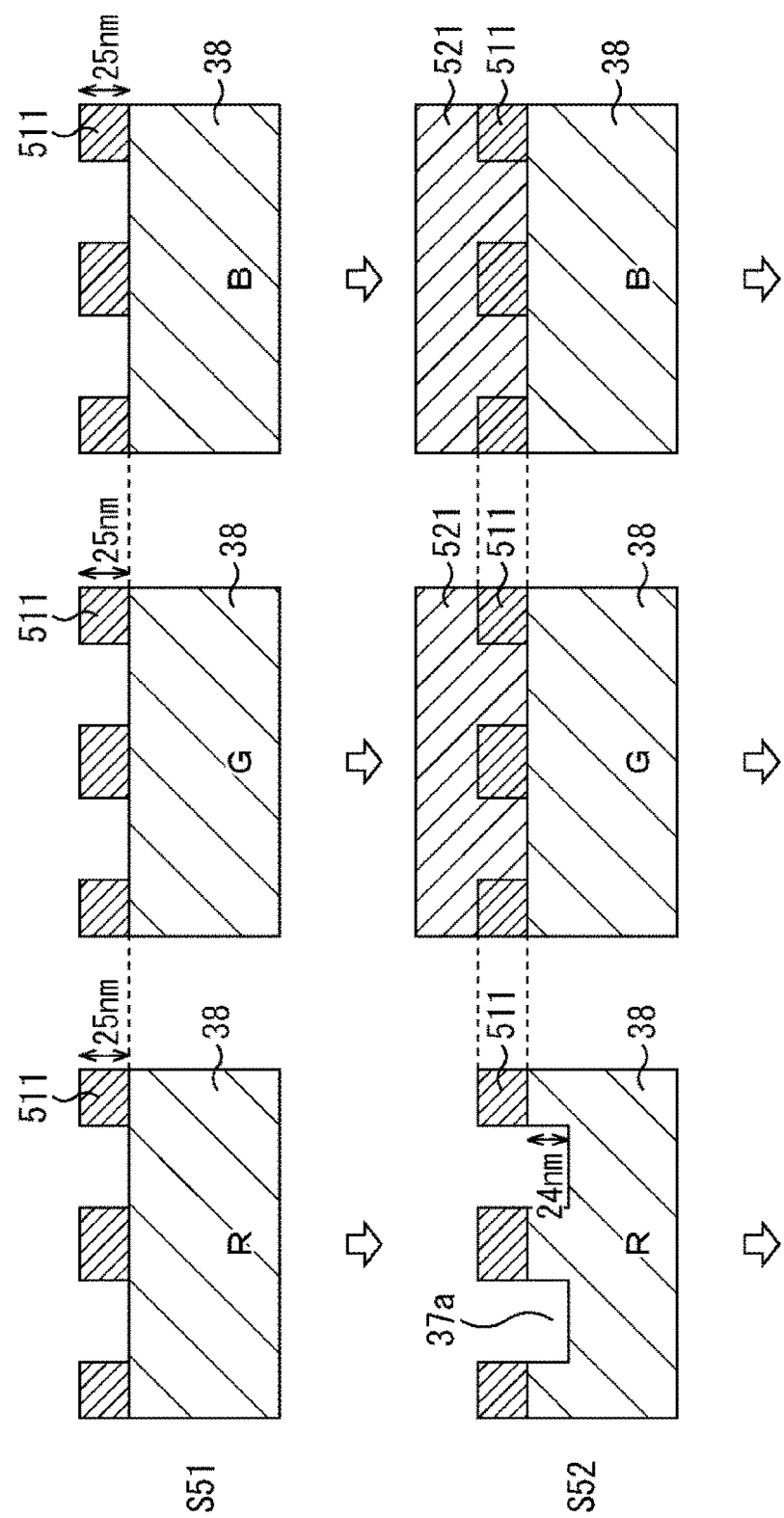
FIG. 33 is a view for illustrating a fifth manufacturing method.
Figure 34:
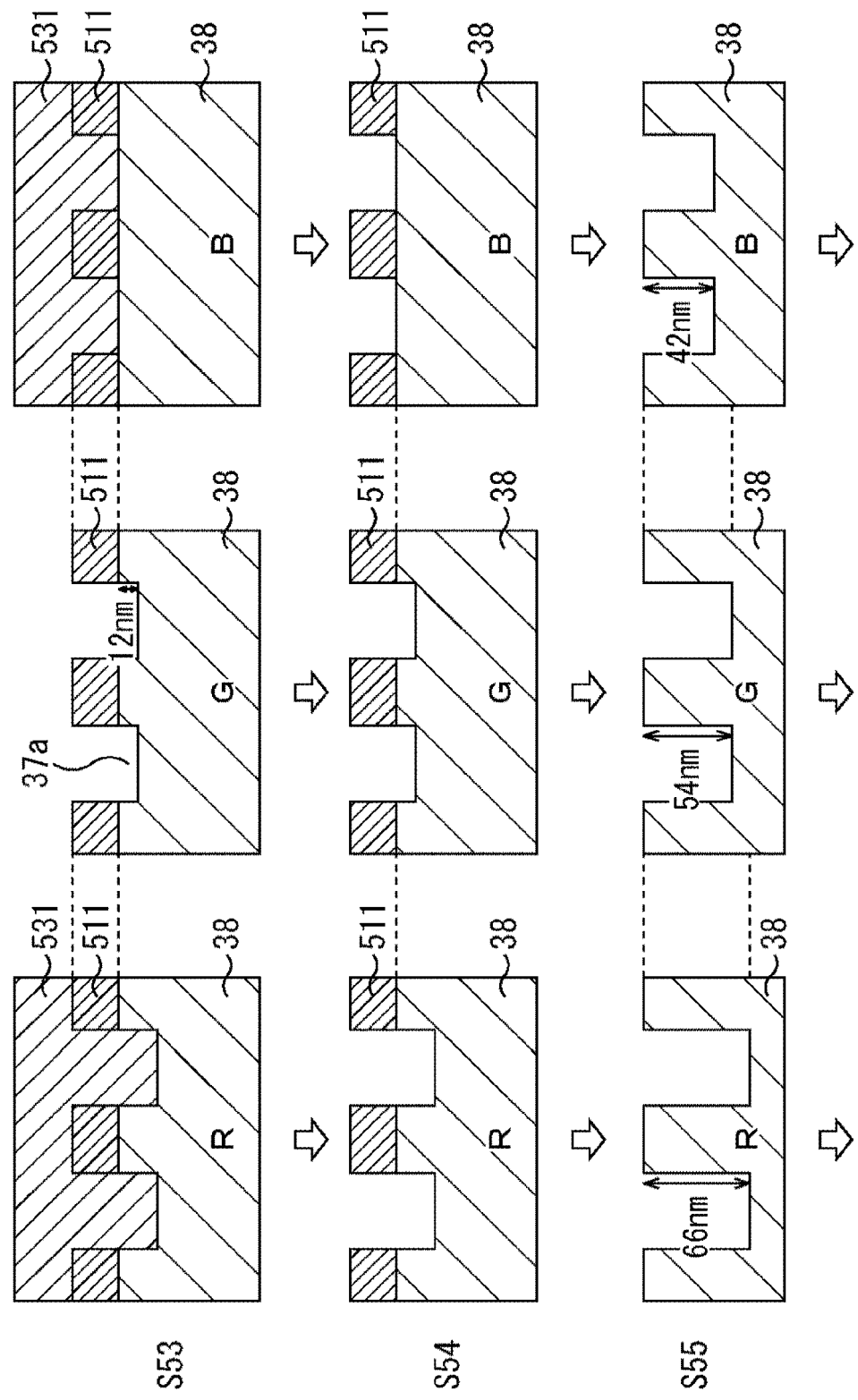
FIG. 34 is a view for illustrating the fifth manufacturing method.

With reference to FIGS. 33 to 34, the fifth manufacturing method of the solid-state imaging device having the uneven structure is described. In the drawing, a left view illustrates the R pixel, a center view illustrates the G pixel, and a right view illustrates the B pixel.

At step S51 (FIG. 33), a substrate including holes (recess portions) of a predetermined size in the SiO2 film is prepared. The manufacture of the substrate prepared at step S51 is described.

First, when manufacturing a backside irradiation type imaging device, after a photodiode, a wiring layer and the like are formed, the substrate (Si substrate 38) is reversed and joined to a support substrate. A surface of the substrate after the support substrate is joined is flat with Si. On the flat Si substrate 38, an SiO2 film 511 is deposited to a thickness of 30 nm by chemical vapor deposition (CVD) or atomic layer deposition (ALD) technology.

Moreover, PS-r-PMMA (a ratio of the number of monomers between PS and PMMA is 7:3, for example) being random copolymer is spin-coated thereon and baked to form a thickness of 8 nm. This adjusts to the surface energy suitable for the self assembly.

Moreover, PS-b-PMMA (a ratio of the number of monomers between PS and PMMA is 7:3, for example, and length of molecule is about 40 nm) being block copolymer is spin-coated thereon and baked to form a thickness of 25 nm. Thereafter, the substrate is baked in an N2 atmosphere at 250° C. for five minutes. As a result, not only solvent remaining on the PS-b-PMMA coated film is dried but also microphase separation may be promoted. As a result of the self assembly, a PMMA area becomes a periodic hole array.

Moreover, UV light is applied to an upper portion on the PS-b-PMMA film in an N2 atmosphere. As a result, binding of PMMA is cut while PS is crosslinked. When the PS-b-PMMA film is developed with isopropyl alcohol (IPA), only PMMA dissolves, and the hexagonal lattice hole array at a pitch of 40 nm and with a diameter of 26 nm is formed on the entire surface of the substrate. Although the grain boundary is generated as described above, this is not problematic due to an averaging effect within the pixel.

Next, PS-r-PMMA and the SiO2 film 511 are etched by a dry etching technology. Moreover, Si is etched by a dry etching technology. At such a step, a cylindrical hole is formed in the SiO2 film 511. Furthermore, the SiO2 film 511 is left by about 25 nm.

In other words, as illustrated at step S51 in FIG. 33, the SiO2 film 511 having a thickness of 25 nm is deposited on the Si substrate 38, and the cylindrical hole having a predetermined size is formed in the SiO2 film 511. A predetermined size of the cylindrical hole may be made the same as the size of the cylindrical hole which is wanted to be formed in the Si substrate 38, and may be, for example, 26 nm.

By adjusting a condition for dry etching the SiO2 film and Si, it is possible to make the hole diameter in the SiO2 film 511 26 nm. By forming in this manner, it is possible to form such that the space occupancy of the cylindrical hole corresponds to 0.384. Furthermore, the height (depth) of the cylinder is set to 25 nm (=thickness of the SiO2 film 511).

The Si substrate 38 subjected to the processes heretofore is prepared at step S51. As illustrated at step S51 in FIG. 33, in a cross section, a portion which becomes the recess portion 37a (projected portion 37b) is not yet formed in the Si substrate 38 and the surface thereof is flat. The SiO2 film 511 is deposited on the Si substrate 38 having the flat upper surface and a cylindrical hole is formed in the SiO2 film 511, the height of the cylindrical hole being 25 nm and the diameter of the hole being 26 nm.

Note that there may be a cylinder at a boundary of the R pixel, G pixel, or B pixel.

At step S52, positive type resist 521 for i-line is applied to the entire surface. The resist 521 is applied such that the cylinder hole is filled with the resist 521 and the height from the Si surface is 300 nm.

After the resist 521 is applied, exposure and development are performed so as to open only the area of the R pixel. Then, the etching is performed using the resist 521 and the SiO2 film 511 as a mask so that the depth of the recess portion 37a of the Si substrate 38 of the R pixel becomes 24 nm. A cross section at that time is illustrated at step S52 in FIG. 33.

At step S53 (FIG. 34), the G pixel is etched. This is performed by the process similar to the etching performed on the R pixel at step S52. In other words, positive type resist for i line 531 is first applied to the entire surface. The resist 531 is applied such that the cylinder hole is filled with the resist 521 and the height from the Si surface is 300 nm.

After the resist 531 is applied, exposure and development are performed so as to open only the area of G pixel. Then, the etching is performed using the resist 531 and the SiO2 film 511 as a mask so that the depth of the recess portion 37a of the Si substrate 38 of the G pixel becomes 12 nm. A cross section at that time is illustrated at step S53 in FIG. 34.

At steps heretofore, a cylindrical hole having a depth of 24 nm is formed in a portion corresponding to the R pixel of the Si substrate 38 and a cylindrical hole having a depth of 12 nm is formed in a portion corresponding to the G pixel of the Si substrate 38.

At step S54, etching on the B pixel and further etching on the R pixel and the G pixel are performed. At this step, a cylindrical hole having a desired height is formed in each of the R pixel, the G pixel, and the B pixel.

That is, at step S54, using the SiO2 film 511 as a mask, etching to the depth of 42 nm is executed on the entire surface of the Si substrate 38. After the etching, the SiO2 film 511 is removed. A cross section at that time is illustrated at step S55 in FIG. 34.

Finally, the height H (depth) of the hole formed in the Si substrate 38 corresponding to the R pixel is 66 nm as illustrated at step S55 in FIG. 34. Furthermore, the height H (depth) of the hole formed in the Si substrate 38 corresponding to the G pixel is 54 nm. Furthermore, the height H (depth) of the hole formed in the Si substrate 38 corresponding to the B pixel is 42 nm.

The height H of the hole is a value set as described above. For example, this is the value set under any one of the conditions C-1 to C-3.

In this manner, a process condition is herein adjusted so that the height H of the R pixel is 66 nm, the height H of the G pixel is 54 nm, and the height H of the B pixel is 42 nm. At such step, the height of the hole of each pixel may be changed, and the condition at each step described above, for example, the etching strength, time and the like are adjusted such that the desired hole height is realized.

In a case where the cylindrical hole (uneven structure) is formed in the Si substrate 38 in this manner, as illustrated at step S55 in FIG. 34, the upper surface of the Si substrate 38 of the R pixel, the upper surface of the Si substrate 38 of the G pixel, and the upper surface of the Si substrate 38 of the B pixel are at the same height and there is no step between the pixels.

Unlike the solid-state imaging device 11 manufactured by the first manufacturing method, since there is no step at the boundary between the pixels, it is possible to suppress the generation of the stray light which might be generated due to the step.

Furthermore, in order to prevent double etching at the boundary between the pixels, in the exposure of the aperture of the pixel part, an area of the aperture is reduced from the pixel size by an expected overlay error. As a result, it is considered that there may be no significant effect even if the hole depth in the boundary area between the pixels becomes 42 nm.

In this manner, the process on the Si substrate 38 in which the cylindrical hole in which the height H of the R pixel is 66 nm, the height H of the G pixel is 54 nm, and the height H of the B pixel is 42 nm is formed may be performed as that in the fourth manufacturing method, in other words, as in the case described with reference to FIG. 32, so that the description thereof is herein omitted.

Note that, as illustrated in FIG. 1, in a case of manufacturing the solid-state imaging device 11 including the light-shielding film 34, after the light-shielding film 34 is formed on the intermediate second layer 36, the planarizing film 33 is formed so as to planarize, and thereafter the color filter 32 is formed.

Note that, here, a case where a process of first forming a cylindrical hole of 24 nm for the R pixel, then forming a cylindrical hole of 12 nm for the G pixel, and finally forming a cylindrical hole of 42 nm for the R pixel, the G pixel, and the B pixel is executed is described as an example.

That is, after the etching of 24 nm is performed on the R pixel, the etching of 42 nm is performed thereon, so that the etching of 64 nm is finally performed. Furthermore, after the etching of 12 nm is performed on the G pixel, the etching of 42 nm is performed thereon, so that the etching of 54 nm is finally performed. Furthermore, the etching of 42 nm is performed on the B pixel, and the etching of 42 nm is finally performed.

The order is not limited thereto, and the cylindrical hole having a desired height may be finally formed in another order.

For example, it is also possible that a process of first forming a cylindrical hole of 42 nm for the B pixel, then forming a cylindrical hole of 12 nm for the R pixel and G pixel, and finally forming a cylindrical hole of 12 nm for the R pixel is executed.

That is, after the etching of 42 nm is performed on the R pixel, the etching of 12 nm is performed thereon, and etching of 12 nm is further performed thereon, so that the etching of 64 nm is finally performed. Furthermore, after the etching of 42 nm is performed on the G pixel, the etching of 12 nm is performed thereon, so that the etching of 54 nm is finally performed. Furthermore, the etching of 42 nm is performed on the B pixel, and the etching of 42 nm is finally performed. The etching may also be performed in this order.

In this manner, by manufacturing the solid-state imaging device 11 so that the height H of the hole of each of the R pixel, G pixel, and B pixel becomes the optimized height H, the manufactured solid-state imaging device 11 may be, for example, the solid-state imaging device 11 having the characteristic as illustrated in FIG. 19.

In other words, this may be made the solid-state imaging device 11 capable of significantly reducing the reflection light from the Si substrate 38 in all of the R pixel, the G pixel, and the B pixel. According to such solid-state imaging device 11, it is possible to prevent the stray light (ghost flare) from being reflected in the image taken by the solid-state imaging device 11 and to make the solid-state imaging device 11 capable of improving the image quality.

<Regarding Sixth Manufacturing Method of Solid-State Imaging Device Having Uneven Structure>

Another manufacturing method (referred to as sixth manufacturing method) of the solid-state imaging device 11 is described. The sixth manufacturing method is basically the same as the fifth manufacturing method except that the number of steps is reduced. The sixth manufacturing method is described with reference to FIGS. 35 and 36.

At step S61 (FIG. 35), a substrate subjected to a predetermined process is prepared. The prepared substrate is the same as the substrate prepared at step S51 (FIG. 33) of the fifth manufacturing method. In other words, the substrate obtained by depositing the SiO2 film 511 on the Si substrate 38 to a thickness of 25 nm, and forming a cylindrical hole having a diameter of 26 nm.

At step S62, positive type resist 611 for i-line is applied to the entire surface. The resist 611 is applied such that the cylinder hole is filled with the resist 611 and the height from the Si surface is 300 nm.

After the resist 611 is applied, exposure and development are performed so as to open only the area of the R pixel and G pixel. Then, the etching is performed using the resist 611 and the SiO2 film 511 as a mask so that the depth of the recess portion 37*a* of the Si substrate 38 of the R pixel and G pixel becomes 12 nm. A cross section at that time is illustrated at step S62 in FIG. 35.

At step S63, etching on the B pixel and further etching on the R pixel and the G pixel are performed. At this step, a cylindrical hole having a desired height is formed in each of the R pixel, the G pixel, and the B pixel.

In other words, at step 363, using the SiO2 film 511 as a mask, etching to the depth of 42 nm is performed on the entire surface of the Si substrate 38. After the etching, the SiO2 film 511 is removed. A cross section at that time is illustrated at step S64 in FIG. 36.

Figure 36:
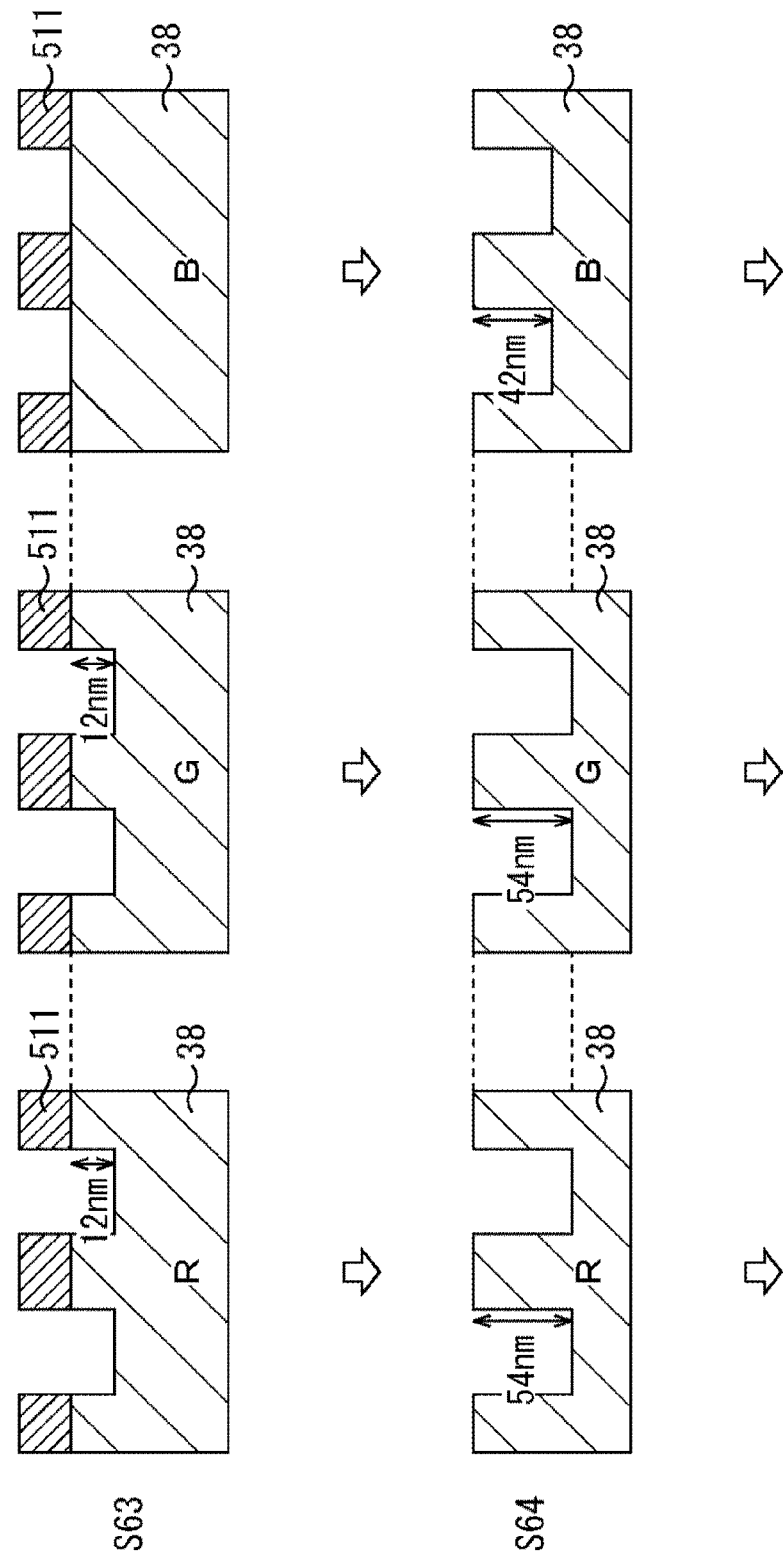
FIG. 36 is a view for illustrating the sixth manufacturing method.

Finally, the height H (depth) of the hole formed in the Si substrate 38 corresponding to the R pixel is made 54 nm as illustrated at step S64 in FIG. 36. Furthermore, the height H (depth) of the hole formed in the Si substrate 38 corresponding to the G pixel is 54 nm. Furthermore, the height H (depth) of the hole formed in the Si substrate 38 corresponding to the B pixel is 42 nm.

In a case where the cylindrical hole (uneven structure) is formed in the Si substrate 38 in this manner, as illustrated at step S64 in FIG. 36, the upper surface of the Si substrate 38 of the R pixel, the upper surface of the Si substrate 38 of the G pixel, and the tipper surface of the Si substrate 38 of the B pixel are at the same height and there is no step between the pixels.

Unlike the solid-state imaging device 11 manufactured by the first manufacturing method, since there is no step at the boundary between the pixels, it is possible to suppress the generation of the stray light which might be generated due to the step.

In this manner, the process on the Si substrate 38 in which the cylindrical hole in which the heights of the R pixel H is 54 nm, the height of the G pixel H is 54 nm, and the height of the B pixel H is 42 nm is formed may be performed as that in the fourth manufacturing method, in other words, as in the case described with reference to FIG. 32, so that the description thereof is herein omitted.

Note that, as illustrated in FIG. 1, in a case of manufacturing the solid-state imaging device 11 including the light-shielding film 34, after the light-shielding film 34 is formed on the intermediate second layer 36, the planarizing film 33 is formed so as to planarize, and thereafter the color filter 32 is formed.

According to the sixth manufacturing method, compared with the fifth manufacturing method, the number of steps, specifically, the number of times of etching and exposure may be reduced. Therefore, it is possible to obtain an effect that the steps at the time of manufacturing are simplified, and the cost required at the time of manufacturing is reduced.

However, as described above, the cylindrical hole which the height H of the R pixel is 54 nm, the height H of the G pixel is 54 nm, and the height H of the B pixel is 42 nm is formed. In other words, the height of the R pixel and the height of the G pixel are the same, and the height of the R pixel is not optimized.

Figure 37:
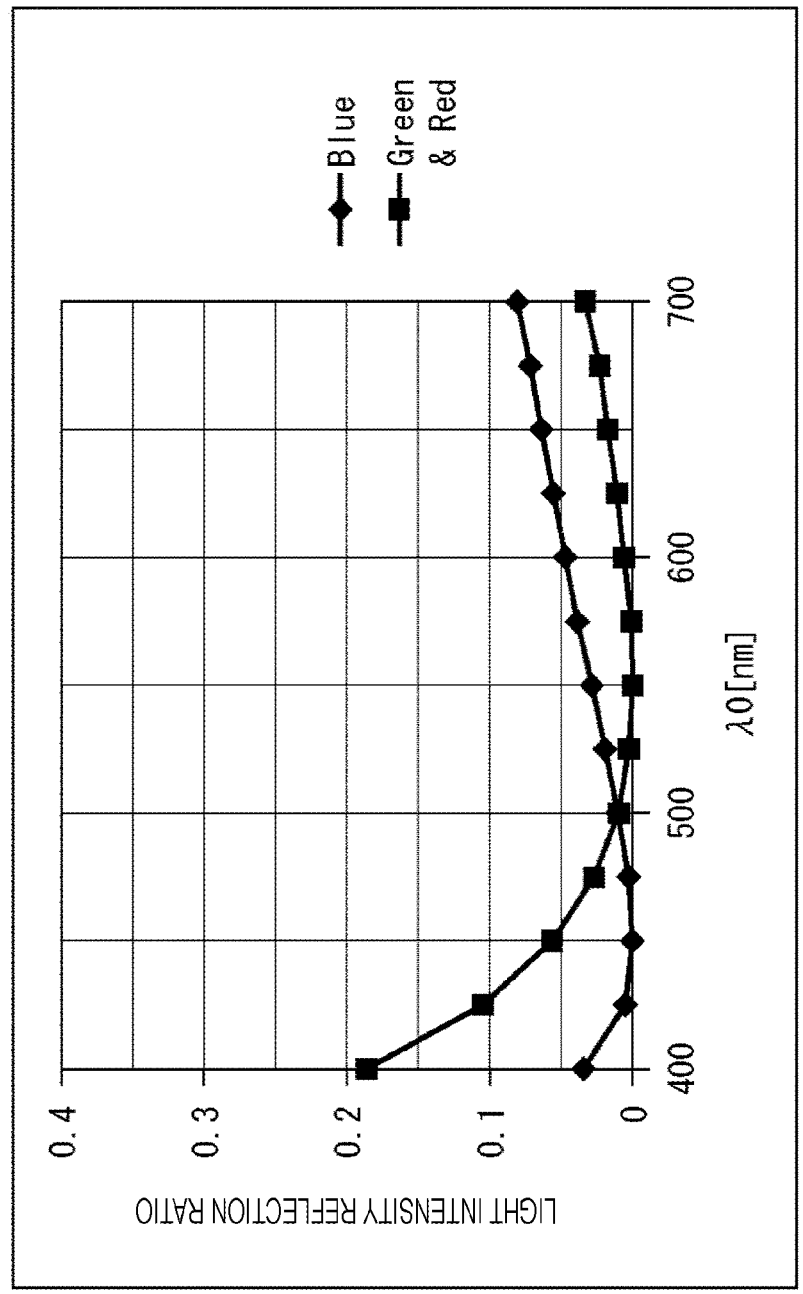
FIG. 37 is a view for illustrating a relationship between the wavelength and the light intensity reflection ratio.

FIG. 37 illustrates the reflection ratio on the upper surface of the uneven structure in the solid-state imaging device 11 having such a structure. The wavelength is plotted along the abscissa of the graph illustrated in FIG. 37 and the light intensity reflection ratio is plotted along the ordinate. Furthermore, in FIG. 37, a line connecting lozenges (referred to as a graph BB) represents the light intensity reflection ratio in the B pixel, and a line connecting squares (referred to as a graph GR) represents the light intensity reflection ratio in the G pixel and R pixel.

With reference to the graph with the unevenness illustrated in FIG. 18 and the graph BB illustrated in FIG. 37, it may be understood that, in a range of the effective wavelength region of the B pixel of 400 to 500 nm, the maximum reflection ratio decreases from 19% (FIG. 18) to 3.7% (FIG. 37).

Similarly, with reference to the graph with the unevenness illustrated in FIG. 18 and the graph GR illustrated in FIG. 37, it may be understood that, in a range of the effective wavelength region of the G pixel of 500 to 600 nm, the maximum reflection ratio is substantially the same and is 1.0%.

Similarly, with reference to the graph with the unevenness illustrated in FIG. 18 and the graph GR illustrated in FIG. 19, it may be understood that, in a range of the effective wavelength region of the R pixel of 600 to 700 nm, the maximum reflection ratio is substantially the same and is 3.4% (FIG. 18).

For the R pixel, the hole height (depth) is not optimized, but the reflection ratio is as low as 3.4%, so that even in a case of manufacturing the solid-state imaging device 11 by the sixth manufacturing method, it is possible to obtain the solid-state imaging device 11 capable of reducing the reflection light from the Si substrate 38. According to such solid-state imaging device 11, it is possible to prevent the stray light (ghost flare) from being reflected in the image taken by the solid-state imaging device 11 and to make the solid-state imaging device 11 capable of improving the image quality.

Note that, although the example in which the height optimized for the G pixel is also applied to the R pixel is herein described, the height (depth) of the hole of the R pixel and the G pixel may be optimized to such a height that the maximum reflection ratios of the R pixel and the G pixel are low to the same degree.

Furthermore, although a case where the heights of the holes of the R pixel and the G pixel are the same is herein described as an example, it is also possible to manufacture the solid-state imaging device 11 so that the heights of the holes of the G pixel and the B pixel are the same.

Figure 35:
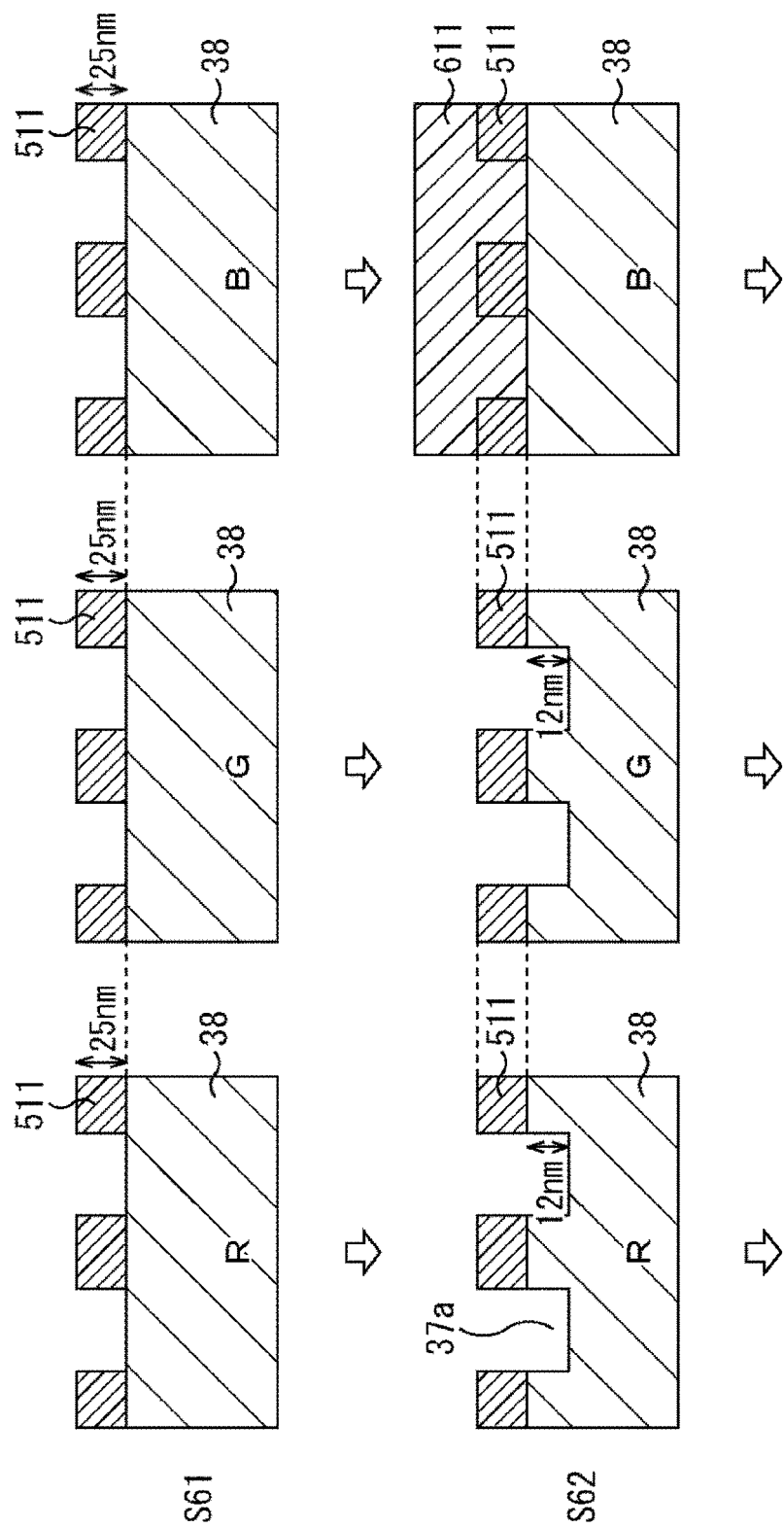
FIG. 35 is a view for illustrating a sixth manufacturing method.

Furthermore, a case where a process of first forming a cylindrical hole of 12 nm for the R pixel and G pixel, and then forming a cylindrical hole of 42 nm for the R pixel, G pixel, and B pixel as described with reference to FIGS. 35 and 36 is executed is herein described as an example.

That is, the etching by 12 nm is performed and then the etching of 42 nm is performed on the R pixel and the G pixel, so that the etching by 54 nm is finally performed, and etching by 42 nm is performed on the B pixel, so that the etching by 42 nm is finally performed.

The order is not limited thereto, and the cylindrical hole having a desired height may be finally formed in another order.

For example, it is also possible that a process of first forming a cylindrical hole of 42 nm for the R pixel, G pixel, and B pixel, and then forming a cylindrical hole of 12 nm for the R pixel and G pixel is executed.

That is, the etching may be performed in order such that etching by 42 nm is performed and then the etching of 12 nm is performed on the R pixel and the G pixel, so that the etching by 54 nm is finally performed, and etching by 42 nm is performed on the B pixel, so that the etching by 42 nm is finally performed.

<Regarding Seventh Manufacturing Method of Solid-State Imaging Device Having Uneven Structure>

Another manufacturing method (referred to as seventh manufacturing method) of the solid-state imaging device 11 is described. In the following description of the seventh manufacturing method of the solid-state imaging device 11 also, a case of forming the pixel array unit of the Bayer array as illustrated in FIG. 22 is described as an example as in the first manufacturing method.

Figure 38:
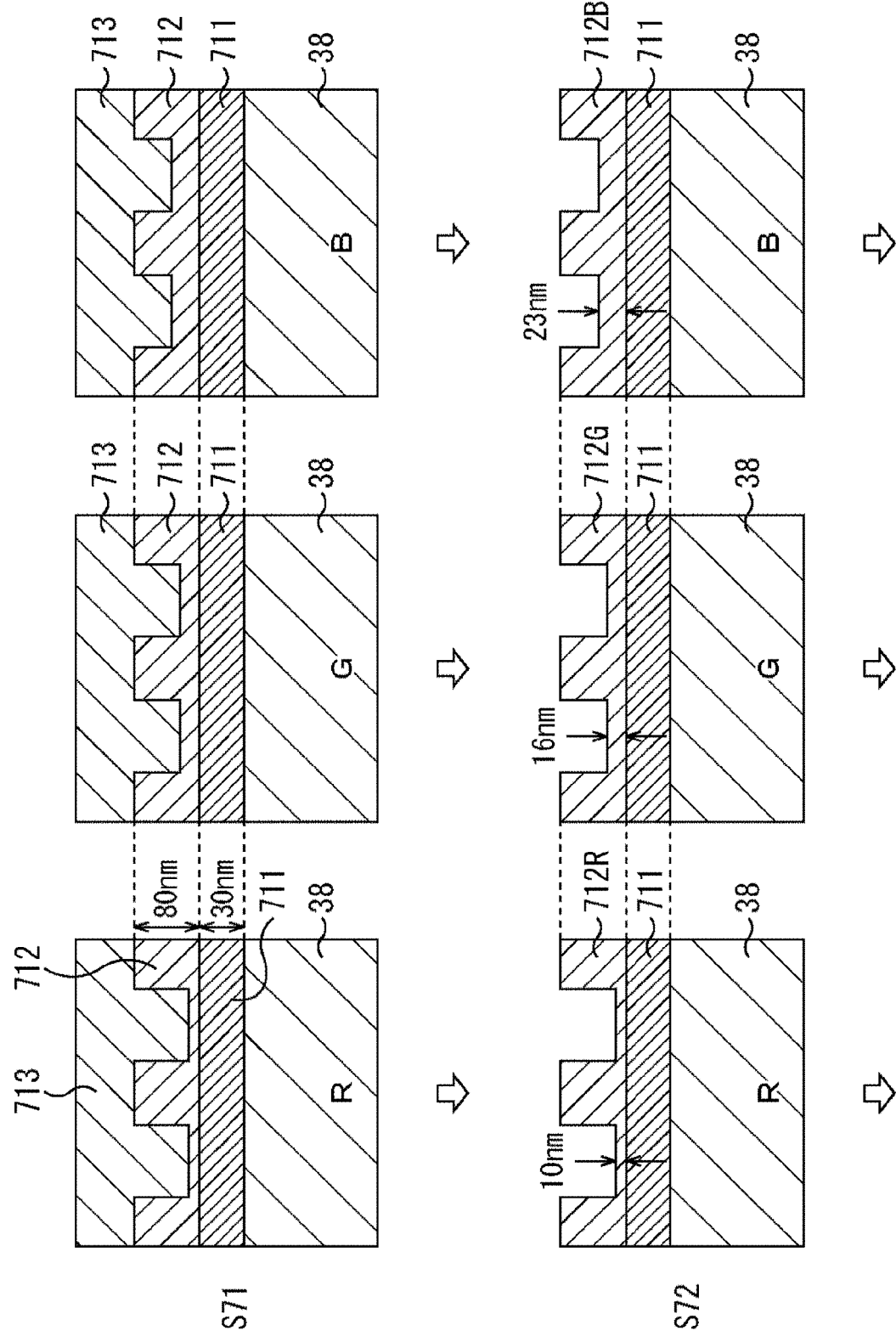
FIG. 38 is a view for illustrating a seventh manufacturing method.
Figure 39:
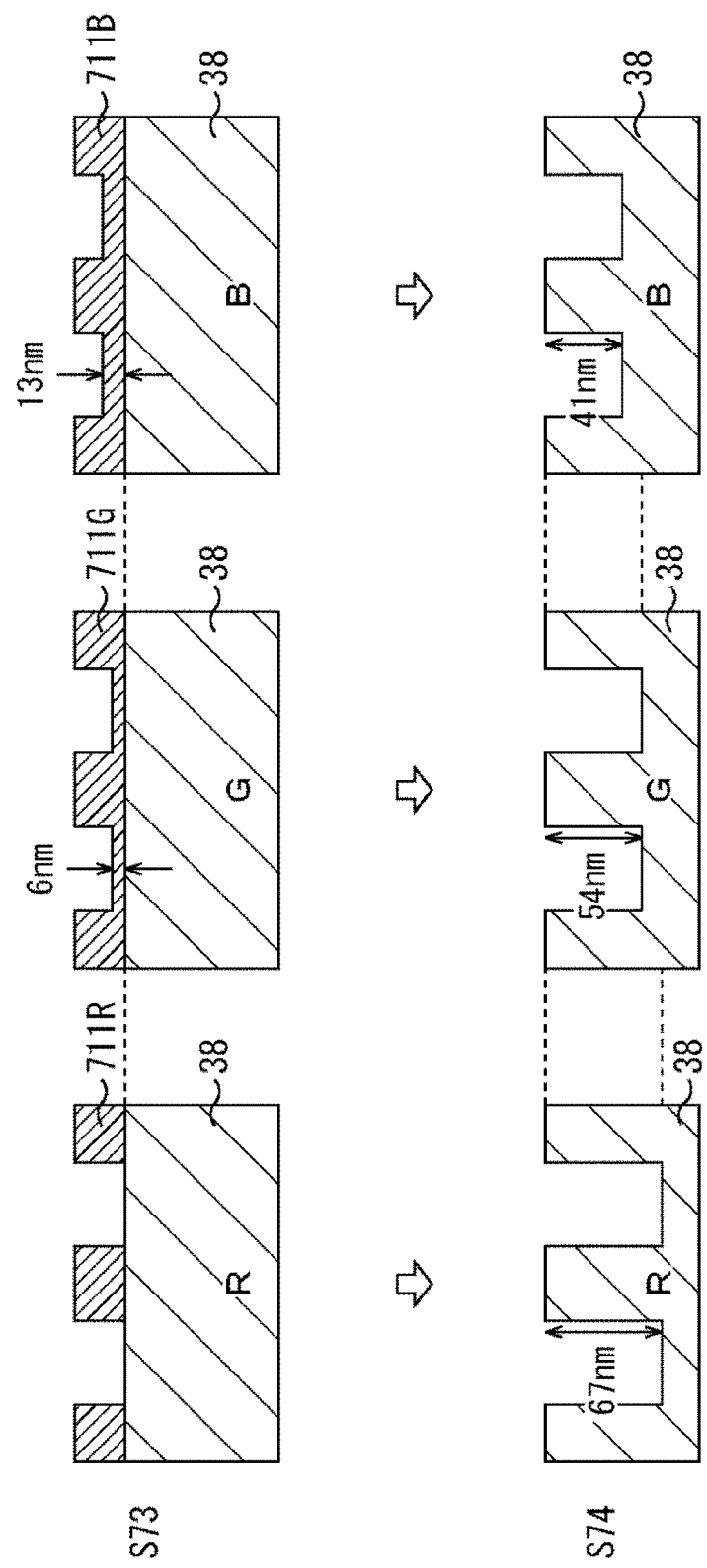
FIG. 39 is a view for illustrating the seventh manufacturing method.

With reference to FIGS. 38 to 39, the seventh manufacturing method of the solid-state imaging device having the uneven structure is described. In the drawing, a left view illustrates the R pixel, a center view illustrates the G pixel, and a right view illustrates the B pixel.

At step S71 (FIG. 38), a substrate as illustrated in FIG. 38 is prepared. The manufacture of the substrate prepared at step S51 is described.

First, when manufacturing a backside irradiation type imaging device, after a photodiode, a wiring layer and the like are formed, the substrate (Si substrate 38) reversed and joined to a support substrate. A surface of the substrate after the support substrate is joined is flat with Si. On the flat Si substrate 38, an SiO2 film 711 is deposited to a thickness of 30 nm by chemical vapor deposition (CVD) or atomic layer deposition (ALD) technology.

A photosensitive resin 712 for nano imprinting is spin-coated on the deposited SiO2 film 711. Alternatively, the photosensitive resin 712 for nano imprinting is intermittently dropped onto the deposited SiO2 film 711 by an ink jet method.

A template 713 having cylindrical projections obtained by reversing the hole array is pressed onto the deposited photosensitive resin 712 for nano imprinting. A size of the cylindrical projection of the template 713 is set as follows for each of the R pixel, the G pixel, and the B pixel. Space occupancy of the projection is also described below.

R pixel: diameter of 26.5 nm, height of 70 nm, and space occupancy of 0.394

G pixel: diameter of 26.0 nm, height of 64 nm, and space occupancy of 0.384

B pixel: diameter of 25.0 nm, height of 57 nm, and space occupancy of 0.360

The resin 712 spreads in a groove of the template 713 and between the template 713 and the SiO2 film 711 by capillary action. This situation is illustrated at step S71 in FIG. 38. In such a state, ultraviolet (UV) light is transmitted from above the template 713 and is applied to the resin 712.

By irradiation with the UV light, the resin 712 is cured. After the resin 712 is cured, the template 713 is peeled off. When the template 713 is peeled off, a shape illustrated at step S72 in FIG. 38 is formed in the resin 712.

A thickness of the resin that enters between the template 713 and the Si substrate 38 (SiO2 film 711) is referred to as a residual layer thickness (RLT). The RLT is set to following values for the R pixel, G pixel, and B pixel.

R pixel: RLT of 10 nm
G pixel: RLT of 16 nm
B pixel: RLT of 23 nm

As illustrated at step S72 in FIG. 38, the thickness (RLT) from the bottom of the cylindrical hole of the resin 712R formed in the R pixel to the SiO2 film 711 is formed to be 10 nm. Furthermore, the thickness (RLT) from the bottom of the cylindrical hole of the resin 712G formed in the G pixel to the SiO2 film 711 is formed to be 16 nm. Furthermore, the thickness (RLT) from the bottom of the cylindrical hole of the resin 712B formed in the B pixel to the SiO2 film 711 is formed to be 23 nm.

As illustrated at step S71 in FIG. 38, when the resin 712 is deposited by 80 nm and the template 713 is pressed against the resin 712 at a height of the projection of 70 nm, the RLT of 10 nm is finally formed. The RLT of 10 nm is the RLT in the R pixel as described above.

Similarly, as for the RLT of the G pixel, when the resin 712 is deposited by 80 nm and the template 713 is pressed against the resin 712 at a height of the projection of 64 nm, the RLT of 16 nm is finally formed. Moreover, similarly, when the resin 712 is deposited by 80 nm and the template 713 is pressed against the resin 712 at a height of the projection of 57 nm, the RLT of 23 nm is finally formed.

A process of etching the resin 712 and the SiO2 film 711 by a dry etching technology is performed on the substrate in a state in which such RLT is formed. By etching, the resin 712 is removed, and the cylindrical hole is formed in the SiO2 film 711.

After the etching process, the bottom portion of the cylindrical hole formed in a SiO2 film 711R of the R pixel has a thickness of 0 nm. Furthermore, the bottom portion of the cylindrical hole formed in a SiO2 film 711G of the G pixel has a thickness of 6 nm. Furthermore, the bottom portion of the cylindrical hole formed in a SiO2 film 711B of the B pixel has a thickness of 13 nm. The substrate on which the cylindrical hole is formed with such a thickness is illustrated at step S73 in FIG. 39.

A process of etching the SiO2 film 711 and the Si substrate 38 is applied to the substrate in such a state. After the etching, the SiO2 film 711 remaining on the Si substrate 38 is removed. A cross section at that time is illustrated at step S74 in FIG. 39.

As illustrated at step S74 in FIG. 39, the etching condition is adjusted such that the height (depth) of the cylindrical hole is finally 67 nm for the R pixel, 54 nm for the G pixel, and 41 nm for the B pixel and the etching is performed.

The height H of the hole is a value set as described above. For example, this is the value set under any one of the conditions C-1 to C-3.

In this manner, the process condition is herein adjusted so that the height H of the R pixel is 67 nm, the height H of the G pixel is 54 nm, and the height H of the B pixel is 41 nm. At such step, the height of the hole of each pixel may be changed, and the condition at each step described above, for example, the etching strength, time and the like are adjusted such that the desired hole height is realized.

In a case where the cylindrical hole (uneven structure) is formed in the Si substrate 38 in this manner, as illustrated at step S74 in FIG. 39, the upper surface of the Si substrate 38 of the R pixel, the upper surface of the Si substrate 38 of the G pixel, and the upper surface of the Si substrate 38 of the B pixel are at the same height and there is no step between the pixels.

Unlike the solid-state imaging device 11 manufactured by the first manufacturing method, since there is no step at the boundary between the pixels, it is possible to suppress the generation of the stray light which might be generated due to the step.

In this manner, the process on the Si substrate 38 in which the cylindrical hole is formed may be performed as that in the fourth manufacturing method, in other words, as in the case described with reference to FIG. 32, so that the description thereof is herein omitted.

Note that, as illustrated in FIG. 1, in a case of manufacturing the solid-state imaging device 11 including the light-shielding film 34, after the light-shielding film 34 is formed on the intermediate second layer 36, the planarizing film 33 is formed so as to planarize, and thereafter the color filter 32 is formed.

In this manner, by manufacturing the solid-state imaging device 11 so that the height H of the hole of each of the R pixel, G pixel, and B pixel becomes the optimized height H, the manufactured solid-state imaging device 11 may be, for example, the solid-state imaging device 11 having the characteristic as illustrated in FIG. 20.

According to the seventh manufacturing method, since the space occupancy may be adjusted by adjusting the projecting portion of the template 713, the uneven structure may be formed with the space occupancy optimized for each pixel of the manufactured solid-state imaging device 11. Therefore, it is possible to obtain the solid-state imaging device 11 having the characteristic (characteristic in a case where the space occupancy and the height are optimized) as illustrated in FIG. 20.

In other words, this may be made the solid-state imaging device 11 capable of significantly reducing the reflection light from the Si substrate 38 in all of the R pixel, the G pixel, and the B pixel. According to such solid-state imaging device 11, it is possible to prevent the stray light (ghost flare) from being reflected in the image taken by the solid-state imaging device 11 and to make the solid-state imaging device 11 capable of improving the image quality.

<Regarding Eighth Manufacturing Method of Solid-State Imaging Device Having Uneven Structure>

Another manufacturing method (referred to as eighth manufacturing method) of the solid-state imaging device 11 is described. In the above-described manufacturing methods of the solid-state imaging device 11 (first to seventh manufacturing methods), a case of manufacturing such that the height of the cylindrical hole of each of the R pixel, the G pixel, and the B pixel (the height H of the projection 37b) is the optimal height is described as an example.

Moreover, the height may be adjusted according to the position of the pixel in the solid-state imaging device 11 (imaging device chip), for example, such that the height of the pixel located at the center of the pixel array unit and that of the pixel located in the periphery thereof are different.

There is a case where the light is obliquely incident on the photodiode in the pixels around the chip of the imaging device. Assuming that the incident angle is an angle i1, the height H is determined by converting the vacuum wavelength λ0 as in following equation (24) and substituting a value into following equation (25).

[Equation 24]

$$\lambda_0 \rightarrow \lambda_0 \cos i_1 \qquad (24)$$

[Equation 25]

$$H = \frac{\lambda \cos i_1}{4n_{\text{eff}}} \qquad (25)$$

Setting the height H in this manner makes it possible to further increase the antireflective effect over the entire imaging device, thereby realizing the solid-state imaging device 11 capable of preventing the stray light (ghost flare) from reflecting in the image taken by the solid-state imaging device 11 and improving the image quality.

<Regarding Ninth Manufacturing Method of Solid-State Imaging Device Having Uneven Structure>

Another manufacturing method (referred to as ninth manufacturing method) of the solid-state imaging device 11 is described. In the above-described manufacturing methods of the solid-state imaging device 11 (first to eighth manufacturing methods), the example in which the pitch P of the uneven structure is made small such that refraction of the light transmitted through the photo diode does not occur is described.

Although there is a possibility of diffraction on the transmission side (Si substrate 38 side), the pitch P of the uneven structure may be increased until diffraction does not occur on the reflection side (intermediate second layer 36 side). A condition that the pitch P should satisfy when manufacturing the solid-state imaging device 11 as described above is expressed by following equation (26).

[Equation 26]

$$P < \frac{\lambda_0}{n_1(1 + \sin i_1)} \qquad (26)$$

If the pitch P satisfies equation (26), it is possible to manufacture the solid-state imaging device 11 in which diffraction does not occur on the reflection side.

Note that, although the diffraction does not occur on the reflection side in the solid-state imaging device 11, there is a possibility that the diffraction occurs on the transmission side, so that, as illustrated in FIG. 29, for example, the light-shielding wall 321 may be formed between the pixels to configure such that an effect of the diffraction does not reach the adjacent pixel even if the diffraction occurs on the transmission side.

By forming the embedded light-shielding wall 321 between the pixels, it becomes possible to prevent the diffraction light from mixing into the photodiodes of the adjacent pixels by the light-shielding wall 321 even if the diffraction light is generated.

According to the ninth manufacturing method also, it is possible to prevent the stray light (ghost flare) from being reflected in the image taken by the solid-state imaging device 11 and to manufacture the solid-state imaging device 11 capable of improving the image quality.

<Regarding Another Structure of Solid-State Imaging Device Having Uneven Structure>

Figure 40:
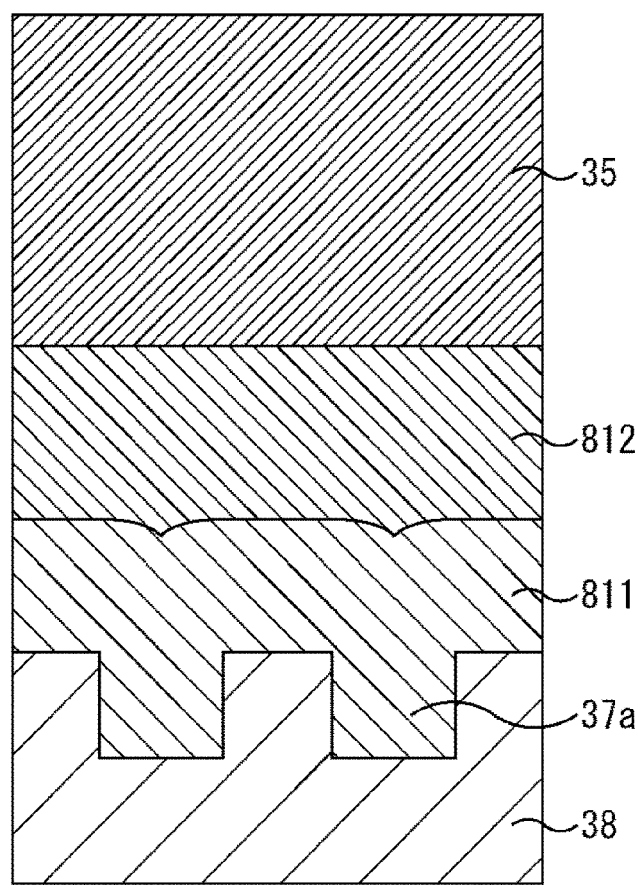
FIG. 40 is a view for illustrating another structure of the solid-state imaging device.
Figure 41:
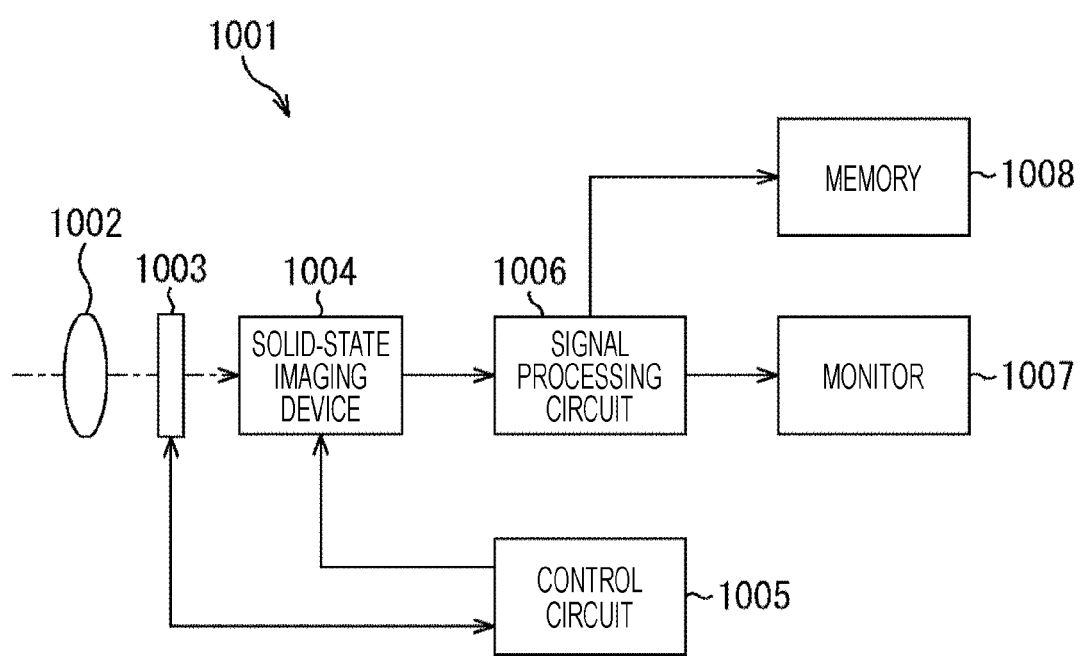
FIG. 41 is a view illustrating an application example of an electronic device to which the solid-state imaging device according to the present technology is applied.

Another structure of the solid-state imaging device 11 is described. FIG. 40 is a view illustrating another structure of the solid-state imaging device 11. In the solid-state imaging device 11 illustrated in FIG. 40, the material embedded in the uneven structure portion is SiN or HfO2.

SiN or HfO2 is a transparent material for a wavelength of 400 to 700 nm, and has a refractive index or higher, which is higher than that of Al2O3. It is also possible to use such a material as a material embedded in the uneven structure portion. Here, it is continuously described on the assumption that. HfO2 is used.

The recess portion 37a of the Si substrate 38 of the solid-state imaging device 11 illustrated in FIG. 40 is filled with HfO2, and a HfO2 film 811 is formed on the Si substrate 38. Moreover, an Al2O3 film 812 is stacked on the HfO2 film 811. Then, on the Al2O3 film 812, the oxide film 35 of SiO2 is deposited.

In this manner, a plurality of layers may be formed between the Si substrate 38 and the oxide film 35. According to the solid-state imaging device 11 illustrated in FIG. 40, a structure is such that layers of SiO2, Al2O3, HfO2, and Si are stacked in this order from the top (order in which light is incident), the structure in which the refractive index more gradually changes from SiO2 to Si. Therefore, the antireflective effect is increased over the wavelength of 400 to 700 nm.

The height H (depth) of the projected portion 37b in the uneven structure of the Si substrate 38 and the HfO2 film 811, the thickness of the HfO2 film 811 (the thickness of the SiN film 811 in a case of using SiN as a material), the thickness of the Al2O3 film 812, and the like may be determined according to the above-mentioned method and the theory of a multilayer reflective film.

<Effect>

As described above, it is possible to reduce the effect of the reflection light or diffraction light by using the solid-state imaging device 11 having the uneven structure. Furthermore, by setting the height (depth) of the uneven structure to the optimum height for each pixel (for each color), it is possible to further reduce the effect of the reflection light or diffraction light. That is, by setting the thickness of the intermediate first layer 37 to the optimum thickness for each pixel (for each color), it is possible to further reduce the effect of the reflection light or diffraction light.

In other words, by applying the present technology, it is possible to reduce the reflection on the upper surface of the photodiode even for a pixel having a different wavelength region to be sensed, and to prevent the reflection light from being reflected in another pixel as the stray light (ghost flare).

Furthermore, even in the pixels having the different wavelength regions to be sensed, it is possible to increase the sensitivity of the solid-state imaging device by increasing the ratio of light passing through the photodiode.

Furthermore, according to the present technology, it is possible to manufacture the solid-state imaging device capable of obtaining such an effect by the manufacturing method that may be realized at a lower cost than using the optical lithography technology used in the fine pattern formation.

Note that, in the above-described embodiment, the R pixel receiving red light, the G pixel receiving green light, and the B pixel receiving blue light are described as examples, but the present technology may also be applied to a pixel that receives light of another color. For example, the present technology is also applicable to a pixel that receives visible light (pixel so-called white pixel, clear pixel and the like), a pixel that receives light other than the visible light such as infrared light and the like.

<Application Example to Electronic Device>

The above-described solid-state imaging device may be applied to various electronic devices such as an imaging apparatus such as a digital still camera and a digital video camera, a mobile phone having an imaging function, or another device having the imaging function, for example.

FIG. 40 is a block diagram illustrating a configuration example of the imaging apparatus as the electronic device to which the present technology is applied.

An imaging apparatus 1001 illustrated in FIG. 40 provided with an optical system 1002, a shutter device 1003, a solid-state imaging device 1004, a driving circuit 1005, a signal processing circuit 1006, a monitor 1007, and a memory 1008 may image a still image and a moving image.

The optical system 1002 including one or a plurality of lenses guides light from a subject (incident light) to the solid-state imaging device 1004 to form an image on a light-receiving surface of the solid-state imaging device 1004.

The shutter device 1003 arranged between the optical system 1002 and the solid-state imaging device 1004 controls a light emission period to the solid-state imaging device 1004 and a light-shielding period according to control of the driving circuit 1005.

The solid-state imaging device 1004 includes a package including the above-described solid-state imaging device. The solid-state imaging device 1004 stores a signal charge for a certain period according to the light the image of which is formed on the light-receiving surface through the optical system 1002 and the shutter device 1003. The signal charge stored in the solid-state imaging device 1004 is transferred according to a driving signal (timing signal) supplied from the driving circuit 1005.

The driving circuit 1005 outputs the driving signal to control transfer operation of the solid-state imaging device 1004 and shutter operation of the shutter device 1003 to drive the solid-state imaging device 1004 and the shutter device 1003.

The signal processing circuit 1006 performs various types of signal processing on the signal charge output from the solid-state imaging device 1004. The image (image data) obtained by the signal processing applied by the signal processing circuit 1006 is supplied to the monitor 1007 to be displayed or supplied to the memory 1008 to be stored recorded).

Also in the imaging apparatus 1001 configured as described above, by using the solid-state imaging device 11 in place of the above-described solid-state imaging device 1004, reflection on the Si substrate 38 may be suppressed, sensitivity may be improved, and flare and ghost may be reduced.

In this specification, the term "system" is intended to mean an entire device including a plurality of devices.

Note that, the effect described in this specification is illustrative only; the effect is not limited thereto and there may also be another effect.

Note that, the embodiments of the present technology are not limited to the above-described embodiments and various modifications may be made without departing from the scope of the present technology.

Note that, the present technology may also have following configurations.

(1)

A solid-state imaging device includes:

a substrate including a photoelectric converting unit in a pixel unit; and a reflection ratio adjusting layer provided on the substrate in an incident direction of incident light with respect to the substrate for adjusting reflection of the incident light on the substrate, in which the reflection ratio adjusting layer includes a first layer formed on the substrate and a second layer formed on the first layer, the first layer has an uneven structure provided on the substrate, and a recess portion on the uneven structure is filled with a material having a lower refractive index than a refractive index of the substrate forming the second layer, and a thickness of the first layer is made a thickness optimized for a wavelength of light to be received.

(2)

The solid-state imaging device according to (1) described above, in which space occupancy of the first layer is space occupancy optimized for the wavelength of the light to be received.

(3)

The solid-state imaging device according to (1) or (2) described above, in which the thickness of the first layer is set for each pixel and is made a thickness satisfying

[Equation 27]

$$H = \frac{\lambda_0}{4n_{eff}}$$

when the thickness is H, a refractive index of the first layer is neff, and the wavelength of the light to be received is λ.

(4)

The solid-state imaging device according to (3) described above, in which an effective refractive index neff of the first layer satisfies $$n_{eff} = \sqrt{n_1 n_2}$$ [Equation 28]

when a refractive index of the second layer is n1 and a refractive index of the substrate is n2.

(5)

The solid-state imaging device according to (1) or (2) described above, in which the thickness of the first layer is set for each pixel and is made a thickness satisfying

[Equation 29]

$$h = \frac{\int_{\lambda_{min}}^{\lambda_{max}} \frac{w(\lambda)\lambda}{n_{eff}(\lambda)} d\lambda}{4 \int_{\lambda_{min}}^{\lambda_{max}} w(\lambda) d\lambda}$$

when the thickness is H, the wavelength of the light to be received is λ, a refractive index of the first layer is neff(λ), spectral sensitivity is w(λ), a maximum value of the wavelength of the light to be received is λmax, and a minimum value of the wavelength of the light to be received is λmin.

(6)

The solid-state imaging device according to (1) or (2) described above, in which the thickness of the first layer is set for each pixel and is made a thickness satisfying

[Equation 30]

$$H = \frac{\lambda_p}{4n_{eff}(\lambda_p)}$$

when the thickness is H, a peak value of spectral sensitivity of the wavelength of the light to be received is λp, and the refractive index of the first layer is neff(λ).

(7)

The solid-state imaging device according to (1) or (2) described above, in which the thickness of the first layer is set for each pixel and is made a thickness in a range satisfying $$\frac{\lambda_L}{4n_{eff}(\lambda_L)} \leq H \leq \frac{\lambda_U}{4n_{eff}(\lambda_U)}$$ [Equation 31]

when the thickness is H, and thresholds of spectral sensitivity of the wavelength of the light to be received are λL and λU.

(8)

The solid-state imaging device according to any one of (1) to (7), in which space occupancy of the first layer satisfies $$f = \frac{\int_{\lambda_{min}}^{\lambda_{max}} F(\lambda) d\lambda}{\lambda_{max} - \lambda_{min}}$$ [Equation 32]

when the space occupancy is f, the wavelength of the light to be received is λ, a maximum value of the wavelength of the light to be received is λmax, a minimum value of the wavelength of the light to be received is λmin, and space occupancy at a predetermined wavelength is F(λ).

(9)

The solid-state imaging device according to any one of (1) to (7), in which space occupancy of the first layer satisfies $$f = \frac{\int_{\lambda_{min}}^{\lambda_{max}} w(\lambda) F(\lambda) d\lambda}{\int_{\lambda_{min}}^{\lambda_{max}} w(\lambda) d\lambda}$$ [Equation 33]

when the space occupancy is f, the wavelength of the light to be received is λ, spectral sensitivity is w(λ), a maximum value of the wavelength of the light to be received is λmax, a minimum value of the wavelength of the light to be received is λmin, and space occupancy at a predetermined wavelength is F(λ).

(10)

The solid-state imaging device according to any one of (1) to (7) described above, in which space occupancy of the first layer satisfies $$f = F(\lambda c)$$ [Equation 34]

when the space occupancy is f, the wavelength of the light to be received is λ, a critical wavelength in image quality is λc, and space occupancy at a predetermined wavelength is F(λ).

(11)
The solid-state imaging device according to any one of (1) to (7) described above,
in which space occupancy of the first layer satisfies $$\text{Min}[F(\lambda)] \le f \le \text{Max}[F(\lambda)] \quad \text{[Equation 35]}$$

where
λmin≤λ≤λmax
when the space occupancy is f, the wavelength of the light to be received is λ, a maximum value of the wavelength of the light to be received is λmax, a minimum value of the wavelength of the light to be received is λmin, and space occupancy at a predetermined wavelength is F(λ).

(12)
The solid-state imaging device according to any one of (1) to (7) described above,
in which space occupancy of the first layer satisfies $$f = \frac{\int_{\lambda_{min}}^{\lambda_{max}} w(\lambda) F(\lambda) d\lambda}{\int_{\lambda_{min}}^{\lambda_{max}} w(\lambda) d\lambda} \quad \text{[Equation 36]}$$

when the space occupancy is f, the wavelength of the light to be received is λ, spectral sensitivity is w(λ), a maximum value of the wavelength of the light to be received is λmax, a minimum value of the wavelength of the light to be received is λmin, and space occupancy at predetermined wavelength is F(λ) for each pixel.

(13)
The solid-state imaging device according to any one of (1) to (7) described above,
in which space occupancy of the first layer satisfies $$f = F(\lambda p) \quad \text{[Equation 37]}$$

when the space occupancy is f, the wavelength of the light to be received is λ, a peak value of spectral sensitivity of the wavelength of the light to be received is λp, and space occupancy at a predetermined wavelength is F(λ).

(14)
The solid-state imaging device according to any one of (1) to (7) described above,
in which space occupancy of the first layer satisfies $$F(\lambda L) \le f \le F(\lambda U) \quad \text{[Equation 38]}$$

when the space occupancy is f, the wavelength of the light to be received is λ, thresholds of spectral sensitivity of the wavelength of the light to be received are λL and λU, and space occupancy at a predetermined wavelength is F(λ).

(15)
The solid-state imaging device according to (1) described above,
in which an interval between projected portions of the first layer is made an interval satisfying $$P < \frac{\lambda_0}{n_1(1 + \sin i_1)} \le \frac{\lambda_0}{2n_1} \quad \text{[Equation 39]}$$

when the interval is P, the wavelength of the light to be received is λ0, an incident angle is i1, and a refractive index of the second layer is n1.

(16)
The solid-state imaging device according to any one of (1) to (15),
in which an interval between projected portions of the first layer is made an interval satisfying $$P < \frac{\lambda_0}{n_2 + n_1 \sin i_1} \le \frac{\lambda_0}{n_1 + n_2} \quad \text{[Equation 40]}$$

when the interval is P, the wavelength of the light to be received is λ0, an incident angle is i1, a refractive index of the second layer is n1, and a refractive index of the substrate is n2.

(17)
The solid-state imaging device according to (1) described above,
in which an uneven structure provided on the substrate is formed by etching using a self assembly.

(18)
A manufacturing method of manufacturing a solid-state imaging device provided with
a substrate including a photoelectric converting unit in a pixel unit, and
a reflection ratio adjusting layer provided on the substrate in an incident direction of incident light with respect to the substrate for adjusting reflection of the incident light on the substrate, the method including:
forming the reflection ratio adjusting layer including
a first layer formed on the substrate and a second layer formed on the first layer;
filling a recess portion on an uneven structure provided on the substrate included in the first layer with a material having a lower refractive index than a refractive index of the substrate forming the second layer; and
making a thickness of the first layer a thickness optimized for a wavelength of light to be received.

(19)
The manufacturing method according to (18) described above,
in which the uneven structure provided on the substrate is formed by etching using a self assembly.

(20)
The manufacturing method according to (18) or (19) described above,
in which the uneven structure is formed by etching using a gray tone mask having an aperture ratio capable of processing to the thickness optimized for the wavelength of the light to be received.

REFERENCE SIGNS LIST

11 Solid-state imaging device
31 Lens
32 Color filter
33 Planarizing film
34 Light-shielding film
35 Oxide film
36 Intermediate second layer
37 Intermediate first layer
38 Si substrate

What is claimed is:
1. A solid-state imaging device, comprising:
a substrate including a photoelectric converting unit in a pixel unit; and a reflection ratio adjusting layer provided on the substrate in an incident direction of incident light with respect to the substrate for adjusting reflection of the incident light on the substrate, wherein the reflection ratio adjusting layer includes:
  a first layer formed on the substrate and a second layer formed on the first layer,
  the first layer has an uneven structure including projected portions and recess portions provided on the substrate, and the recess portions of the uneven structure are filled with a material having a lower refractive index than a refractive index of the second layer, and
  a thickness of the first layer is made to a thickness optimized for a wavelength of light to be received,
  wherein the projected portions and the substrate including the photoelectric converting unit are made of a same material,
  wherein the recess portions and the projected portions have a rectangular shape, and
  wherein a width of the rectangular shaped recess portions is greater than a width of the rectangular shaped projected portions in a cross-sectional view.

2. The solid-state imaging device according to claim 1,
wherein a space occupancy of the first layer is a space occupancy optimized for the wavelength of the light to be received.

3. The solid-state imaging device according to claim 1,
wherein the thickness of the first layer is set for each pixel and is made a thickness satisfying the equation:

$$H = \frac{\lambda_0}{4n_{eff}}$$

when the thickness of the first layer is H, a refractive index of the first layer is neff, and the wavelength of the light to be received is $\lambda$.

4. The solid-state imaging device according to claim 3,
wherein an effective refractive index neff of the first layer satisfies the equation:

$$n_{eff} = \sqrt{n_1 n_2}$$

when a refractive index of the second layer is n1 and a refractive index of the substrate is n2.

5. The solid-state imaging device according to claim 1,
wherein the thickness of the first layer is set for each pixel and is a thickness satisfying the equation:

$$H = \frac{\int_{\lambda_{min}}^{\lambda_{max}} \frac{w(\lambda)\lambda}{n_{eff}(\lambda)} d\lambda}{4\int_{\lambda_{min}}^{\lambda_{max}} w(\lambda) d\lambda}$$

when the thickness of the first layer is H, the wavelength of the light to be received is $\lambda$, a refractive index of the first layer is neff($\lambda$), a spectral sensitivity is w($\lambda$), a maximum value of the wavelength of the light to be received is $\lambda$max, and a minimum value of the wavelength of the light to be received is $\lambda$min.

6. The solid-state imaging device according to claim 1,
wherein the thickness of the first layer is set for each pixel and is a thickness satisfying the equation:

$$H = \frac{\lambda_p}{4n_{eff}(\lambda_p)}$$

when the thickness of the first layer is H, a peak value of a spectral sensitivity of the wavelength of the light to be received is $\lambda$p, and the refractive index of the first layer is neff($\lambda$).

7. The solid-state imaging device according to claim 1,
wherein the thickness of the first layer is set for each pixel and is a thickness in a range satisfying the equation:

$$\frac{\lambda_L}{4n_{eff}(\lambda_L)} \leq H \leq \frac{\lambda_U}{4n_{eff}(\lambda_U)}$$

when the thickness of the first layer is H, and thresholds of spectral sensitivities of the wavelength of the light to be received are $\lambda$L and $\lambda$U.

8. The solid-state imaging device according to claim 1,
wherein a space occupancy of the first layer satisfies the equation:

$$f = \frac{\int_{\lambda_{min}}^{\lambda_{max}} F(\lambda) d\lambda}{\lambda_{max} - \lambda_{min}}$$

when the space occupancy of the first layer is f, the wavelength of the light to be received is $\lambda$, a maximum value of the wavelength of the light to be received is $\lambda$max, a minimum value of the wavelength of the light to be received is $\lambda$min, and the space occupancy at a predetermined wavelength is F($\lambda$).

9. The solid-state imaging device according to claim 1,
wherein a space occupancy of the first layer satisfies the equation:

$$f = \frac{\int_{\lambda_{min}}^{\lambda_{max}} w(\lambda) F(\lambda) d\lambda}{\int_{\lambda_{min}}^{\lambda_{max}} w(\lambda) d\lambda}$$

when the space occupancy of the first layer is f, the wavelength of the light to be received is $\lambda$, a spectral sensitivity is w($\lambda$), a maximum value of the wavelength of the light to be received is $\lambda$max, a minimum value of the wavelength of the light to be received is $\lambda$min, and the space occupancy at a predetermined wavelength is F($\lambda$).

10. The solid-state imaging device according to claim 1,
wherein a space occupancy of the first layer satisfies the equation:

$$f = F(\lambda_c)$$

when the space occupancy of the first layer is f, the wavelength of the light to be received is $\lambda$, a critical wavelength in image quality is $\lambda$c, and the space occupancy at a predetermined wavelength is F($\lambda$).

11. The solid-state imaging device according to claim 1, wherein a space occupancy of the first layer satisfies the equation:

Min[F(λ)]≤f≤Max[F(λ)]

where

λmin≤λ≤λmax when the space occupancy of the first layer is f, the wavelength of the light to be received is λ, a maximum value of the wavelength of the light to be received is λmax, a minimum value of the wavelength of the light to be received is λmin, and the space occupancy at a predetermined wavelength is F(λ).

12. The solid-state imaging device according to claim 1, wherein a space occupancy of the first layer satisfies the equation:

$$f = \frac{\int_{\lambda_{min}}^{\lambda_{max}} w(\lambda) F(\lambda) d\lambda}{\int_{\lambda_{min}}^{\lambda_{max}} w(\lambda) d\lambda}$$

when the space occupancy of the first layer is f, the wavelength of the light to be received is λ, a spectral sensitivity is w(λ), a maximum value of the wavelength of the light to be received is λmax, a minimum value of the wavelength of the light to be received is λmin, and the space occupancy at a predetermined wavelength is F(λ) for each pixel.

13. The solid-state imaging device according to claim 1, wherein a space occupancy of the first layer satisfies the equation:

f=F(λ$_p$)

when the space occupancy of the first layer is f, the wavelength of the light to be received is λ, a peak value of spectral sensitivity of the wavelength of the light to be received is λp, and the space occupancy at a predetermined wavelength is F(λ).

14. The solid-state imaging device according to claim 1, wherein a space occupancy of the first layer satisfies the equation:

F(λ$_L$)≤f≤F(λ$_u$)

when the space occupancy is f, the wavelength of the light to be received is λ, thresholds of spectral sensitivities of the wavelength of the light to be received are λL and λU, and the space occupancy at a predetermined wavelength is F(λ).

15. The solid-state imaging device according to claim 1, wherein an interval between projected portions of the first layer is an interval satisfying the equation:

$$P < \frac{\lambda_0}{n_1(1 + \sin i_1)} \le \frac{\lambda_0}{2n_1}$$

when the interval between projected portions of the first layer is P, the wavelength of the light to be received is λ0, an incident angle is i1, and a refractive index of the second layer is n1.

16. The solid-state imaging device according to claim 1, wherein an interval between projected portions of the first layer is an interval satisfying the equation:

$$P < \frac{\lambda_0}{n_2 + n_1 \sin i_1} \le \frac{\lambda_0}{n_1 + n_2}$$

when the interval between projected portions of the first layer is P, the wavelength of the light to be received is λ0, an incident angle is i1, a refractive index of the second layer is n1, and a refractive index of the substrate is n2.

17. The solid-state imaging device according to claim 1, wherein the uneven structure provided on the substrate is formed by etching using a self assembly.

18. A manufacturing method of manufacturing a solid-state imaging device provided with a substrate including a photoelectric converting unit in a pixel unit, and a reflection ratio adjusting layer provided on the substrate in an incident direction of incident light with respect to the substrate for adjusting reflection of the incident light on the substrate, the method comprising:

forming the reflection ratio adjusting layer including a first layer having an uneven structure including projected portions and recess portions formed on the substrate and a second layer formed on the first layer;

filling the recess portions on the uneven structure provided on the substrate included in the first layer with a material having a lower refractive index than a refractive index of the second layer; and making a thickness of the first layer to a thickness optimized for a wavelength of light to be received wherein the projected portions and the substrate including the photoelectric converting unit are made of a same material, wherein the recess portions and the projected portions have a rectangular shape, and wherein a width of the rectangular shaped recess portions is greater than a width of the rectangular shaped projected portions in a cross-sectional view.

19. The manufacturing method according to claim 18, wherein an uneven structure provided on the substrate is formed by etching using a self assembly.

20. The manufacturing method according to claim 18, wherein the uneven structure is formed by etching using a gray tone mask having an aperture ratio capable of processing to the thickness optimized for the wavelength of the light to be received.

* * * * *